United States Patent
Hart et al.

(10) Patent No.: US 11,156,674 B2
(45) Date of Patent: Oct. 26, 2021

(54) CONTROL AND CANCELLATION OF SPIN BATH INDUCED DEPHASING IN SOLID-STATE ENSEMBLES

(71) Applicant: President and Fellows of Harvard College, Cambridge, MA (US)

(72) Inventors: Connor A. Hart, Cambridge, MA (US); Erik Bauch, Cambridge, MA (US); Ronald L. Walsworth, Newton, MA (US); Matthew James Turner, Somerville, MA (US); Jennifer May Schloss, Cambridge, MA (US); John Francis Barry, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 88 days.

(21) Appl. No.: 16/620,391

(22) PCT Filed: Jun. 6, 2018

(86) PCT No.: PCT/US2018/036197
§ 371 (c)(1),
(2) Date: Dec. 6, 2019

(87) PCT Pub. No.: WO2018/226784
PCT Pub. Date: Dec. 13, 2018

(65) Prior Publication Data
US 2021/0080517 A1    Mar. 18, 2021

Related U.S. Application Data

(60) Provisional application No. 62/515,602, filed on Jun. 6, 2017.

(51) Int. Cl.
*G01R 33/032* (2006.01)
*B82Y 20/00* (2011.01)
*G01R 33/26* (2006.01)

(52) U.S. Cl.
CPC ............ *G01R 33/032* (2013.01); *B82Y 20/00* (2013.01); *G01R 33/26* (2013.01)

(58) Field of Classification Search
CPC ....... B82Y 20/00; G01R 33/032; G01R 33/26
See application file for complete search history.

(56) References Cited

U.S. PATENT DOCUMENTS 7,466,127 B2   12/2008   Chandrakumar et al.
8,547,090 B2   10/2013   Lukin et al.
(Continued)

OTHER PUBLICATIONS

"Code-division multiple access," definition; Wikipedia; reviewed on Apr. 29, 2016, 10 pages. (https://en.wikipedia.org/wiki/Code-division_multiple_access).

(Continued)

*Primary Examiner* — Jay Patidar
(74) *Attorney, Agent, or Firm* — Wilmer Cutler Pickering Hale and Dorr LLP

(57) ABSTRACT

A method and system of measuring a direct current magnetic field using a plurality of spin centers are disclosed. A spin bath associated with the spin centers may be driven with a first source of electromagnetic radiation to reduce dephasing of the spin centers. The spin centers may be measured using double quantum (DQ) magnetometry in order to reduce the effects of crystal strain on spin dephasing times. An electromagnetic response of at least one of the plurality of spin centers may be observed using an electromagnetic radiation collection device. Accordingly, up to an eight times improvement in DC field sensitivity may be accomplished for a spin center ensemble.

20 Claims, 34 Drawing Sheets

(56) References Cited

U.S. PATENT DOCUMENTS

| | | | |
|---|---|---|---|
| 9,784,804 | B2 | 10/2017 | Walsworth et al. |
| 10,126,377 | B2 | 11/2018 | Hahn et al. |
| 2012/0319684 | A1 | 12/2012 | Gambetta et al. |
| 2014/0061510 | A1 | 3/2014 | Twitchen et al. |
| 2014/0072008 | A1 | 3/2014 | Faraon et al. |
| 2014/0166904 | A1 | 6/2014 | Walsworth et al. |
| 2015/0001422 | A1 | 1/2015 | Englund et al. |
| 2015/0048822 | A1 | 2/2015 | Walsworth et al. |
| 2015/0192532 | A1 | 7/2015 | Clevenson et al. |
| 2015/0253355 | A1 | 9/2015 | Grinolds et al. |
| 2015/0316598 | A1 | 11/2015 | Rogge et al. |
| 2016/0054402 | A1 | 2/2016 | Meriles |
| 2016/0061914 | A1 | 3/2016 | Jelezko et al. |
| 2016/0097832 | A1 | 4/2016 | Suzuki |
| 2016/0161583 | A1 | 6/2016 | Meriles et al. |
| 2017/0038411 | A1* | 2/2017 | Yacobi .................. G01Q 60/52 |
| 2017/0343695 | A1 | 11/2017 | Stetson et al. |
| 2018/0149717 | A1 | 5/2018 | Jelezko et al. |
| 2018/0203080 | A1 | 7/2018 | Acosta et al. |
| 2019/0049495 | A1 | 2/2019 | Ofek et al. |
| 2019/0235031 | A1 | 8/2019 | Ibrahim et al. |

OTHER PUBLICATIONS

Aasi et al., "Enhancing the sensitivity of the LIGO gravitational wave detector by using squeezed states of light." Nature Photonics, vol. 7, No. 8, Oct. 1, 2013, 10 pages.

Abanin et al. "A Theory of many-body localization in periodically driven systems." Annals of Physics, vol. 372, Aug. 11, 2015, 8 pages.

Abanin et al., "A rigorous theory of many-body prethermalization for periodically driven and closed quantum systems." Communications in Mathematical Physics, Jul. 11, 2017, vol. 354, No. 3. arXiv Jul. 9, 2017, 21 pages.

Abanin et al., "Exponentially slow heating in periodically driven many-body systems." Physical Review Letters, vol. 115, No. 25, Jul. 29, 2015, 5 pages.

Abe et al., "Electron spin coherence of phosphorus donors in silicon: Effect of environmental nuclei," Physical Review B, Sep. 2, 2010, vol. 82, 121201. pp. 1-4.

Acosta et al., "High nitrogen-vacancy density diamonds for magnetometry applications," Physical Review B—Condensed Matter and Materials Physics (2009) 80, 1. arXiv: 0903.3277, Jul. 31, 2009. 24 pages.

Acosta et al., "Temperature dependence of the nitrogen-vacancy magnetic resonance in diamond," Physical Review Letters (2010) 104, 070801. arXiv: 0911.3938, Feb. 17, 2010. 5 pages.

Allred et al., "High-sensitivity atomic magnetometer unaffected by spin-exchange relaxation." Physical Review Letters, Sep. 23, 2002, vol. 89, No. 13, 4 pages.

Augustine et al., "SQUID detected NMR and NQR," Solid State Nuclear Magnetic Resonance, Mar. 1998, vol. 11, pp. 139-156.

Badilita et al., "Microscale nuclear magnetic resonance: a tool for soft matter research," Soft Matter, Jun. 2012, vol. 8, pp. 10583-10597.

Bar-Gill et al., "Solid-state electronic spin coherence time approaching one second," Nature Communications, published Apr. 23, 2013, vol. 4, Article No. 1743, 6 pages.

Barry et al., "Optical magnetic detection of single-neuron action potentials using quantum defects in diamond." Proceedings of the National Academy of Sciences, Dec. 6, 2016, vol. 113, No. 49, pp. 14133-14138 and E6730. 7 pages.

Basko et al., "Metal-insulator transition in a weakly interacting many-electron system with localized single-particle states." Annals of Physics, Feb. 2, 2008, vol. 321, No. 5, 99 pages.

Bauch et al. "Ultralong Dephasing Times in Solid-State Spin Ensembles via Quantum Control," Physical Review X, Jul. 25, 2018, vol. 8, 031025, pp. 1-11.

Beauchamp, Applications of Walsh and Related Functions: With an Introduction to Sequency Theory, (from the series on Microelectronics and Signal Processing), Academic Press, London, Feb. 11, 1984, entire book: pp. ix-308.

Belthangady et al., "Dressed-State Resonant Coupling between Bright and Dark Spins in Diamond," Physical Review Letters, Apr. 12, 2013 vol. 110, 157601, pp. 1-5.

Betzig, "Nobel Lecture: Single molecules, cells, and super-resolution optics," Reviews of Modern Physics, Oct. 21, 2015, vol. 87, No. 4, pp. 1153-1168.

Bloom et al., "An optical lattice clock with accuracy and stability at the $10^{-18}$ level." Nature, Feb. 6, 2014, vol. 506, No. 7486, pp. 71-75 (7 total pages).

Bohnet et al., "Quantum spin dynamics and entanglement generation with hundreds of trapped ions." Science, vol. 352, No. 6291, Jan. 7, 2016, 40 pages.

Budker et al., "Proposal for a cosmic axion spin precession experiment (CASPEr)," Physical Review X, published May 19, 2014, vol. 4, No. 2, pp. 021030-1 to 021030-10.

Bugrij, "The correlation function in two dimensional Ising model on the finite size lattice. I." Theoretical and Mathematical Physics, Apr. 2001, vol. 127, No. 1, 25 pages.

Choi et al., "Depolarization Dynamics in a Strongly Interacting Solid-State Spin Ensemble," Physical Review Letters, Mar. 3, 2017, vol. 118, No. 9, 6 pages.

Choi et al., "Dynamical engineering of interactions in qudit ensembles." Physical Review Letters, Nov. 3, 2017, vol. 119, No. 18, 6 pages.

Choi et al., "Observation of discrete time-crystalline order in a disordered dipolar many-body system." Nature, vol. 543, No. 7644, author manuscript Sep. 8, 2017, pp. 221-225 (23 total pages).

Clevenson et al., "Broadband magnetometry and temperature sensing with a light-trapping diamond waveguide," Nature Physics, May 2015, vol. 11, pp. 393-397. (6 pages).

De Lange et al., "Controlling the quantum dynamics of a mesoscopic spin bath in diamond," Scientific Reports, Apr. 25, 2012, vol. 2, No. 382, pp. 1-5.

De Lange et al., "Universal dynamical decoupling of a single solid-state spin from a spin bath." Science, Oct. 1, 2010, vol. 330, No. 6000, 16 pages.

Degen et al., "Nanoscale magnetic resonance imaging," Proceedings of the National Academy of Sciences of the United States of America, Feb. 3, 2009, vol. 106(5), pp. 1313-1317.

Degen et al., "Quantum sensing," Reviews of Modern Physics, Jul. 25, 2017, vol. 89, No. 3, pp. 035002-1 to 035002-39.

Deutsch et al., "Spin self-rephasing and very long coherence times in a trapped atomic ensemble." Physical Review Letters, Jul. 9, 2010, vol. 105, No. 2, 4 pages.

DeVience et al., "Nanoscale NMR spectroscopy and imaging of multiple nuclear species," Nature Nanotechnology, Jan. 5, 2015, vol. 10, pp. 129-134 (7 total pages).

Diddams et al., "An optical clock based on a single trapped 199Hg+ ion," Science, Aug. 3, 2001, vol. 293, No. 5531, pp. 825-828.

Doherty et al., "The nitrogen-vacancy colour centre in diamond," Physics Reports, published online Mar. 4, 2013, vol. 528, pp. 1-45.

Dreau et al., "Avoiding power broadening in optically detected magnetic resonance of single NV defects for enhanced DC-magnetic field sensitivity," Physical Review B, Nov. 23, 2011, vol. 84(19), 3 pages.

Dutta et al., "Phase transitions in the quantum Ising and rotor models with a long-range interaction." Physical Review B, Oct. 18, 2001, vol. 64, No. 18, 7 pages.

Elliott et al., "The Ising model with a transverse field. I. High temperature expansion." Journal of Physics C: Solid State Physics, Oct. 1971, vol. 4, No. 15, pp. 2359-2369 (12 total pages).

Else et al., "Floquet time crystals." Physical Review Letters, Aug. 26, 2016, vol. 117, No. 9, 5 pages.

Else et al., "Prethermal phases of matter protected by time-translation symmetry." Physical Review X, Mar. 7, 2017, vol. 7, No. 1, 21 pages.

Essler et al., "Finite temperature dynamical correlations in massive integrable quantum field theories." Journal of Statistical Mechanics: Theory and Experiment, vol. 2009, No. 09, Oct. 7, 2009, 54 pages.

(56) References Cited

OTHER PUBLICATIONS

Fang et al., "High-Sensitivity Magnetometry Based on Quantum Beats in Diamond Nitrogen-Vacancy Centers," Physical Review Letters, Mar. 26, 2013, vol. 110, 130802, pp. 1-5.
Farfurnik et al., "Optimizing a Dynamical Decoupling Protocol for Solid-State Electronic Spin Ensembles in Diamond," Physical Review B, Aug. 24, 2015, vol. 92(6), 5 pages.
Fey et al., "Critical behavior of quantum magnets with long-range interactions in the thermodynamic limit." Physical Review B, vol. 94, No. 7, Sep. 5, 2016, 12 pages.
Fisher et al., "Critical exponents for long-range interactions." Physical Review Letters, Oct. 2, 1972, vol. 29, No. 14, pp. 917-920.
Fonseca et al. "Ising field theory in a magnetic field: analytic properties of the free energy." Journal of Statistical Physics, vol. 110, No. 3-6, Dec. 19, 2001, 66 pages.
Fratila et al., "Small-Volume Nuclear Magnetic Resonance Spectroscopy," Annual Review of Analytical Chemistry, Jul. 2011, vol. 4, 227-249 (25 total pages).
Frerot et al., "Quantum Critical Metrology," Physical Review Letters, received Aug. 1, 2017, published Jul. 11, 2018, vol. 121, 6 pages.
Friedman, "Ising model with a transverse field in two dimensions: Phase diagram and critical properties from a real-space renormalization group." Physical Review B, Feb. 1, 1978, vol. 17, No. 3, pp. 1429-1432.
Glenn et al., "Micrometer-scale magnetic imaging of geological samples using a quantum diamond microscope." Geochemistry, Geophysics, Geosystems, published online Aug. 22, 2017, vol. 18, No. 8, pp. 3254-3267.
Gold, "Optimal binary sequences for spread spectrum multi-plexing (Corresp.)," IEEE Transactions on Information Theory, Oct. 4, 1967, vol. 13, Issue 4, pp. 619-621.
Grezes et al. "Multi-mode storage and retrieval of microwave fields in a spin ensemble," Physical Review A (2015) 92, 020301. arXiv: 1401.7939, Jan. 30, 2014. 20 pages.
Grinolds et al., "Subnanometre resolution in three-dimensional magnetic resonance imaging of individual dark spins," Nature Nanotechnology, Apr. 2014, vol. 9, pp. 279-284.
Grisi et al., "NMR spectroscopy of single sub-nL ova with inductive ultra-compact single-chip probes," Scientific Reports, Mar. 20, 2017, vol. 7, 8 pages.
Guitard et al., "Local nuclear magnetic resonance spectroscopy with giant magnetic resistance-based sensors," Applied Physics Letters, May 26, 2016, vol. 108, 5 pages.
Hahn, "Spin echoes." Physical Review, Nov. 15, 1950, vol. 80, No. 4, 22 pages.
Hauke et al., "Measuring multipartite entanglement via dynamic susceptibilities." Nature Physics, vol. 12, No. 8, Sep. 5, 2015, 11 pages.
Herzog et al., "Boundary between the thermal and statistical polarization regimes in a nuclear spin ensemble," Applied Physics Letters, Aug. 1, 2014, vol. 105(4), 6 pages.
Ho et al., "Critical time crystals in dipolar systems." Physical Review Letters, vol. 119, No. 1, Jul. 7, 2017, 9 pages.
Hosten et al., "Measurement noise 100 times lower than the quantum-projection limit using entangled atoms." Nature, Jan. 28, 2016, vol. 529, No. 7587, pp. 505-508 (7 total pages).
International Search Report and Written Opinion dated Aug. 24, 2017, in the International Application No. PCT/US17/35194, 14 pages.
International Search Report and Written Opinion dated Aug. 27, 2018, in the International Application No. PCT/US18/36197. 11 pages.
International Search Report and Written Opinion dated Mar. 6, 2018, in the International Application No. PCT/US17/34256. 14 pages.
Ishikawa et al., "Optical and Spin Coherence Properties of Nitrogen-Vacancy Centers Placed in a 100 nm Thick Isotopically Purified Diamond Layer," Nano Letters, Mar. 9, 2012, vol. 12, No. 4, pp. 2083-2087.

Jiang et al., "Repetitive Readout of a Single Electronic Sin via Quantum Logic with Nuclear Spin Ancillae," Science, Oct. 9, 2009, vol. 326, pp. 267-272 (28 total pages).
Jiang et al., "Universal dynamical decoupling of multiqubit states from environment." Physical Review A, Dec. 28, 2011, vol. 84, No. 6, 4 pages.
Khemani et al., "Phase structure of driven quantum systems." Physical Review Letters, Jun. 24, 2016, vol. 116, No. 25, pp. 250401-1 to 250401-6.
Klimov et al., "Quantum entanglement at ambient conditions in a macroscopic solid-state spin ensemble," Science Advances, Nov. 20, 2015, vol. 1, No. 10, e1501015. pages 1-7.
Knap et al., "Probing Real-Space and Time-Resolved Correlation Functions with Many-Body Ramsey Interferometry." Physical Review Letters, Oct. 4, 2013, vol. 111, No. 14, 6 pages.
Knowles et al., "Observing bulk diamond spin coherence in high-purity nanodiamonds," Nature Materials, (2014) 13(1). arXiv: 1310.1133, Oct. 3, 2013. 16 pages.
Koehl et al., "Resonant optical spectroscopy and coherent control of Cr4+ spin ensembles in SiC and GaN," Physical Review B (2017) 95, 035207. arXiv: 1608.08255, Aug. 29, 2016 (13 total pages).
Kolkowitz et al., "Gravitational wave detection with optical lattice atomic clocks." Physical Review D, Dec. 27, 2016, vol. 94, No. 12, 15 pages.
Kong et al., "Towards Chemical Structure Resolution with Nanoscale Nuclear Magnetic Resonance Spectroscopy," Physical Review Applied, Jun. 19, 2015, vol. 4, 024004. 6 pages.
Kucsko et al., "Critical thermalization of a disordered dipolar spin system in diamond," arXiv preprint, Sep. 26, 2016, arXiv:1609.08216 v1. 41 pages.
Kucsko et al., "Critical Thermalization of a Disordered Dipolar Spin System in Diamond," Physical Review Letters, submitted Sep. 26, 2016, arXiv: 1609.08216 v2. Oct. 25, 2017, 47 pages.
Kuo et al., "Quadratic dynamical decoupling: Universality proof and error analysis." Physical Review A, vol. 84, No. 4, Jun. 10, 2011, 18 pages.
Kuwahara et al., "Floquet-Magnus theory and generic transient dynamics in periodically driven many-body quantum systems." Annals of Physics, vol. 367, Feb. 12, 2016, 19 pages.
Lacey et al., "High-Resolution NMR Spectroscopy of Sample Volumes from 1 nL to 10 µL," Chemical Reviews, Sep. 16, 1999, vol. 99, pp. 3133-3152.
Lathi, Modern Digital and Analog Communication Systems, Third Edition, Oxford University Press, USA, Apr. 10, 1998, 554 pages.
Lazarides et al., "Fate of many-body localization under periodic driving." Physical Review Letters, Jul. 27, 2015, vol. 115, No. 3, 9 pages.
Le Sage et al., "Optical magnetic imaging of living cells," Nature, Apr. 25, 2013, vol. 496, pp. 486-489 (6 total pages).
Lovchinsky et al., "Magnetic resonance spectroscopy of an atomically thin material using a single-spin qubit." Science, Jan. 19, 2017, vol. 355, No. 6324, 18 pages.
Lovchinsky et al., "Nuclear magnetic resonance detection and spectroscopy of single proteins using quantum logic," Science, Feb. 19, 2016, vol. 351, Issue 6275, pp. 836-841 (7 total pages).
Macieszczak et al., "Dynamical phase transitions as a resource for quantum enhanced metrology." Physical Review A, Feb. 3, 2016, vol. 93, No. 2, 10 pages.
Maertz et al., "Vector magnetic field microscopy using nitrogen vacancy centers in diamond,". Applied Physics Letters, published online: Mar. 1, 2010, vol. 96, pp. 092504-1 to 092504-3 (4 total pages).
Maghrebi et al., "Causality and quantum criticality in long-range lattice models." Physical Review B, Mar. 17, 2016, vol. 93, No. 12, 18 pages.
Mamin et al., "Multipulse Double-Quantum Magnetometry with Near-Surface Nitrogen-Vacancy Centers," Physical Review Letters, (2014), vol. 113, 030803. arXiv: 1404.7480, Jul. 15, 2015. 33 pages.
Mamin et al., "Nanoscale Nuclear Magnetic Resonance with a Nitrogen-Vacancy Spin Sensor," Science, Feb. 1, 2013, vol. 339, pp. 557-560.

(56) References Cited

OTHER PUBLICATIONS

Maurer et al., "Room-temperature quantum bit memory exceeding one second." Science, Jun. 8, 2012, vol. 336, No. 6086, pp. 1283-1286 (5 total pages).
Maze et al., "Nanoscale magnetic sensing with an individual electronic spin in diamond," Nature, Oct. 2, 2008, vol. 455, No. 7213, pp. 644-647 (5 total pages).
Meriles et al., "Imaging mesoscopic nuclear spin noise with a diamond magnetometer," The Journal of Chemical Physics, Sep. 27, 2010, vol. 133(12), 10 pages.
Mori et al., "Rigorous bound on energy absorption and generic relaxation in periodically driven quantum systems." Physical Review Letters, vol. 116, No. 12, Mar. 17, 2017, 11 pages.
Mousoulis et al., "Single Cell Spectroscopy: Noninvasive measures of small-scale structure and function," Methods, Dec. 2013, vol. 64(2), pp. 119-128.
Nandkishore et al., "Many-body localization and thermalization in quantum statistical mechanics." Annual Review of Condensed Matter Physics, Mar. 2015, vol. 6, No. 1, pp. 1-38.
Olson et al., "High-Resolution Microcoil 1H-NMR for Mass-Limited, Nanoliter-Volume Samples," Science, Dec. 22, 1995, vol. 270, issue 5244. 6 pages.
Pfeuty et al. "The Ising model with a transverse field. II. Ground state properties." Journal of Physics C: Solid State Physics, Oct. 1971, vol. 4, No. 15, pp. 2370-2385 (17 total pages).
Pham et al., "Magnetic field imaging with nitrogen-vacancy ensembles" New Journal of Physics, Apr. 28, 2011, vol. 13, pp. 045021:1-13 (14 total pages).
Ponte et al., "Many-body localization in periodically driven systems." Physical Review Letters, vol. 114, No. 14, Oct. 30, 2014, 7 pages.
Popa et al., "Energy levels and decoherence properties of single electron and nuclear spins in a defect center in diamond". Physical Review B, Nov. 5, 2004, vol. 70, pp. 201203:1-4.
Rondin et al., "Magnetometry with nitrogen-vacancy defects in diamond," Reports on Progress in Physics, May 6, 2014, vol. 77, 056503, 26 pages.
Rosskopf, "Advanced quantum sensing using nitrogen vacancy centers in diamond," doctoral thesis submitted ETH Zurich, published 2016, 38 pages.
Savukov et al., "NMR detection with an atomic magnetometer," Physical Review Letters, Apr. 1, 2005, vol. 94(12), 4 pages.
Schreiber et al., "Observation of many-body localization of interacting fermions in a quasi-random optical lattice," Science, Jan. 22, 2015, vol. 349, No. 6250, p. 842-845 (14 total pages).
Serber et al., "In-Cell NMR Spectroscopy," Methods in Enzymology, Feb. 2005, vol. 394, pp. 17-41.
Shields et al., "Efficient Readout of a Single Spin State in Diamond via Spin-to-Charge Conversion," Physical Review Letters, Apr. 3, 2015, vol. 114(13), 5 pages.
Skotiniotis et al., "Quantum metrology for the Ising Hamiltonian with transverse magnetic field." New Journal of Physics, Jul. 31, 2015, vol. 17, No. 7, 12 pages.
Smith et al., "Many-body localization in a quantum simulator with programmable random disorder." Nature Physics, Oct. 2016, vol. 12, No. 10, pp. 907-911.
Staudacher et al., "Nuclear Magnetic Resonance Spectroscopy on a (5-Nanometer)3 Sample Volume," Science, Feb. 1, 2013, vol. 339, Issue 6119, pp. 561-563 (4 total pages).
Staudacher et al., "Probing molecular dynamics at the nanoscale via an individual paramagnetic centre," Nature Communications, Oct. 12, 2015, vol. 6, No. 8527, 7 pages.
Steinert et al., "High sensitivity magnetic imaging using an array of spins in diamond," Review of Scientific Instruments, published online: Apr. 23, 2010, vol. 81, article 043705, 13 pages.
Strobel et al., "Fisher information and entanglement of non-Gaussian spin states." Science, Jul. 25, 2014, vol. 345, No. 6195, pp. 424-427. (arXiv version Jul. 14, 2015) (11 total pages).
Taylor et al. "High-sensitivity diamond magnetometer with nanoscale resolution," Nature Physics, published online: Sep. 14, 2008, vol. 4, pp. 810-816.
Von Keyserlingk et al. "Absolute stability and spatiotemporal long-range order in Floquet systems." Physical Review B, Aug. 8, 2016, vol. 94, No. 8, 11 pages.
Walsh, "A Closed Set of Normal Orthogonal Functions," American Journal of Mathematics, Jan. 1923, vol. 45, No. 1, pp. 5-24 (21 total pages).
Walsworth et al., "Synchronized-Readout for narrowband detection of time-varying electromagnetic fields using solid state spins," Harvard Office of Technology Development, Mar. 27, 2017. 21 pages.
Wang et al. "An optogenetics- and imaging-assisted simultaneous multiple patch-clamp recording system for decoding complex neural circuits," Nature Protocols, Feb. 5, 2015, vol. 10, pp. 397-412 (30 total pages).
Waugh et al., "Approach to high-resolution NMR in solids." Physical Review Letters, Jan. 29, 1968, vol. 20, No. 5, 4 pages.
Yao et al., "Discrete Time Crystals: Rigidity, Criticality, and Realizations," Phys. Rev. Lett., Jan. 20, 2017, vol. 118, 6 pages.
Zaiser et al., "Enhancing quantum sensing sensitivity by a quantum memory," Nature Communications, vol. 7, Article No. 12279, Aug. 10, 2016, 11 pages.
Zanardi et al., "Quantum criticality as a resource for quantum estimation." Physical Review A, Oct. 9, 2008, vol. 78, No. 4, 7 pages.
Zhang et al., "Observation of a discrete time crystal." Nature, Mar. 9, 2017, vol. 543, No. 7644, pp. 217-220 (12 total pages).
Zurek et al., "Dynamics of a quantum phase transition." Physical Review Letters (2005) vol. 95, No. 10. arXiv Feb. 14, 2006, 4 pages.

\* cited by examiner

| Sample | [N] (ppm) | $^{13}C$ (%) | [NV] (cm$^{-3}$) | $T_2^{meas}$ (µs) | $T_{2,SQ}^{*,meas}$ (µs) | $T_{2,DQ}^{*,meas}$ (µs) | $T_{2,NV-N}^{*,est}$ (µs) | $T_{2,NV-13C}^{*,est}$ (µs) | $T_{2,NV-(13C+N)}^{*,est}$ (µs) | $dM_z^{meas}/dL$ (MHz/µm) |
|---|---|---|---|---|---|---|---|---|---|---|
| A | ≤ 0.05 | 0.01 | ~ 3 × 10$^{12}$ | ≥ 630 | 5 – 12 | 34 | 350 | 100 | 78 | n/a |
| B | 0.75 | 0.01 | ~ 10$^{14}$ | 250 – 300 | 1 – 10 | 14 | 23 | 100 | 19 | 0.0028 |
| C | 10 | 0.05 | ~ 6 × 10$^{15}$ | 15-18 | 0.3 – 1.2 | 0.6 | 2 | 20 | 2 | n/a |
| D | 3 | < 0.01 | ~ 5 × 10$^{15}$ | 53 | 0.4 | 1.3 | 6 | 100 | > 6 | n/a |
| E | 48 | 1.1 | ~ 1 × 10$^{17}$ | 1.8 | 0.07 | 0.12 | 0.3 | 1 | 0.2 | n/a |

FIG. 10

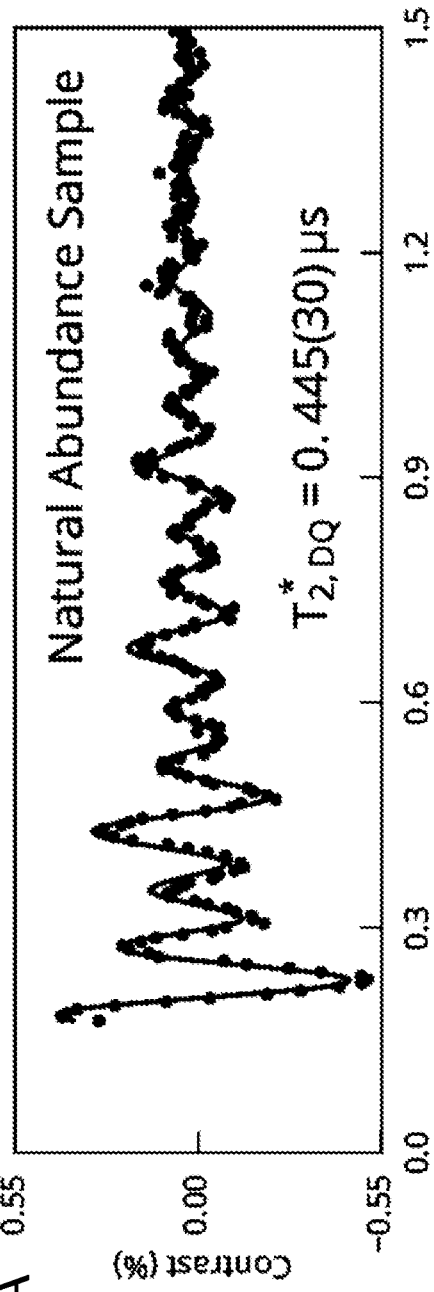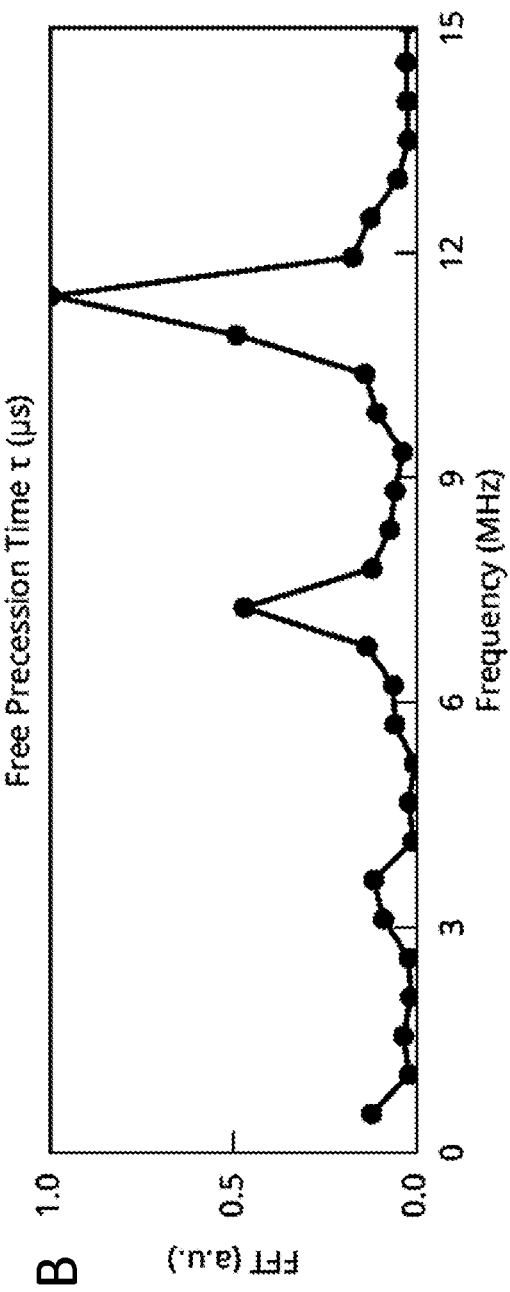
FIG. 15A
FIG. 15B

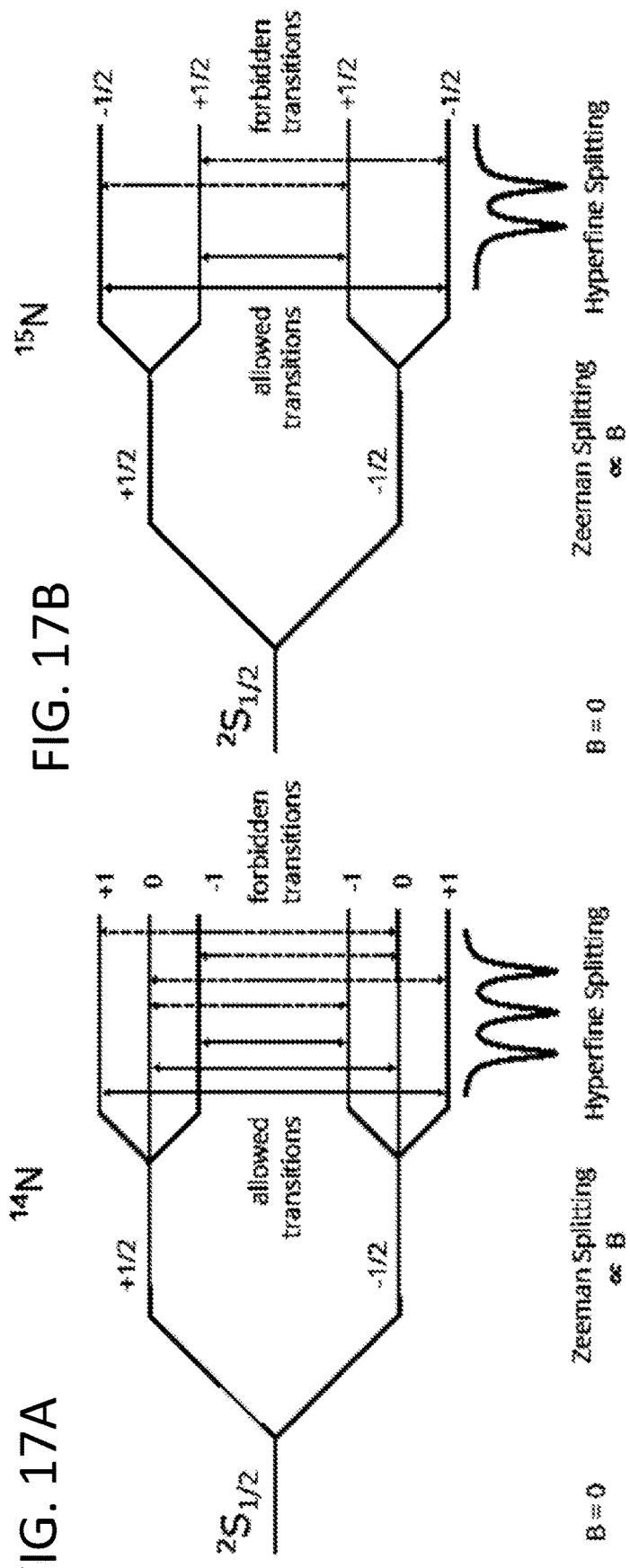

| | $^{14}N$ | |
|---|---|---|
| g | 2.0024 [S21] | |
| $A_\perp, A_\parallel$ | 114 MHz, 81.3 MHz [S21, S22, S24] | |
| $P_\parallel$ | −3.97 MHz [S22] | |
| | $^{15}N$ | |
| $A_\parallel, A_\perp$ | −159.7 MHz, −113.83 MHz [S24] | |
| P | 0 (since $I < 1$) | |

FIG. 18

| Channel | Magnitude | Dephasing 1/μs | μs | Method |
|---|---|---|---|---|
| strain | 0.0028 MHz/μm | 0.190 | 5 | estimate |
| $^{14}$N | 0.05 ppm | 0.0029 | 348 | dipolar estimate |
| $^{13}$C | 0.01% | 0.01 | 100 | calibration |
| magnetic field gradient @ 20 G | 0.000056 MHz/G | 0.00112 | 893 | estimate |
| total SQ | | 0.2035 | 4.9 | 5 – 12 μs (measured) |
| total DQ ×2 (no strain) | | 0.014 | 71 | 68 μs (measured) |

FIG. 23A

| Channel | Magnitude | Dephasing 1/μs | μs | Method |
|---|---|---|---|---|
| strain | 0.0028 MHz/μm | 0.190 | 5 | estimate |
| $^{14}$N (allowed) | | 0.056 | 18 | SEDOR |
| $^{14}$N (forbidden) | | 0.0047 | 214 | SEDOR |
| $^{13}$C | 0.01% | 0.01 | 100 | calibration |
| magnetic field gradient @ 85 G | 0.000056 MHz/G | 0.00474 | 210 | estimate |
| total SQ | | 0.265 | 3.8 | 1 – 10 μs (measured) |
| total DQ ×2 (no strain) | | 0.076 | 13.1 | 13.8 μs (measured) |

FIG. 23B

| Channel | Magnitude | Dephasing 1/µs | µs | Method |
|---|---|---|---|---|
| strain | 0.0028 MHz/µm | 0.140 | 7 | estimate |
| $^{15}$N (allowed) | | 0.59 | 2 | SEDOR |
| $^{15}$N (forbidden) | | 0.15 | 7 | SEDOR |
| $^{14}$N (5% of N15) | | 0.0391 | 26 | estimated |
| $^{13}$C | 0.05% | 0.05 | 20 | calibrated |
| magnetic field gradient @ 100 G | 0.000022 MHz/G | 0.0022 | 446 | estimate |
| total SQ | | 1.01 | 1.0 | 0.3 – 1.2 µs (measured) |
| total DQ ×2 (no strain) | | 0.87 | 1.1 | 1.2 µs (measured) |

FIG. 23C

CONTROL AND CANCELLATION OF SPIN BATH INDUCED DEPHASING IN SOLID-STATE ENSEMBLES

CROSS-REFERENCE TO RELATED APPLICATIONS

This application is a U.S. National Phase Application of PCT/US2018/036197, entitled "ORDER OF MAGNITUDE IMPROVEMENT IN T*2 VIA CONTROL AND CANCELLATION OF SPIN BATH INDUCED DEPHASING IN SOLID-STATE ENSEMBLES," filed on Jun. 6, 2018, which claims the benefit of priority to U.S. Provisional Application No. 62/515,602, entitled "ORDER OF MAGNITUDE IMPROVEMENT IN T*2 VIA CONTROL AND CANCELLATION OF SPIN BATH INDUCED DEPHASING IN SOLID-STATE ENSEMBLES," filed on Jun. 6, 2017, the disclosures of each of which are hereby incorporated by reference in their entirety.

STATEMENT OF GOVERNMENT INTEREST

This invention was made in part with government support under Grant No. W911NF1510548 awarded by the United States Army Research Laboratory and the United States Army Research Office. The United States Government has certain rights in this invention.

TECHNICAL FIELD

Embodiments of the present invention generally relate to methods and apparatuses for improvements in spin center ensemble measurements.

BACKGROUND

Solid-state electronic spins ("spin centers"), including defects in silicon carbide, phosphorus spins in silicon, and silicon-vacancy and nitrogen-vacancy (NV) color centers (also known as NV centers) in diamond, have garnered increasing relevance for quantum science and sensing experiments. In particular, NV centers in diamond have been extensively studied and deployed in diverse applications facilitated by long NV spin coherence times at ambient temperature, as well as optical preparation and readout of NV spin states. Many applications utilize dense NV spin center ensembles for DC magnetic field sensing and wide-field DC magnetic imaging, including measurements of single-neuron action potentials, paleomagnetism, and current flow in graphene.

For NV ensembles, the DC magnetic field sensitivity is typically limited by dephasing of the NV center spins. Quantum spin dephasing is caused by inhomogeneous coupling to the environment, with resulting limits to the measurement time and precision of spin-based sensors. The effects of spin dephasing can be especially pernicious for dense ensembles of spin centers in the solid-state, including for NV color centers in diamond. Thus, sensitivity is significantly limited for ensemble-based measurements as compared to single-spin systems.

In such instances, spin interactions with an inhomogeneous environment limit the sensing time to the spin dephasing time $T_2^*$ to less than approximately 1 microsecond. Hahn echo and dynamical decoupling protocols can restore the NV ensemble phase coherence by isolating the NV center spins from environmental noise and, in principle, permit sensing times approaching the spin lattice relaxation time ($T_1$), which can approach approximately a millisecond) However, these protocols restrict sensing to AC signals within a narrow bandwidth.

SUMMARY OF THE INVENTION

The development of high sensitivity, broadband magnetometers with spin center ensembles that extend $T_2^*$ while retaining the ability to measure DC signals is presented here. In one aspect, a method of measuring a direct current (DC) magnetic field using a plurality of spins centers in an ensemble of spin centers includes: driving, with a first source of electromagnetic radiation, a spin bath associated with the ensemble of spin centers to decouple the spin bath from the ensemble of spin centers, wherein the first source of electromagnetic radiation is at a resonance frequency of the spin bath; performing, with a second source of electromagnetic radiation, double quantum (DQ) coherence magnetometry on the ensemble of spin centers; observing, using at least one electromagnetic radiation collection device, an electromagnetic response of at least one of the plurality of spin centers in the ensemble of spin centers, wherein the electromagnetic response of the at least one of the plurality of spin centers is responsive to the DC magnetic field; and determining, using the observed electromagnetic response, a characteristic of the DC magnetic field.

In one or more embodiments the ensemble of spin centers comprises a plurality of nitrogen-vacancy (NV) spin centers in diamond.

In one or more embodiments the density of NV spin centers in the diamond is between 0.01-0.1 parts per million (PPM).

In one or more embodiments the density of NV spin centers in the diamond is between 0.1-3 parts per million (PPM).

In one or more embodiments the density of NV spin centers in the diamond is between 3-200 parts per million (PPM).

In one or more embodiments the spin bath comprises a plurality of P1 nitrogen spins in the diamond.

In one or more embodiments the first source of electromagnetic radiation comprises at least one radio frequency (RF) signal source having at least one frequency between 100-600 MHz.

In one or more embodiments the first source of electromagnetic radiation comprises a plurality of tones at different frequencies.

In one or more embodiments the method further includes calibrating the first source of electromagnetic radiation to at least one resonant frequency of the spin bath.

In one or more embodiments the calibrating includes: performing a double electron-electron resonance (DEER) measurement on the spin bath to produce a resonance spectrum of the spin bath; identifying, from the resonance spectrum of the spin bath, at least one resonance peak corresponding to the at least one resonance frequency of the spin bath; setting the first source of electromagnetic radiation to the at least one resonance frequency of the spin bath.

In one or more embodiments the second source of electromagnetic radiation is at least one microwave source having at least one frequency between 2-3.5 GHz.

In one or more embodiments the driving, with a first source of electromagnetic radiation, the spin bath comprises driving with a continuous wave.

In one or more embodiments the driving, with a first source of electromagnetic radiation, the spin bath comprises driving with a pulsed wave sequence.

In one or more embodiments the observing the electromagnetic response of at least one of the plurality of spin centers in the ensemble of spin centers comprises recording, with a spatially resolved imaging device, the resulting electromagnetic response.

In one or more embodiments the observing the electromagnetic response of at least one of the plurality of spin centers in the ensemble of spin centers comprises collecting photons with at least one photodiode.

In one or more embodiments the method further includes providing a bias field across the ensemble of spin centers.

In one or more embodiments the providing the bias field across the ensemble of spin centers comprises providing a first Helmholtz coil on one side of the ensemble of spin centers and providing a second Helmholtz coil on another side of the ensemble of spin centers opposite the first Helmholtz coil.

In one or more embodiments the performing, with a second source of electromagnetic radiation, double quantum (DQ) coherence magnetometry on the ensemble of spin centers includes: pumping at least some of the spin centers in the ensemble of spin centers into the m=0 state with a first pulse of light form a light source; applying a first two-tone pulse with the second source of electromagnetic radiation to the ensemble of spin centers to transfer at least some of the spin centers in the ensemble of the spin centers into a superposition of the +1 and −1 states; applying, after a free precession interval, a second two-tone pulse with the second source of electromagnetic radiation to the ensemble of spin centers to project phase accumulated by at least some of the spin centers during the free precession interval into a population difference;
applying a second pulse of light from the light source to the ensemble of spin centers to produce fluorescence from at least some spin centers in the ensemble of spin sensors.

In one or more embodiments the light source is a laser emitting light at approximately 532 nanometers.

In another aspect, an apparatus for measuring a direct current (DC) magnetic field, includes: an ensemble of spin centers; a spin bath associated with the ensemble of spin centers;
a first source of electromagnetic radiation configured to drive the spin bath associated with the ensemble of spin centers to decouple the spin bath from the ensemble of spin centers, wherein the first source of electromagnetic radiation is at a resonance frequency of the spin bath; a second source of electromagnetic radiation for performing double quantum (DQ) coherence magnetometry on the ensemble of spin centers; and at least one electromagnetic radiation collection device for observing an electromagnetic response of at least one of the plurality of spin centers in the ensemble of spin centers, wherein the electromagnetic response of the at least one of the plurality of spin centers is responsive to the DC magnetic field.

These and other capabilities of the disclosed subject matter will be more fully understood after a review of the following figures, detailed description, and claims. It is to be understood that the phraseology and terminology employed herein are for the purpose of description and should not be regarded as limiting.

BRIEF DESCRIPTION OF FIGURES

Various objectives, features, and advantages of the disclosed subject matter can be more fully appreciated with reference to the following detailed description of the disclosed subject matter when considered in connection with the following drawings, in which like reference numerals identify like elements.

FIG. 10 is a table showing experimental results for three diamond samples with varying nitrogen concentrations, according to some embodiments.

FIGS. 15A-15B show graphs indicating NV Ramsey measurement for a natural isotope abundance diamond sample, according to some embodiments.

FIGS. 17A-17B show three dipole-allowed transitions, according to some embodiments.

FIG. 18 shows nitrogen defect parameters, according to some embodiments.

FIGS. 23A-23C are tables showing NV spin ensemble dephasing mechanisms, according to some embodiments.

DETAILED DESCRIPTION

Figure 1:
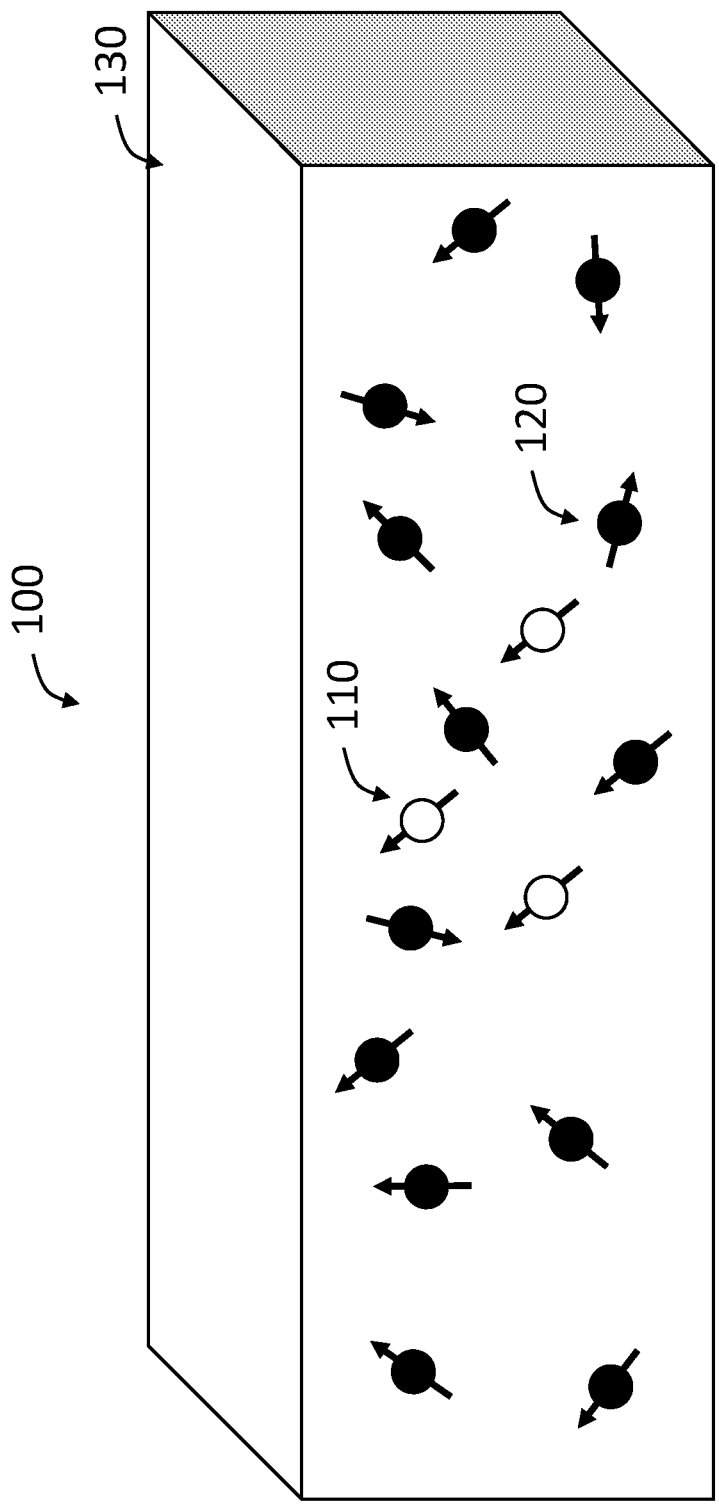
FIG. 1 is a schematic illustrating a spin center ensemble, according to some embodiments.

In order to enhance spin dephasing time in an ensemble of solid-state (sensor) spins, double quantum (DQ) coherence magnetometry may be performed in combination with spin bath control. As described in more detail in the present disclosure, in combination, these quantum control techniques (i) virtually eliminate the effects of the dominant NV spin center ensemble dephasing mechanisms, including crystal strain gradients and dipolar interactions with paramagnetic bath spins, and (ii) increase the effective NV gyromagnetic ratio by a factor of two. Combined together, these two complimentary techniques synergistically produced $T_2^*$ times that are significantly longer that other solid-state electronic spin center ensembles at room temperature (up to 17× enhancement), thereby increasing the sensitivity of such systems as magnetic field sensors for small scale DC fields. Accordingly, dynamic decoupling of the sensor spins is not required.

In the case of NV centers in diamond, several mechanisms contribute to NV spin center ensemble dephasing in bulk diamond. In particular, the manufacturing of negatively charged $NV^-$ centers (S=1, where S is the electronic spin) often requires the incorporation of nitrogen into the diamond lattice. As a result, paramagnetic substitutional nitrogen impurities (P1 centers, S=1=2) and/or other impurities typically persist post-manufacturing at densities similar to or exceeding the NV concentration, leading to a "spin bath" that couples to the NV spins via incoherent dipolar interactions. In addition, strain can affect the diamond crystal and the zero-magnetic-field splitting between NV spin states. The exact contribution of strain gradients to NV spin dephasing has not been quantified rigorously because strain varies throughout and between samples. Furthermore, the interrogation of spatially large NV ensembles requires the design of uniform magnetic bias fields to minimize magnetic field gradients across the detection volume.

Experiments with NV centers are typically performed in the single quantum basis of the NV ground state, i.e. the $\{0,-1\}$ or $\{0, +1\}$ sub-basis (single quantum measurements). For example, in a Ramsey-type sensing sequence, a $\pi/2$-pulse creates a superposition of the $m_s=0$ and $m_s=\pm 1$ state, $2^{-2}$ ($|0\rangle+|\pm 1\rangle$). During a free precession interval $\tau$, the $|\pm 1\rangle$ state accumulates a phase. A final $\pi/2$-pulse converts the accumulated phase into a population difference which is then read out optically by applying a green laser pulse.

According to some embodiments, double quantum (DQ) coherence magnetometry in combination with spin bath control mitigates the dominant sources of NV spin center ensemble dephasing and thereby extends $T_2^*$. DQ magnetometry employs the $\{-1, +1\}$ sub-basis of the NV spin-1 system for quantum sensing. In this basis, noise sources, such as, but not limited to inhomogeneity in lattice strain, electric field noise from nearby charged defects, or temperature fluctuations that can shift the $|\pm 1\rangle$ states in common mode are suppressed by probing the energy difference between the $|+1\rangle$ and $|-1\rangle$ spin states. In addition, the NV DQ spin coherence accumulates phase due to an external magnetic field at twice the rate of traditional single quantum (SQ) coherence magnetometry, for which the $|0\rangle$ and $|\pm 1\rangle$ spin states are probed. DQ magnetometry provides enhanced susceptibility to target magnetic field signals while also making the spin coherence twice as sensitive to magnetic noise. However, this has the negative effect of increasing NV centers' interaction with the paramagnetic spin bath (as compared to measurement using the SQ basis).

Therefore, according to some embodiments, a resonant radiofrequency control is used to decouple the bath spins from the NV centers. These techniques are also compatible with Ramsey-based DC sensing and can produce up to an 8× improvement in DC magnetic field sensitivity as a result of a 15-16× increase in $T_2^*$. This provides for broadband DC sensing using NV spin center ensembles with spin interrogation times approaching those used in AC sensing; and can aid in the fabrication of optimized samples for a wide range of solid-state sensor species.

FIG. 1 shows a spin center ensemble 100, according to some embodiments. The spin center ensemble 100 includes a collection volume 130, such as a diamond substrate. Inside the collection volume 130 are spin centers 110, such as NV centers, and spin bath spins 120, such as Nitrogen defects, that form a spin bath. As shown in FIG. 1, the spin bath spins 120 are in close proximity to the spin centers 110 and can interfere with measurements. As discussed above, this interference is heightened when measuring in the DQ basis, as such measurements are much more susceptible to magnetic noise, and for high density sensors. As described in more detail below, this interference is significantly reduced by coherently manipulating the spin bath spins 120 at a predetermined resonance frequency or frequencies, such as by utilizing a separate electromagnetic source. By causing the spin bath spins 120 to resonate, the net effect of their magnetic field on the spin centers 110 is canceled out. According to an embodiment, under CW irradiation, the bath spins undergo many Rabi oscillations during the characteristic dipolar interaction time $1/\gamma$ (note that for the purposes of this discussion, Rabi oscillations can be considered to be analogous to magnetic field reversals). As a result of the rapid field reversals, the average magnetic field generated by the bath spins is incoherently averaged to zero. This results in an increase in the NV spin dephasing time. This can be described as incoherent because the bath spins oscillate without a fixed phase relationship between each other or the NVs. According to another embodiment, the net effect of the bath spins on the NV centers can also be suppressed using pulsed control (containing the same or similar frequencies as the CW control). In pulsed spin bath driving, a multi-frequency RF $\pi$-pulse is applied to each of the bath spin resonances midway through the NV Ramsey sequence, decoupling the bath from the NV sensor spins in analogy to a refocusing $\pi$-pulse in a spin echo sequence.

Figure 2:
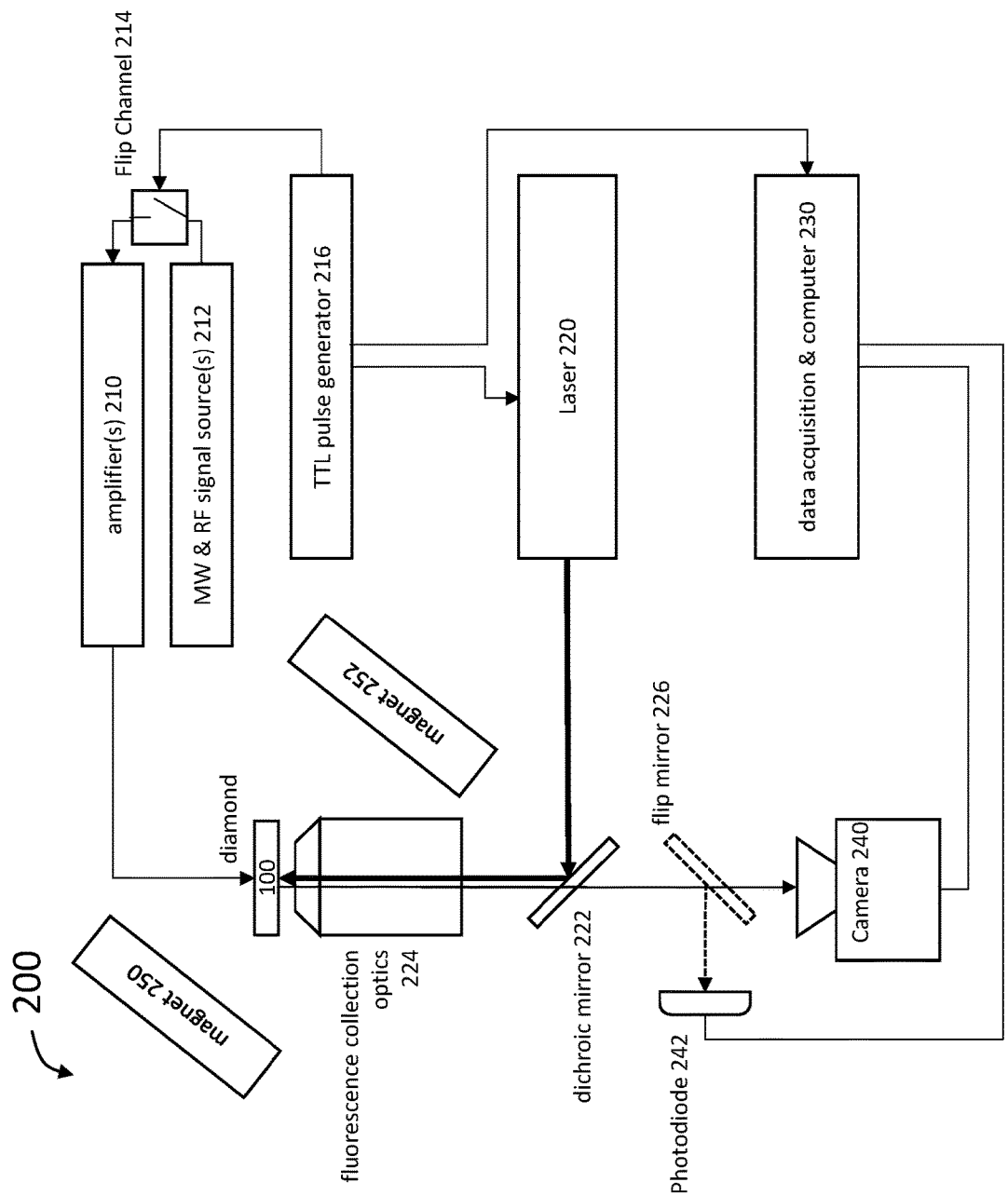
FIG. 2 is block diagram of an apparatus for operating a spin center ensemble, according to some embodiments.

FIG. 2 shows a system for implementing DQ measurement and spin bath control of an NV center ensemble, according to some embodiments. The system 200 includes spin center ensemble 100, such as a diamond substrate with NV centers contained therein, at least one microwave amplifier 210, at least one signal source 212, a flip channel 214, a pulse generator 216 such as a transistor-transistor logic (TTL) pulse generator, a laser 220, a data acquisition and computer unit 230, a camera 240 and/or a photodiode 252 (and a corresponding flip mirror 226), a dichroic mirror 222, fluorescence collection optics 224, and magnets 250, 252.

Figure 4A:
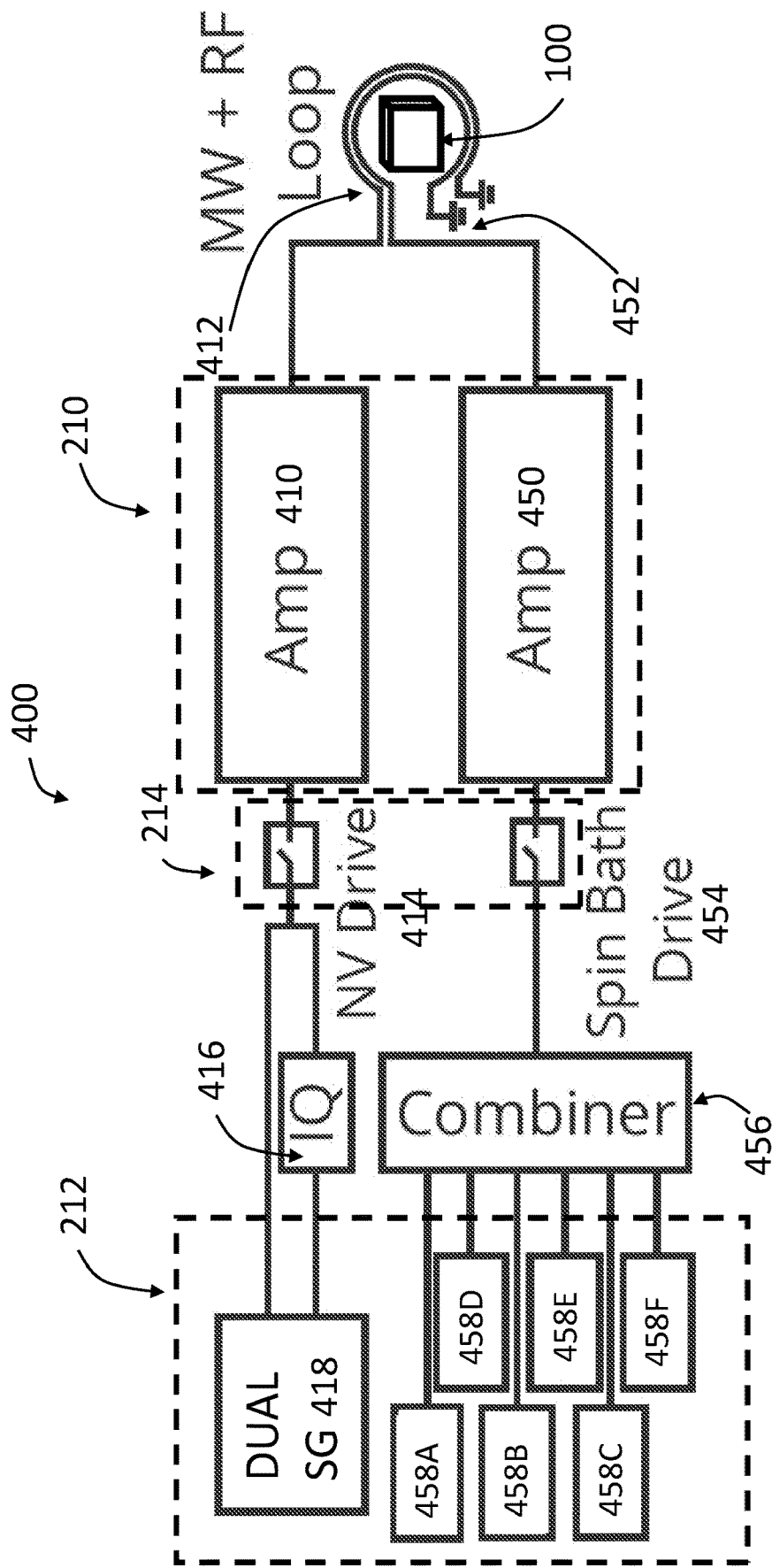
FIGS. 4A-4B are a block diagram of a system for supplying microwave and RF signals and a sample signal spectrum from a spin bath, according to some embodiments.

Amplifier(s) 210, signal source(s) 212, flip channel 214, and pulse generator 216 provide signals to be applied to the spin center ensemble 100 (for example via a microwave/RF delivery system as shown in FIG. 4A). As shown in FIG. 2 signal source(s) 212 produce signals having frequencies in the microwave range and radio frequency (RF) range, according to some embodiments. The signal(s) are then fed to the flip channel 214, which is controlled by pulse generator 216. Pulse generator selectively applies the signal(s) from signal source(s) 212 to the amplifier(s) 210. The amplifier(s) 210 amplify the signal(s) for application to the spin center ensemble 100. Accordingly, one or more particular microwave/RF signals may be applied to the spin center ensemble 100 at selected times so as to drive the NV centers for measurement of, e.g., a magnetic field and to drive the spin bath so as to decouple the spin bath from the NV centers. Coherent control of the NV centers may be provided via 2-3.5 GHz microwave radiation, for example, and control of the spin bath may be provided for via, for example, signals in the 100-600 MHz RF range. According to some embodiments, control of the NV centers and the spin bath may be provided by multiple superimposed microwave and RF frequencies, respectively.

Laser 220 may be, for example, a 532 nm continuous-wave (CW) laser. The light produced by the laser may be directed via the dichroic mirror 222 through fluorescence collection optics 225 and onto the spin center ensemble 100. The laser 220 can be used to initialize and readout the spin center ensemble 100. NV centers are a spin triplet with magnetic $m_s$=−1,0,1 ground spin states. In thermal equilibrium all states are approximately equally populated. Under laser light illumination, such as that provided by laser 220, the NV centers are pumped into $m_s$=0. This is referred to as initialization or polarization of the NV spin state. The mechanisms may work as follows: the laser excites the NV spin population in the ground state into an excited triplet state. Depending on the initial spin state, the excited state triplet population either decays back to the ground state under emission of red fluorescence ($m_s$=0 population) or is shelved into a meta-stable singlet state ($m_s$=±1 population). The population in the meta-stable state preferentially decays into the $m_s$=0 state. Consequently, after few cycles of laser light excitation, NV centers are pumped into the $m_s$=0 ground state with high probability, independent of the initial spin state (this spin polarization process is not quite perfect). According to some embodiments, the laser 220 can also be used for readout. The decay path of the spin population in the excited state is spin-state dependent, as explained above. This leads to a net difference in fluorescence signal emitted from each spin state. Because $m_s$=±1 spin state population decays also via the meta-stable singlet state, its fluorescence is reduced over the $m_s$=0 state. This difference in fluorescence is used to identify the spin state. This process may be referred to as optically detected magnetic resonance (ODMR). High fluorescence corresponds to $m_s$=0 spin state population, reduced fluorescence to $m_s$=+1 (or −1) population. Note that the fluorescence contrast differs between single NVs (~25%) and NV ensembles (~1-10%). For initialization and readout, 532 nm laser light is may be used. However, while for initialization usually a long laser pulse is applied (~5-20 us), the readout pulse length is dependent on the exact pumping rates and thus dependents on power densities (how much light per area is used). According to some embodiments, the readout pulse length may be optimized based on the experimental conditions. The readout and initialization pulse can be also one type of pulse, but more flexibility is given with separate and different readout and initialization pulses.

Fluorescence signals produced by the spin center ensemble 100 are collected by fluorescence collection optics 224 and passed through the dichroic mirror 222. According to some embodiments, a flip mirror 226 selectively supplies the fluorescence signal to a photodiode 242 and/or a camera 240. At least one electromagnetic radiation collection device, such as photodiode 242 and/or camera 240 then send a signal indicative of the collected light to the data acquisition and computer unit 230. According to some embodiments, only one of the photodiode 242 or camera 240 is used and the flip mirror 226 is not used. Photodiode 242 provides for single-channel detection, which may have high sensitivity to low intensity signals from the spin center ensemble 100. Camera 240 may allow for imaging of the fluorescence output of the spin center ensemble 100 so as to provide a spatially resolved signal. NV fluorescence can be collected using the same optics 224 employed for excitation (epifluorescence) or using a separate set of optics (second objective, lens, or lightguide). Sensors may also be attached directly to the diamond surfaces to avoid additional optics in a side collection geometry.

According to some embodiments, the data acquisition and computer 230 comprises a plurality of computers or computing elements for controlling the operation of various elements in the system, including the magnets 250, 252, the photodiode 242, the camera 240, the flip mirror 225, the laser 220, the pulse generator 216, the flip channel 214, the signal source(s) 212, the amplifier(s) 210, and/or the fluorescence collection optics 224.

Magnets 250 and 252 are used to apply a bias magnetic field to the spin center ensemble 100, according to some embodiments. The magnets 250 and 252 may be ring magnets, for example. The two ring-geometry magnets 250 and 250 may be used to generate a bias magnetic field $B_0$ with a magnitude between 0-300 G and arbitrary orientation, according to some embodiments. According to some embodiments, the bias field may perform three functions. First, the bias field breaks the ground state spin state symmetry by energetically splitting the $m_s$=+1 and $m_s$=−1 state. Typically, magnetometry is performed employing either the $m_s$=0 to +1 or $m_s$=0 to −1 transitions, so sufficient separation of the ±1 states helps for the measurement techniques described herein. According to an embodiment, a small, 20 G is sufficient. Second, the bias field enables distinction between NV centers which are oriented along any of the four possible crystal axes. The magnetic field direction controls the amount of magnetic field projection on each of the four crystal axis. The magnetic field can be aligned such that all four-axis see the same projection, or all different, or some combination of equal and unequal axes projections, according to various embodiments. Third, applying a magnetic bias field suppresses noise to due electric fields and strain field gradients in diamond. However, it also makes it more susceptible to magnetic field noise. According to some embodiments, the bias field is spatially and temporally homogeneous across the entire NV ensemble. This is because magnetic field gradients can degrade the dephasing time and sensitivity of the spin center ensemble 100, such as an NV magnetometer. Accordingly, as described in more detail with reference to FIG. 5A, two-ring magnets may be arranged diametrically from each other in a Helmholtz-like configuration with the spin center ensemble 100 placed in the center between the two magnets. According to an embodiment, magnets 250, 252 may be made of Samarium Cobalt to reduce the sensitivity of the bias magnetic field strength to changes in temperature. Permanent magnets made from other materials could also be used. According to some embodiments, different configurations for providing constant and homogeneous bias magnetic fields may be implemented. For example, Helmholtz coils could be used to generate the bias field given a sufficiently low noise current supply.

Figure 3A:
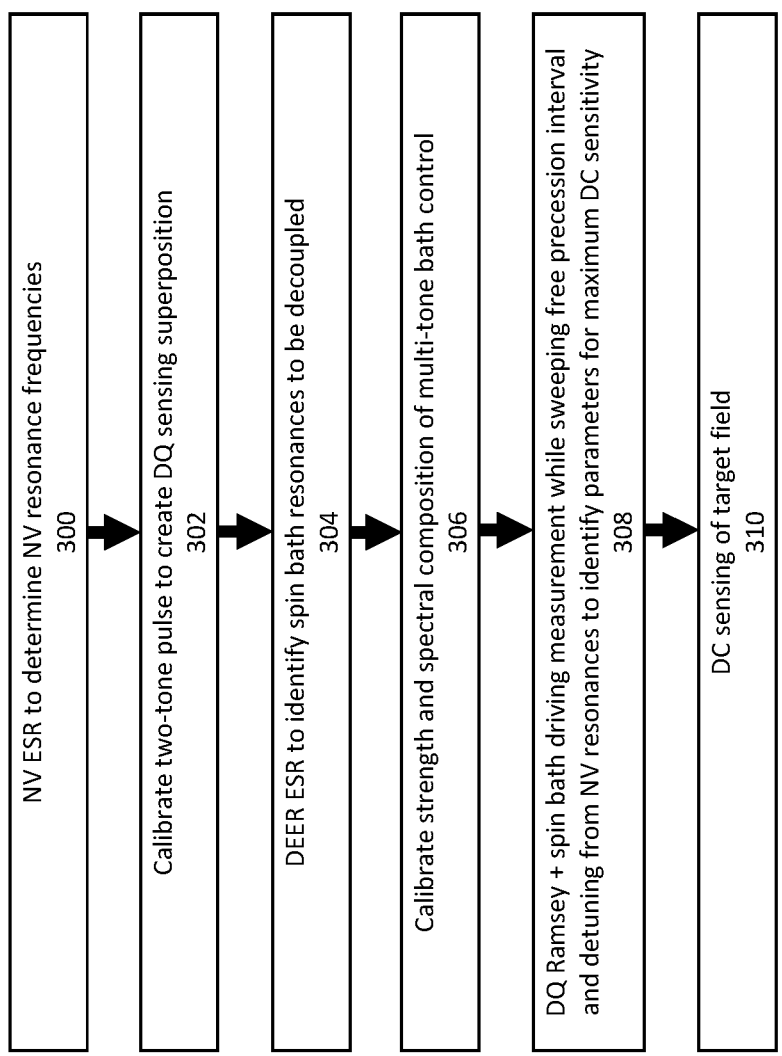
FIGS. 3A-B. are flowcharts representing methods of operating spin center ensembles, according to some embodiments.

FIG. 3A shows a flow diagram of a measurement method, according to some embodiments. At step 300, electron-spin resonance (ESR) is performed on the spin center ensemble 100 to identify NV resonance frequencies. Resonant frequencies are identified in order to determine the frequency of the AC magnetic field used to control the magnetic spin states. The pulsed AC fields may be used to create the superposition states employed for sensing. At step 302, the signal source(s) 212 are calibrated to produce signals for DQ sensing at the identified resonance frequencies. According to some embodiments, this may comprise one, two, or more tones. When the $m_s=+/-1$ spin ground state spin states have equal energy (for example when no magnetic bias field is applied), a single MW tone may be sufficient to address the 0<->+1 and 0<->-1 transitions simultaneously for DQ magnetometry. With finite magnetic bias field, the +1 and -1 spin ground states are energetically different. Thus, in order to address the 0<->-1 and 0->+1 transitions simultaneously, two MW frequencies may be employed. This process can be generalized to higher spin systems with more spin levels. For example, according to an embodiment, an S=3/2 spin system has 4 energy levels and 3 allowed dipole transitions. To create a "triplet"-quantum state 3 MW frequencies can be used. This may be combined with spin bath control as discussed throughout the present disclosure in order to perform higher order measurements on spin center ensembles with reduced sensitivity to noise.

At step 304, double electron-electron resonance (DEER) ESR may be performed in order to identify the resonances for spins in the spin bath that are to be decoupled from the NV spins. This is accomplished in order to identify the nitrogen energy spectrum (and thus resonant frequencies) in order to determine the composition of the multi-frequency AC fields used to drive spins in the spin bath. This is analogous to identifying the NV resonance frequencies via ODMR. However, nitrogen spins have no ODMR signal—so the NV spin is used to interrogate the nitrogen spins (referred to as DEER, as discussed above).

At step 306, the signal source(s) 212 are calibrated to produce signals at a strength and with a spectral composition capable of decoupling the spin bath from the NV spins. The signals must be resonant with some or each of the bath spin resonances and have an amplitude sufficient to drive spin flips of the bath spins rapidly. According to an embodiment, the drive strength of individual spin resonances should be substantially larger than the ensemble $T_2^*$, i.e., $\Omega_N \gg 1/T_2^*$. Accordingly, the frequencies and amplitudes of the signals may be calibrated to produce sufficient response in the spin bath.

At step 308, a DQ Ramsey sequence is applied to the spin center ensemble 100 in tandem with spin bath driving using the frequencies identified and calibrated in steps 300-306. Sweeping the free precession interval (sweeping the time between pulses in the sequence) enables identification of the dephasing time T2*, which in turn determines the precession interval for optimal sensitivity, which is $\approx T_2^*/2$. Detuning refers to the difference in frequency between the NV resonance and applied AC signal. The optimal sensitivity occurs when the change in contrast with respect to detuning is largest (i.e., a change in the fluorescence corresponds to a change in NV resonant frequency). According to an example the precession interval could be set and then the detuning swept to find the point of maximum slope. The signal will oscillate sinusoidally as the detuning is swept such that the optimal slope occurs at a zero crossing. Finally, at step 310, DC sensing is performed on the spin center ensemble 100.

Figure 3B:
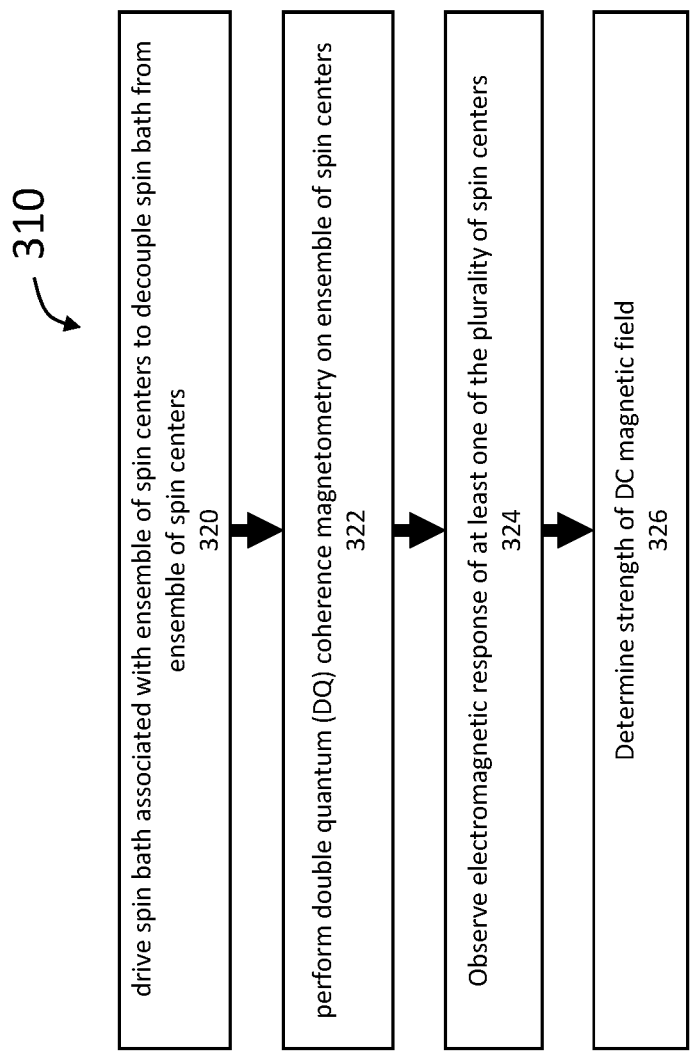

FIG. 3B is a flow diagram showing the steps included in step 310, according to some embodiments. At step 320, the spin bath is driven with a first source of electromagnetic radiation, such as the RF waveguide 452 described in more detail with reference to FIG. 4A, double quantum (DQ) coherence magnetometry on the ensemble of spin centers, such as the spin center ensemble 100. At step 322, DQ coherence magnetometry is performed on ensemble of spin centers using a second source of electromagnetic radiation, such as MW waveguide 412 described in more detail with reference to FIG. 4A. According to some embodiments, DQ magnetometry may include the following steps. The two-tone MW signals calibrated in earlier steps (as described above) are applied to the spin center ensemble 100. The first DQ pulse transfers the NV center from the $m_s=0$ spin state to a superposition of the +/-1 states which is used for sensing. After the free precession interval (i.e., waiting for a fixed amount of time), a second DQ pulse of equal length to the first is applied to project the phase accumulated during the precession interval into a population difference (number of spins in 0 compared to +/-1). The population is determined using a readout pulse. This sequence is analogous to a single quantum Ramsey sequence, which employs the 0<->+1 (or 0<->-1) transition, but only requires a single resonant MW frequency.

At step 324, the electromagnetic response of one or more of the spin sensors in the ensemble is observed using, for example an electromagnetic radiation collection device. According to some embodiments, the electromagnetic response of the one or more spin centers is responsive to a local DC magnetic field. At step 326, a characteristic, such as but not limited to one or more of a strength, spatial distribution, and/or directionality of the local DC magnetic field is determined. This may be accomplished using, for example, software receiving signals resulting from the electromagnetic radiation collection device, according to an embodiment.

FIG. 4A shows a system for supplying microwave and RF signals to a spin center ensemble 100, according to an embodiment. The system 400 includes dual microwave signal generator 418, IQ 416, NV drive switch 414, amplifier 410, microwave waveguide 412, RF signal generators 458A, 458B, 458C, 458D, 458E, 458F, signal combiner 456, spin bath drive switch 454, RF amplifier 450, and RF waveguide 452. In operation, dual microwave signal generator 418, IQ 416, NV drive switch 414, amplifier 410, and microwave waveguide 412 produce microwave signals for coherent control of the spin center ensemble 100, such as NV centers in diamond. Dual microwave signal generator 418 produces, for example, single and two-tone microwave signals across two channels (e.g., two-tones used for DQ pulses where each channel of the signal generator generates one tone, and these are combined together before the amplifier). According to an embodiment, an IQ mixer 416 is used on one line to manipulate the relative phase between both channels. An NV drive switch 414 is used to selectively control application of the microwave signal to create control pulses prior to amplification. Amplification of the signals to a desired amplitude is accomplished via amplifier 410. The output signal from amplifier 410 is them delivered to the spin center ensemble 100 via a microwave waveguide 412, for example a 500 μm wire placed in proximity to the spin center ensemble 100. According to some embodiments, the waveguide 412 is a planar waveguide fabricated onto a glass substrate and may deliver 2-3.5 GHz microwave radiation for coherent control of the spin center ensemble 100, such as control of the spin states of an NV center ensemble.

RF signal generators 458A, 458B, 458C, 458D, 458E, 458F, signal combiner 456, spin bath drive switch 454, RF amplifier 450, and RF waveguide 452 function to provide RF signals for manipulation of the spin bath, such as nitrogen spins in diamond. According to some embodiments, a number, such as six or more single channel signal generators 458A, 458B, 458C, 458D, 458E, 458F may be provided to generate RF signals. The signals from each of the signal generators 458A, 458B, 458C, 458D, 458E, 458F are combined at combiner 456 and provided to a spin bath drive switch 454, which selectively applies the RF pulses for spin bath control. The output of spin bath drive switch 454 is provided to amplifier 450 for amplification, and then directed to the spin bath via waveguide 452. Waveguide 452 may be, for example, a 1 mm diameter grounded copper loop positioned above the sample (e.g., diamond). According to some embodiments, the RF signals include multiple tones in the 100-600 MHz range. According to some embodiments, different tones are provided to drive different spins in the spin bath. The NV and spin bath drive switches 414 and 454 may be controlled via a computer-controlled pulse generator and microwave switches. According to another embodiment, the RF tones and specific frequencies are generated by direct digital synthesis or mixing of a baseband signal with digitally synthesized intermediate frequencies.

The spin bath may be controlled using RF signal generators 458A, 458B, 458C, 458D, 458E, 458F, signal combiner 456, spin bath drive switch 454, RF amplifier 450, and RF waveguide 452 so as to decouple the spin bath from the spin center ensemble 100. According to an embodiment, the spin bath comprises nitrogen spin centers (P1 spins). However, there is a diverse set of other spin centers in the bath which can also be controlled analogously to the P1 centers. These may include but are not limited to single lattice vacancies, hydrogen-containing defects, and multi-vacancy clusters. Depending on the sample properties, these other species can exist at concentrations comparable to the P1 density, and thus can also be decoupled to improve NV dephasing times.

The number of tones and specific frequencies required from RF signal generators 458A, 458B, 458C, 458D, 458E, 458F to control the spin bath depends upon both the orientation and strength of the external bias magnetic field as well as the isotope of nitrogen (14N or 15N) present in the sample. For a $^{14}$N sample with an arbitrary magnetic field orientation applied, up to 12 distinct resonances may need to be addressed to decouple the bath. However, with the magnetic field aligned along one crystallographic axis, multiple of the resonances become degenerate and only 6 tones may be needed. Similar reductions in the number of tones can be achieved with other high-symmetry alignments (i.e. equal projection of the bias magnetic field along all four crystallographic axes). The total amount of distinguishable resonant frequencies of the bath spins may depend in part upon the strength and direction of the bias field (e.g., the magnetic Zeeman interaction of the electron in the substitutional nitrogen defect with the magnetic field which shifts the resonant frequency). This is similar to the NV resonances from the four different crystal lattice orientations, which are controlled via the bias field and can be all overlapped, or all separated (see bias field discussion above). For example, the nitrogen defect (S=½, I=1), has a total of 12 distinguishable resonance frequencies (4 from crystal lattice orientations×3 transitions for the defect). However, due to symmetry, these 12 transitions can collapse to a minimum of 6 transitions at sufficiently high bias fields, or even fewer at low magnetic fields. Thus, depending on the field strength and other factors, it may be necessary to drive all 12 transitions, or, due to symmetry, only 6 or fewer.

Spin bath control can be implemented at an arbitrary external magnetic field strength (e.g., based on considerations discussed above). In the lower field regime (when the magnetic field is weak compared to the hyperfine interaction of the electron spin with the nuclear spin in the substitutional nitrogen spin, which dominate the spin bath, e.g. field strengths of 30 G or less), the specific frequencies may be determined predominantly by the hyperfine coupling parameters. This may also reduce the number of tones required. Typical frequencies for the spin bath resonances range from 100-500 MHz or 100-600 MHz for electronic spin bath species in a 100 G external bias field. The location of these resonances scales with the strength of the external applied DC field. In other words, the frequencies of the resonances are proportional to the magnetic field strength. The number of tones is dependent on the B-field strength (low or high B-field regime) and direction with respect to the crystal axis (see discussion bias field above).

Spin bath driving may or may not include addressing all spin bath resonances. The achieved increase in dephasing time will be proportional to the fraction of spin bath population decoupled and the effectiveness of the decoupling. Full decoupling (suppression of the spin bath induced broadening by >10×) is not necessary to achieve improved sensitivity. However, it is desirable to characterize and decouple as many spin bath resonances as possible in order to obtain greater sensitivity.

Double Electron-Electron Resonance (DEER) noise spectroscopy may be used to identify the spin bath resonances to be controlled. In this technique, a π-pulse is applied on the spin bath midway through an Echo sequence on the NV center spins. This selectively cancels the effects of the NV echo sequence when the bath π-pulse is resonant with a species in the bath (indicated by a frequency specific loss in NV contrast/coherence). A similar approach (sweeping the duration of the pi-pulse instead of the frequency) can be used to calibrate the strength of the AC bath control field.

Figure 4B:
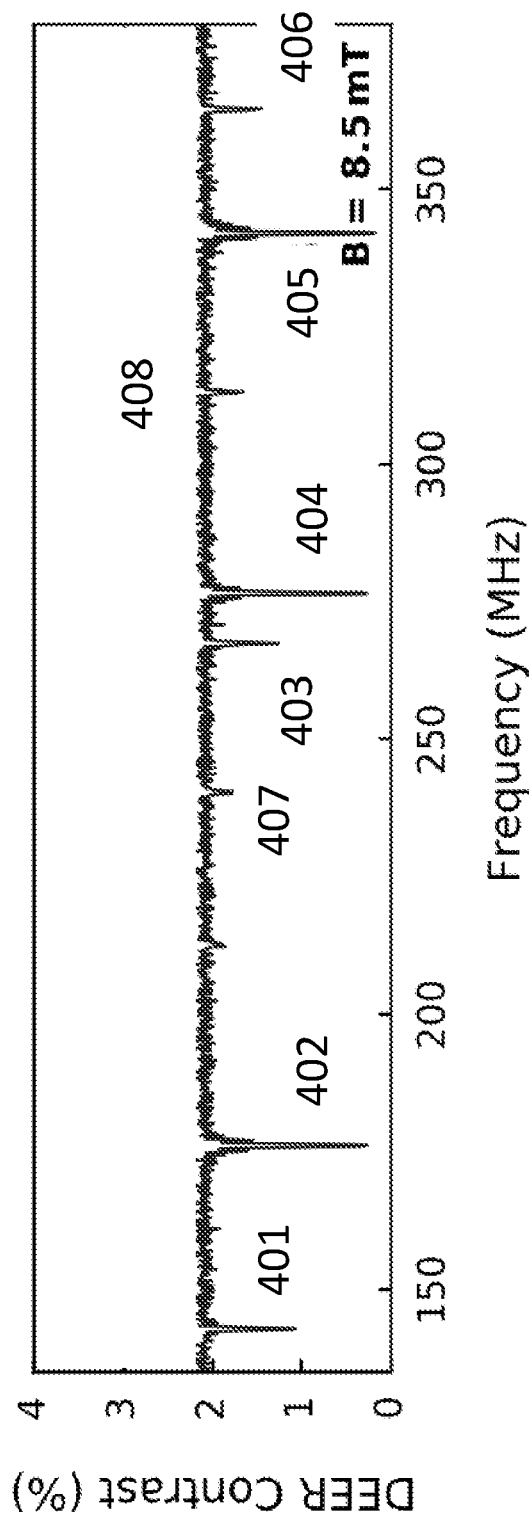

FIG. 4B shows a DEER Contrast spectrum for a sample spin bath including $^{14}$N spins, according to an embodiment. Application of a 8.5 mT magnetic field along a [111]-crystallographic axis produced at least six recognizable resonance frequencies 401, 402, 403, 404, 405, and 406. The two smaller peaks 407, 408 correspond to dipole-forbidden transitions of the $^{14}$N electron pins. These forbidden transitions consist of electron and nuclear spin flips. According to some embodiments, only the electronic spin flips of the bath population are driven. These electronic flips are accomplished with the dipole-allowed transitions, so the forbidden transitions do not need to be driven. According to some implementations the forbidden transitions could also be driven, which would improve $T_2$* (2.8 MHz/Gauss). According to some embodiments, both are driven. A spectrum, such as that shown in FIG. 4B, may be used to identify relevant RF frequencies for spin bath manipulation to decouple the spin bath from the spin center ensemble 100. According to some embodiments, frequencies may also or alternatively be identified via simulation of resonance frequencies, or via a combination of both measurement and simulation. Particular resonance frequencies may vary based on production and/or other conditions, so it is desirable to calibrate the resonance frequencies used for spin bath manipulation for each sample or individual magnetometer. However, generic resonance frequencies may be used to save time, or where sample characterization is impractical.

Once relevant frequencies have been selected, for example, from a spectrum as shown in FIG. 4B, the RF signal generators 458A, 458B, 458C, 458D, 458E, 458F shown in FIG. 4A may be set to provide RF signals at the selected frequencies. Spin bath driving may take the form of pulsed wave or continuous wave (CW) driving. In pulsed spin bath driving, a multi-frequency RF π-pulse may be applied to each of the bath spin resonances midway through the NV Ramsey sequence, decoupling the bath from the NV center spins in analogy to a refocusing π-pulse in a spin echo sequence. Alternatively, the bath spins can be driven continuously (CW). In this case, the Rabi drive strength Shan at each selected bath spin resonance frequency may preferably significantly exceed the characteristic coupling strength $\gamma$ between the bath spins and NV centers, i.e., $\Omega_{Bath}/\gamma \gg 1$, to achieve better decoupling. Under this condition, the baths spins undergo many Rabi oscillations during the characteristic dipolar interaction time $1/\gamma$. As a result, the average dipolar-interaction with the bath is incoherently averaged and the NV spin dephasing time increases. In other words, the many oscillations on a rapid timescale averages out to produce a net-zero (or close to net-zero) effect on the response of the NV centers to measurement (i.e., the time-averaged NV-N dipolar interaction approaches zero). Both methods produce significant improvements over non-driven SQ measurement. Despite the similar improvements in $T_2^*$ achieved using both methods, pulsed driving can reduce heating of the microwave delivery loop and diamond sample—an important consideration for temperature sensitive applications. For this reason, pulsed driving may be preferable in such experiments despite the need for time-consuming $\pi$-pulse calibration across multiple resonances.

Figure 5A:
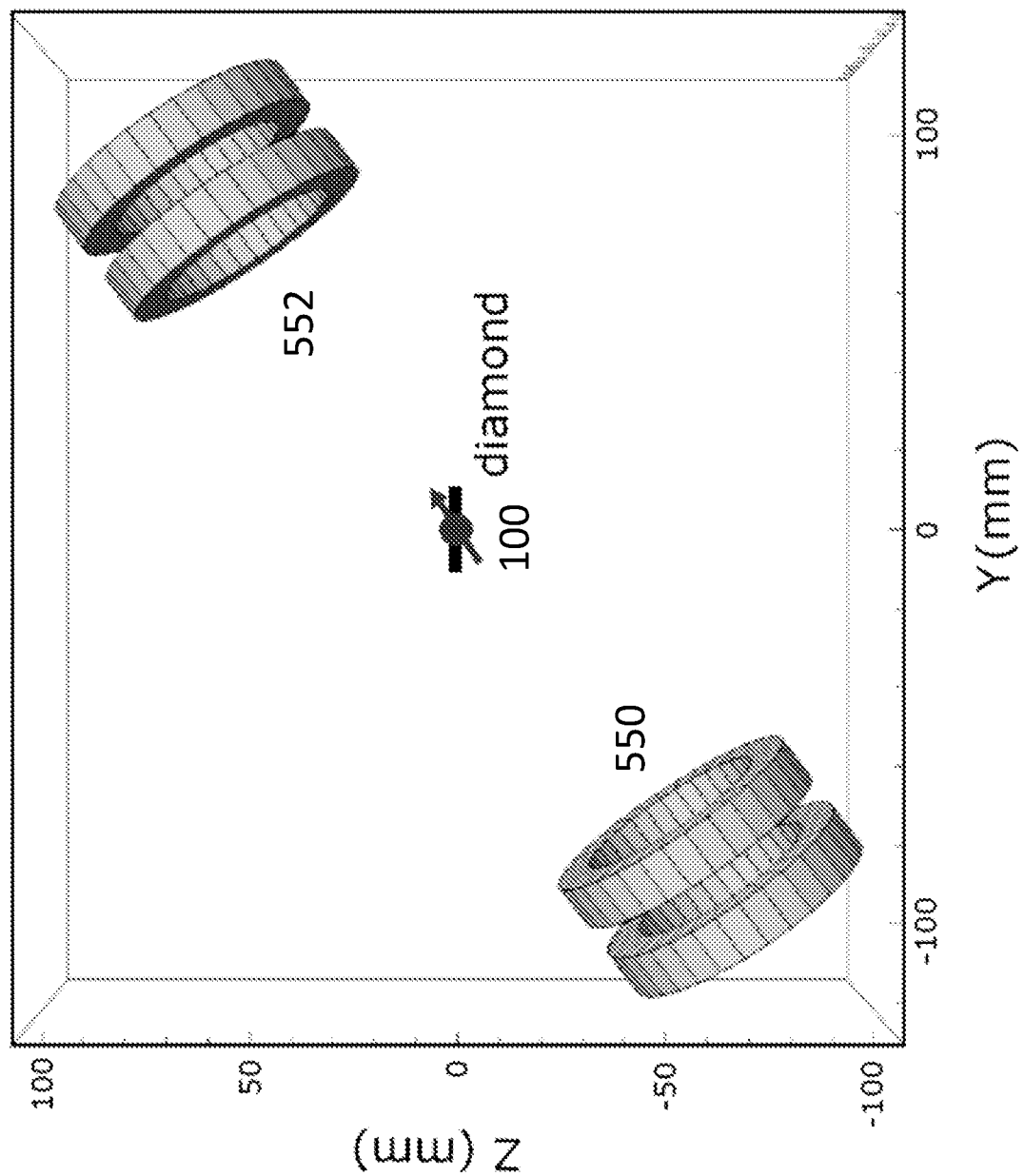
FIGS. 5A-5B are a schematic showing a system for applying a magnetic field and a graph characterizing a magnetic field, according to some embodiments.
Figure 5B:
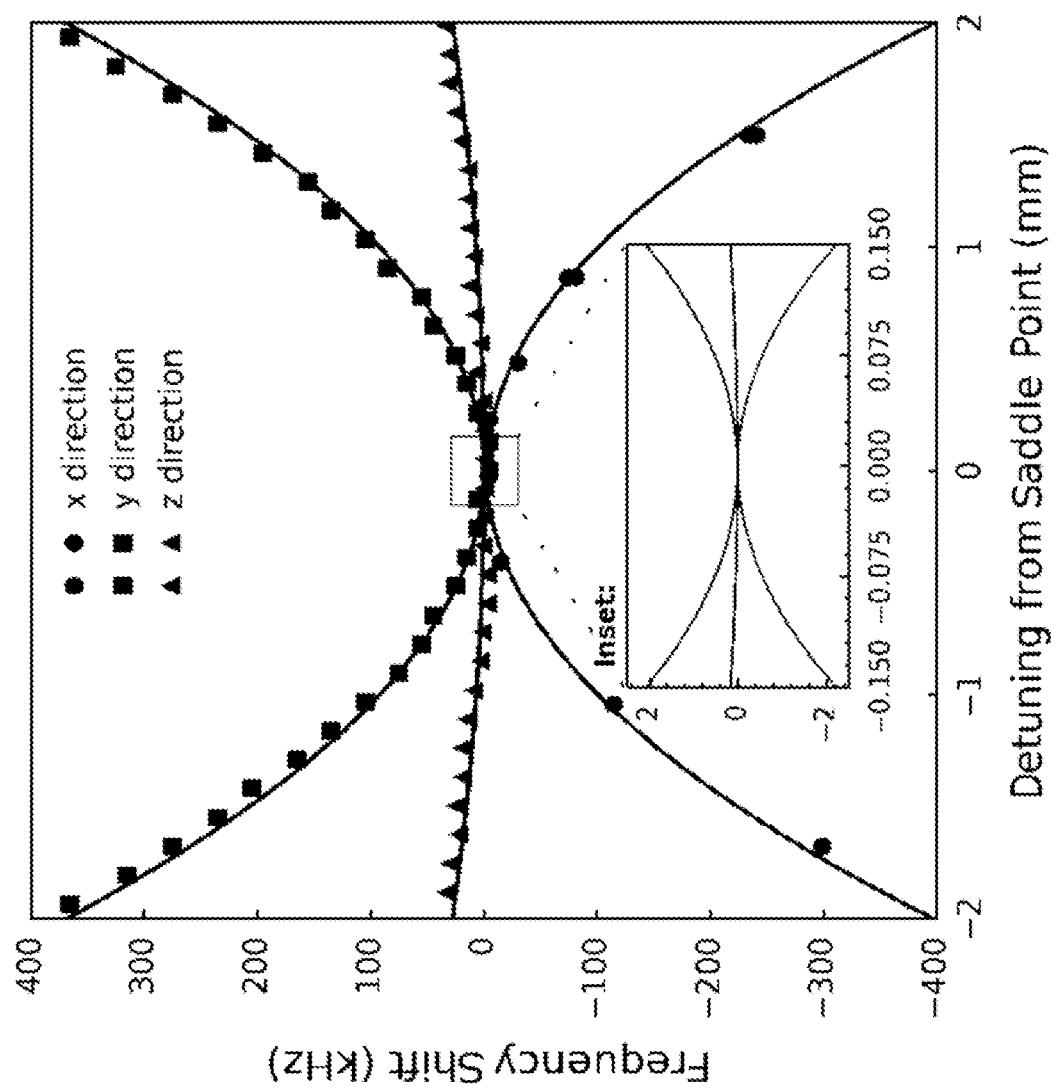

FIGS. 5A-5B show details of a Helmholtz-based system to produce a homogeneous magnetic bias field, according to some embodiments. As shown in FIG. 5A, a bias magnetic field may be supplied to spin center ensemble 100 (here represented as a single diamond NV center) using two-coil magnets 550, 552, such as cobalt ring magnets. Magnets 550, 552 apply an external $B_0$ field along one NV orientation within the diamond crystallographic direction (typically [111], according to some embodiments). FIG. 5B shows simulated frequency shift in kHz as a function of offset (in X, Y, and Z with circular, square, and triangular data points, respectively) from the saddle point of the field produced by magnets 550, 552 in mm. The inset shows a zoomed-in view for length scale typical for an NV fluorescence collection volume, according to some embodiments. While this configuration demonstrates good homogeneity, the slight variations in the magnetic field due to displacement from the saddle point in directions X, Y, and Z does produce a non-negligible reduction in $T_2^*$. According to some embodiments, different configurations are used for magnets to produce the desired bias field.

Figure 6:
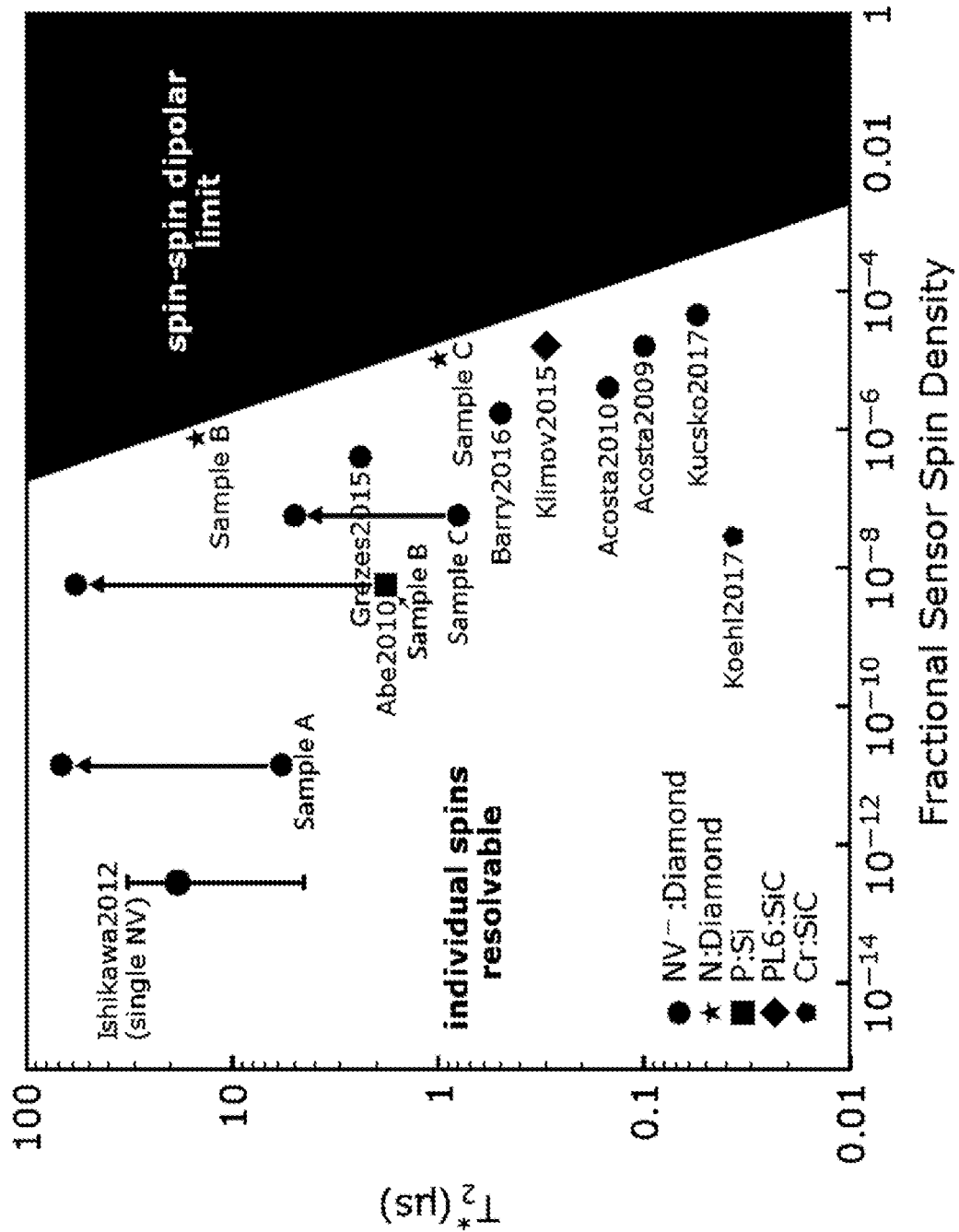
FIG. 6 is a graph representing sensitivities of various sensing techniques, according to some embodiments.

FIG. 6 shows a survey of inhomogeneous dephasing times for electronic solid-state spin center ensembles. The plotted results were obtained from the following publications:

E. Abe, A. M. Tyryshkin, S. Tojo, J. J. L. Morton, W. M. Witzel, A. Fujimoto, J. W. Ager, E. E. Haller, J. Isoya, S. A. Lyon, M. L. W. Thewalt, and K. M. Itoh, "Electron spin coherence of phosphorus donors in silicon: Effect of environmental nuclei," Physical Review B 82, 121201 (2010).

V. M. Acosta, E. Bauch, M. P. Ledbetter, C. Santori, K. M. C. Fu, P. E. Barclay, R. G. Beausoleil, H. Linget, J. F. Roch, F. Treussart, S. Chemerisov, W. Gawlik, and D. Budker, "High nitrogen-vacancy density diamonds for magnetometry applications," Physical Review B—Condensed Matter and Materials Physics 80, 1 (2009), arXiv: 0903.3277.

V. M. Acosta, E. Bauch, M. P. Ledbetter, A. Waxman, L.-S. Bouchard, and D. Budker, Physical Review Letters 104, 070801 (2010), arXiv:0911.3938.

J. F. Barry, M. J. Turner, J. M. Schloss, D. R. Glenn, Y. Song, M. D. Lukin, H. Park, and R. L. Walsworth, "Optical magnetic detection of single-neuron action potentials using quantum defects in diamond," Proceedings of the National Academy of Sciences, 201601513 (2016), arXiv: 1602.01056.

C. Grezes, B. Julsgaard, Y. Kubo, W. L. Ma, M. Stern, A. Bienfait, K. Nakamura, J. Isoya, S. Onoda, T. Ohshima, V. Jacques, D. Vion, D. Esteve, R. B. Liu, K. Molmer, and P. Bertet, "Multi-mode storage and retrieval of microwave fields in a spin ensemble," Physical Review A 92, 020301 (2015), arXiv:1401.7939.

T. Ishikawa, K.-M. C. Fu, C. Santori, V. M. Acosta, R. G. Beausoleil, H. Watanabe, S. Shikata, and K. M. Itoh, "Optical and Spin Coherence Properties of Nitrogen-Vacancy Centers Placed in a 100 nm Thick Isotopically Purified Diamond Layer," Nano Letters 12, 2083 (2012).

P. V. Klimov, A. L. Falk, D. J. Christle, V. V. Dobrovitski, and D. D. Awschalom, "Quantum entanglement at ambient conditions in a macroscopic solid-state spin ensemble," Science Advances 1, e1501015 (2015).

W. F. Koehl, B. Diler, S. J. Whiteley, A. Bourassa, N. T. Son, E. Janz'en, and D. D. Awschalom, "Resonant optical spectroscopy and coherent control of $Cr^{4+}$ spin ensembles in SiC and GaN," Physical Review B 95, 035207 (2017), arXiv: 1608.08255.

G. Kucsko, S. Choi, J. Choi, P. C. Maurer, H. Zhou, R. Landig, H. Sumiya, S. Onoda, J. Isoya, F. Jelezko, E. Demler, N. Y. Yao, and M. D. Lukin, "Critical thermalization of a disordered dipolar spin system in diamond," arXiv preprint (2016), arXiv: 1609.08216.

Experimental results that are discussed in more detail below are compared to that of related spin defect systems (see legend). Inhomogeneous dephasing due to paramagnetic bath spins (e.g., nitrogen and 13C nuclear spins in diamond), strain fields and other effects limit $T_2^*$ ensemble at lower sensor-spin densities $\ll 1$. At higher sensor-spin densities approaching unity, spin-spin interaction places an upper bound on the ensemble dephasing time (black shaded area). This limit to $T_2^*$ is estimated using $\gamma_{e-e}$ and a fractional sensor-spin density of 1 corresponds to approximately $10^{23}$ cm$^{-3}$. The arrows for samples A, B, and C indicate improvement from the bare $T_2^*$ as measured in the NV SQ basis and increase when DQ sensing and spin bath drive (where advantageous) are employed to suppress inhomogeneities. The maximal obtained $T_2^*$ values for Sample A, B and C are multiplied by a factor of two to account for the twice higher gyromagnetic ratio in the NV DQ basis. The region in which individual, single spins are resolvable with confocal microscopy (approximately 200 nm average spin separation) would fill the space bellow approximately $10^{-10}$ fractional spin density. $T_2^*$ values determined for the nitrogen spins (P1 centers) are shown for reference as well (black stars). Measurements by Ishikawa et al. were performed on single NV centers and error bars indicate the spread in measured $T_2^*$ values. As can be seen in FIG. 6, $T_2^*$ measured for samples A, B, and C each approach the limits reached for single NV centers. Furthermore, the methods described herein provide for a sensitive broadband DC sensing. This significantly increases the number of applications in which solid-state spin centers can be used. For example, increased sensitivity provides for more accurate imaging of magnetic fields and/or current using NV spin center ensembles, even in DC situations (or for slow moving AC signals that appear to be DC signals on small enough timescales). Furthermore, increasing $T_2^*$ also decreases the fractional overhead time associated with NV optical initialization and readout, resulting in even greater DC magnetic field sensitivity improvements, an approximately linear sensitivity enhancement, and quicker magnetic field measurements. Finally, diamond material engineering may be used to produce samples with higher conversion efficiency of nitrogen into NV centers or improved collection efficiency of the NV fluorescence.

Exemplary Embodiments

Quantum spin dephasing is caused by inhomogeneous coupling to the environment, with resulting limits to the measurement time and precision of spin-based sensors. The effects of spin dephasing can be especially pernicious for dense ensembles of electronic spins in the solid-state, such as for nitrogen-vacancy (NV) color centers in diamond. Some embodiments employ two complementary techniques, spin bath control and double quantum coherence, to enhance the inhomogeneous spin dephasing time ($T_2^*$) for NV ensembles by more than an order of magnitude. In combination, these quantum control techniques (i) eliminate the effects of the dominant NV spin ensemble dephasing mechanisms, including crystal strain gradients and dipolar interactions with paramagnetic bath spins, and (ii) increase the effective NV gyromagnetic ratio by a factor of two. Applied independently, spin bath control and double quantum coherence elucidate the sources of spin dephasing over a wide range of NV and spin bath concentrations. These results demonstrate the longest reported $T_2^*$ in a solid-state electronic spin ensemble at room temperature.

For NV ensembles, the DC magnetic field sensitivity is typically limited by dephasing of the NV sensor spins. In such instances, spin interactions with an inhomogeneous environment (see FIG. 1) limit the experimental sensing time to the spin dephasing time $T_2^* \lesssim 1$ μs. Hahn echo and dynamical decoupling protocols can restore the NV ensemble phase coherence by isolating the NV sensor spins from environmental noise and, in principle, permit sensing times approaching the spin lattice relaxation ($T_1 \sim m_s$). However, these protocols restrict sensing to AC signals within a narrow bandwidth. For this reason, the development of high sensitivity, broadband magnetometers require new approaches to extend $T_2^*$ while retaining the ability to measure DC signals.

Several mechanisms contribute to NV spin ensemble dephasing in bulk diamond. In particular, the formation of negatively-charged $NV^-$ centers (S=1, where S is the electronic spin) requires the incorporation of nitrogen into the diamond lattice. As a result, paramagnetic substitutional nitrogen impurities (P1 centers, S=½) typically persist at densities similar to or exceeding the NV concentration, leading to a 'spin bath' that couples to the NV spins via incoherent dipolar interactions. In addition, can affect the diamond crystal and the zero-magnetic-field splitting between NV spin states. The exact contribution of strain gradients to NV spin dephasing has not been quantified rigorously because strain varies throughout and between samples. Furthermore, the interrogation of spatially large NV ensembles requires the design of uniform magnetic bias fields to minimize magnetic field gradients across the detection volume.

According to some embodiments, a system may combine double quantum (DQ) coherence magnetometry with spin bath control to mitigate the dominant sources of NV spin ensemble dephasing and thereby extend $T_2^*$. DQ magnetometry employs the $\{-1, +1\}$ sub-basis of the NV spin-1 system for quantum sensing. In this basis, noise sources that shift the $|\pm 1\rangle$ states in common mode (e.g., strain inhomogeneities and temperature fluctuations) are suppressed by probing the energy difference between the $|+1\rangle$ and $|-1\rangle$ spin states. In addition, the NV DQ spin coherence accumulates phase due to an external magnetic field at twice the rate traditional single quantum (SQ) coherence magnetometry, for which the $|0\rangle$ and $|+1\rangle$ (or $|-1\rangle$) spin states are probed. DQ magnetometry provides enhanced susceptibility to target magnetic field signals while also making the spin coherence twice as sensitive to magnetic noise, including interactions with the paramagnetic spin bath. Therefore, a system may use resonant radiofrequency control to decouple the bath spins from the NV sensors. By employing both DQ magnetometry and spin bath control, the dominant sources of NV spin ensemble dephasing may be studied and significantly reduced, realizing up to a 16× extension of the ensemble $T_2^*$ in diamond. These techniques are also compatible with Ramsey-based DC sensing, and we find up to an 8× improvement in DC magnetic field sensitivity. These techniques enable broadband DC sensing using NV spin ensembles with spin interrogation times approaching those used in AC sensing; and may aid in the fabrication of optimized samples for a wide range of solid-state sensor species.

Double Quantum Magnetometry

Figure 7:
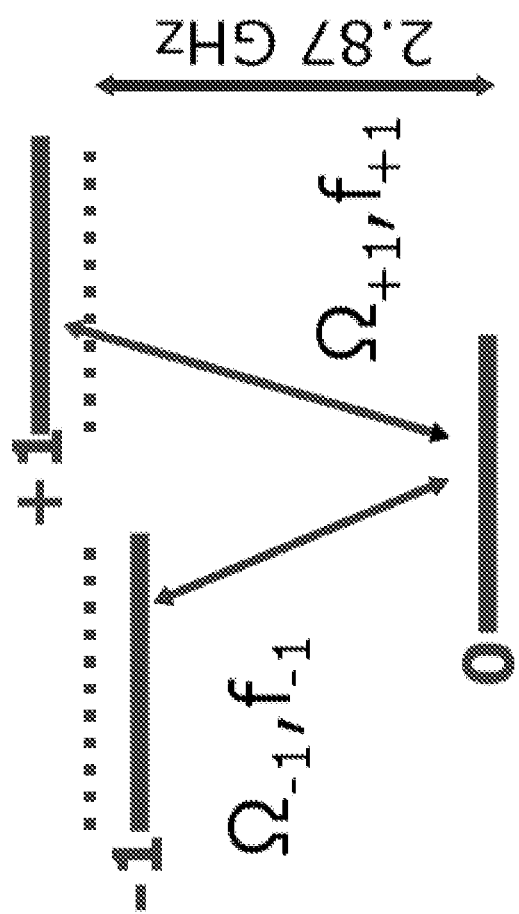
FIG. 7 shows the spin-1 ground state of the NV center, according to an embodiment.

The enhanced sensitivity to magnetic fields and insensitivity to common-mode noise sources in this DQ basis can be understood by considering the full ground-state Hamiltonian for NV centers, given by (neglecting the hyperfine interaction), $$H/h = DS_z^2 + \frac{\gamma_{NV}}{2} B \cdot S + M_Z S_z^2 + M_x(S_y^2 - S_x^2) + M_y(S_x S_y + S_y S_x), \quad (1)$$

where D≈2.87 GHz is the zero-field spin-state splitting, $S=\{S_x, S_y, S_z\}$ are the dimensionless spin-1 operators, $B=\{B_x, B_y, B_z\}$ are the local magnetic field components, $\gamma_{NV}/2\pi \approx 28$ GHz/T is the NV gyromagnetic ratio, and $\{M_x, M_y, M_z\}$ describe the strain and electric field contributions to $\underline{H}$. Ignoring terms $\propto S_x$, $S_y$ due to the large zero-field splitting D and a small applied bias $B_z \lesssim 10$ mT along z, the transition frequencies f±1 (see FIG. 7) are $$f \pm 1 \approx D_z \pm \frac{\gamma_{NV}}{2\pi} B_z \quad (2)$$

On-axis strain contributions ($\propto M_z$) as well as temperature fluctuations $$\left(\frac{\partial D}{\partial T} = -74 \text{ kHz/K}\right)$$

shift the f±1 transitions linearly. Thus, when performing DQ magnetometry where the difference $\Delta f = f+1 - f-1$ is probed, their effects are to first order suppressed. In addition, a perturbative analysis of the complete Hamiltonian in Eqn. 1 shows that the effects ($\propto M_x$, $M_y$) on DQ magnetometry are reduced by a factor $$\frac{\sqrt{M_x^2 + M_y^2}}{\gamma_{NV} B_z/\pi},$$

proportional to the bias magnetic field $B_z$. Similarly, the effects of off-axis magnetic fields ($\propto B_x$, $B_y$) on DQ magnetometry are suppressed due to the large zero-field splitting D and are also largely common-mode. Working in the DQ basis at moderate bias fields can therefore lead to an enhancement in $T_2^*$ for NV ensembles if strain inhomogeneities, small off-axis magnetic field gradients (Bx, By<<D), or temperature fluctuations are significant mechanisms of inhomogeneous spin dephasing. This result can be contrasted with single NV measurements in which $T_2^*$ and $T_2$ in the DQ basis were found to be approximately half the values in the SQ basis, i.e. $\tau_{DQ}^{coh} \approx \tau_{SQ}^{coh}/2$. Since spatial inhomogeneities are not relevant for single centers, the reduced decay times are attributed to an increased sensitivity to magnetic noise in the DQ basis due to the paramagnetic spin bath.

Figure 8:
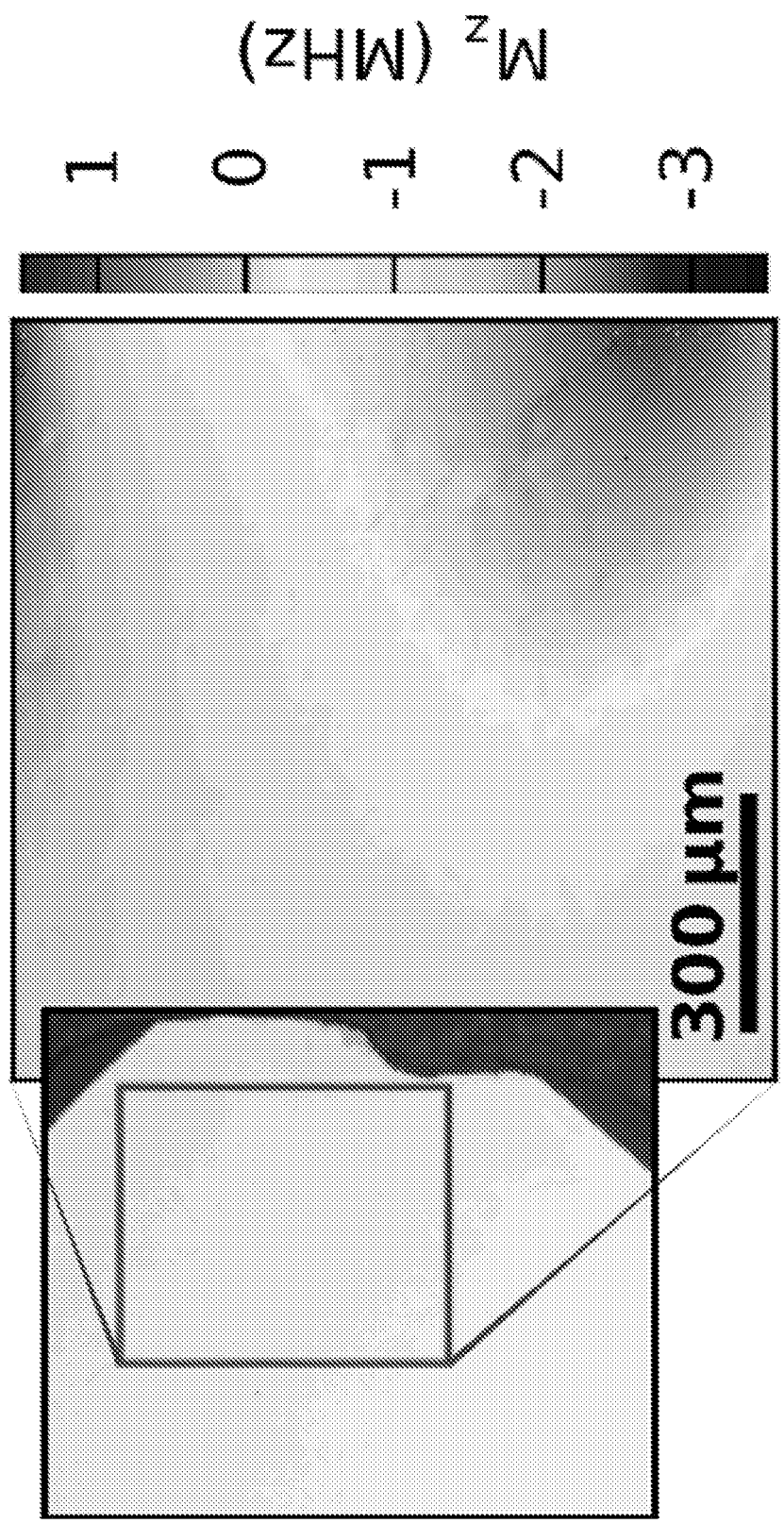
FIG. 8 shows an image of the longitudinal strain component $M_z$ of one NV orientation class across a 1-mm$^2$ field of view for Sample B, according to some embodiments.

For example, using vector magnetic microscopy (VMM), the on-axis strain component $M_z$ in a 1 mm²-region can be mapped for one of the three NV ensemble diamond examples ([N]=0.75 ppm, Sample B, discussed in more detail below) to quantify the length-scale and magnitude of strain inhomogeneity (FIG. 8). From this analysis, an average strain gradient $M_z/L \approx 2.8$ kHz/μm is estimated, which, as shown below, is in good agreement with the observed SQ $T_2^*$ in the exemplary samples.

Spin Bath Control

Figure 9:
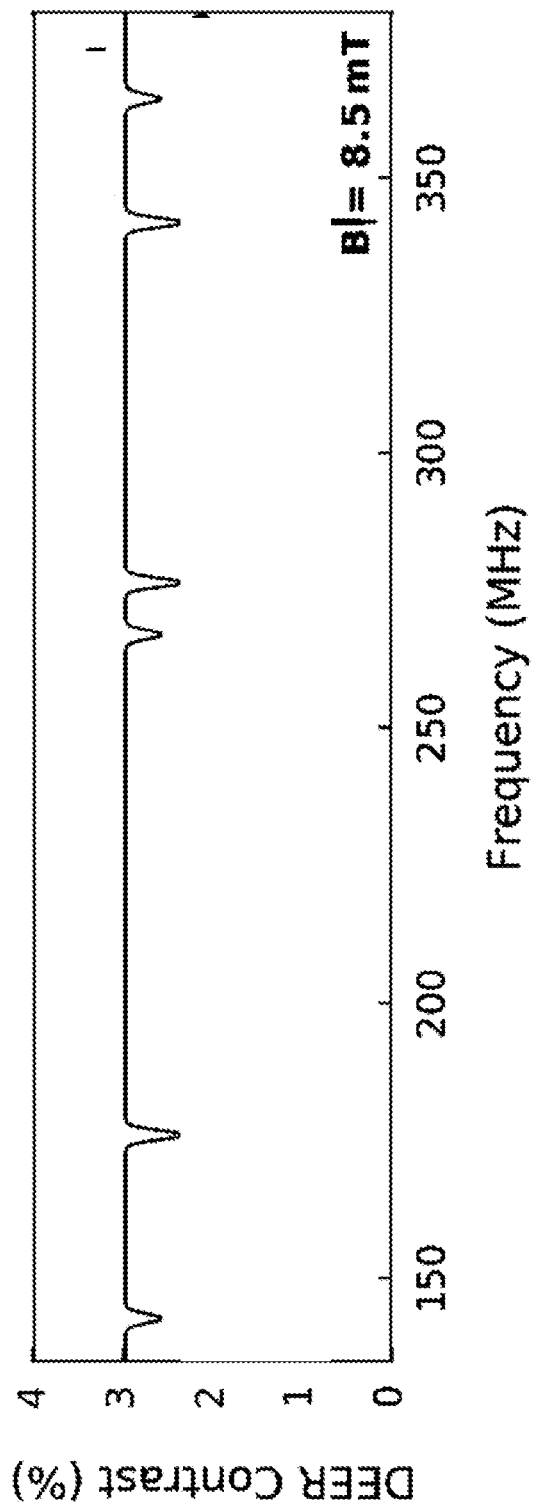
FIG. 9 shows a NV double electron-electron resonance (DEER) spectrum of Sample B, according to some embodiments.

To mitigate NV spin dephasing due to the spin bath, the bath electronic spins may be driven using resonant radiofrequency (RF) radiation. FIGS. 4B and 9, displays the spin resonance spectrum of a nitrogen-rich diamond sample ([N]=0.75 ppm, Sample B), recorded via the NV double electron-electron resonance (DEER) technique in the frequency range 100-500 MHz (see NV and nitrogen spin resonance linewidth measurements) and simulated results for the same, respectively. The data reveal 6 distinct spectral peaks attributed to ¹⁴N substitutional defects in the diamond lattice. The resonance peaks have an approximate amplitude ratio of 1:3:1:3:3:1 resulting from the four crystallographic Jahn-Teller orientations of the nitrogen defects at two possible angles with respect to an applied bias magnetic field ($B_z$=8.5 mT, aligned along the [111]-axis), as well as 3 hyperfine states (see ¹⁴N and ¹⁵N double electron-electron resonance spectra). Additional smaller peaks discussed above with reference to FIG. 4B may be attributed to dipole-forbidden nitrogen spin transitions and other electronic dark spins.

In pulsed spin bath driving, a multi-frequency RF π-pulse may be applied to each of the bath spin resonances midway through the NV Ramsey sequence, decoupling the bath from the NV sensor spins in analogy to a refocusing π-pulse in a spin echo sequence. Alternatively, the bath spins can be driven continuously (CW). In this case, the Rabi drive strength $\Omega_{Bath}$ at each bath spin resonance frequency should significantly exceed the characteristic coupling strength $\gamma$ between the bath spins and NV centers, i.e., $\Omega_{Bath}/\gamma \gg 1$, to achieve effective decoupling. Under this condition, the baths spins undergo many Rabi oscillations during the characteristic dipolar interaction time $1/\gamma$. As a result, the average dipolar-interaction with the bath is incoherently averaged and the NV spin dephasing time increases.

Results

According to three exemplary embodiments, three diamond samples with varying nitrogen concentrations are discussed herein (see FIG. 10). Samples A ([N]≲0.05 ppm) and B ([N]=0.75 ppm) each consist of a ¹⁴N-doped, 100 μm-thick chemical-vapor-deposition (CVD) layer (99.99% ¹²C) deposited on top of a diamond substrate. Sample C ([N]=10 ppm) possesses a 40 μm-thick, ¹⁵N-doped CVD layer (99.95% ¹²C) on a diamond substrate. For all three samples, the nitrogen-limited NV dephasing times can be estimated from the average dipolar interaction strength between electronic spins (see methods and materials, below) giving $T_{2NV-N}^* \approx 350$ μs, 23 μs, and 2 μs for Samples A, B, and C, respectively. The ¹³C nuclear spin bath limit is estimated at $T_2^*$ is ≈100 μs for Samples A and B, and ≈20 μs for Sample C (see methods and materials, below). According to some embodiments, samples may be unirradiated and the N-to-NV conversion efficiency is ≲1%. Contributions from NV-NV dipolar interactions to $T_2^*$ can therefore be neglected.

Figure 11A:
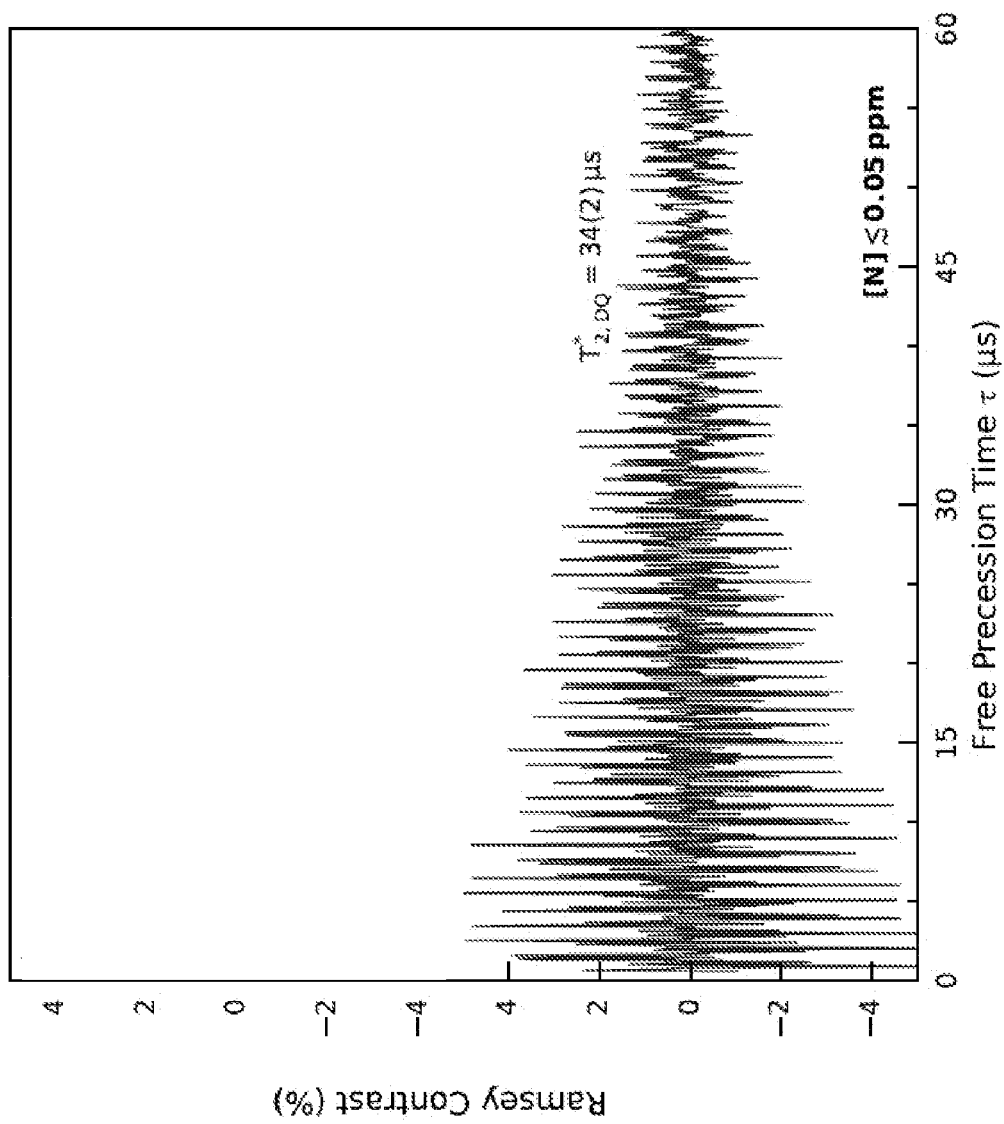
FIGS. 11A-11C show example Ramsey measurements of Sample A, according to some embodiments.
Figure 11B:
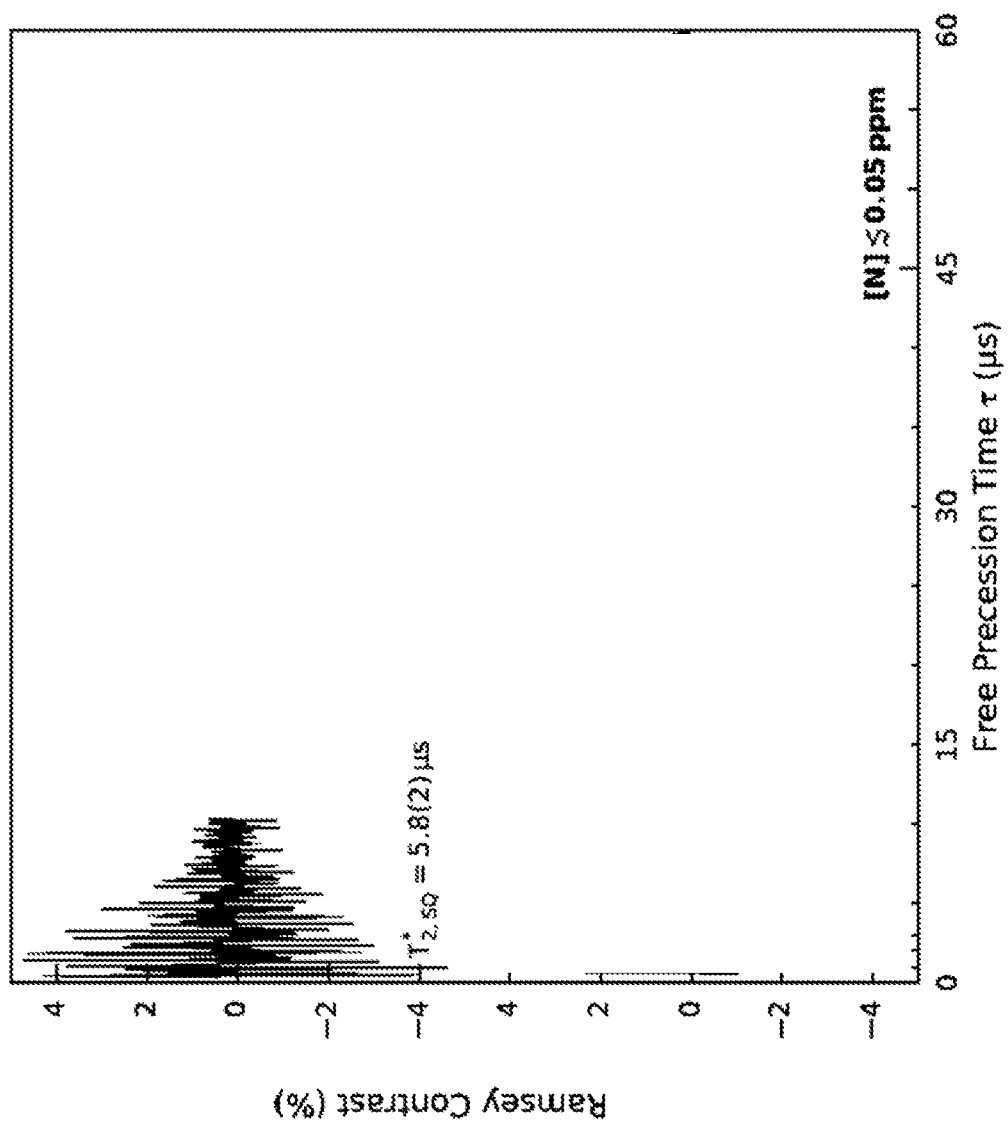
Figure 11C:
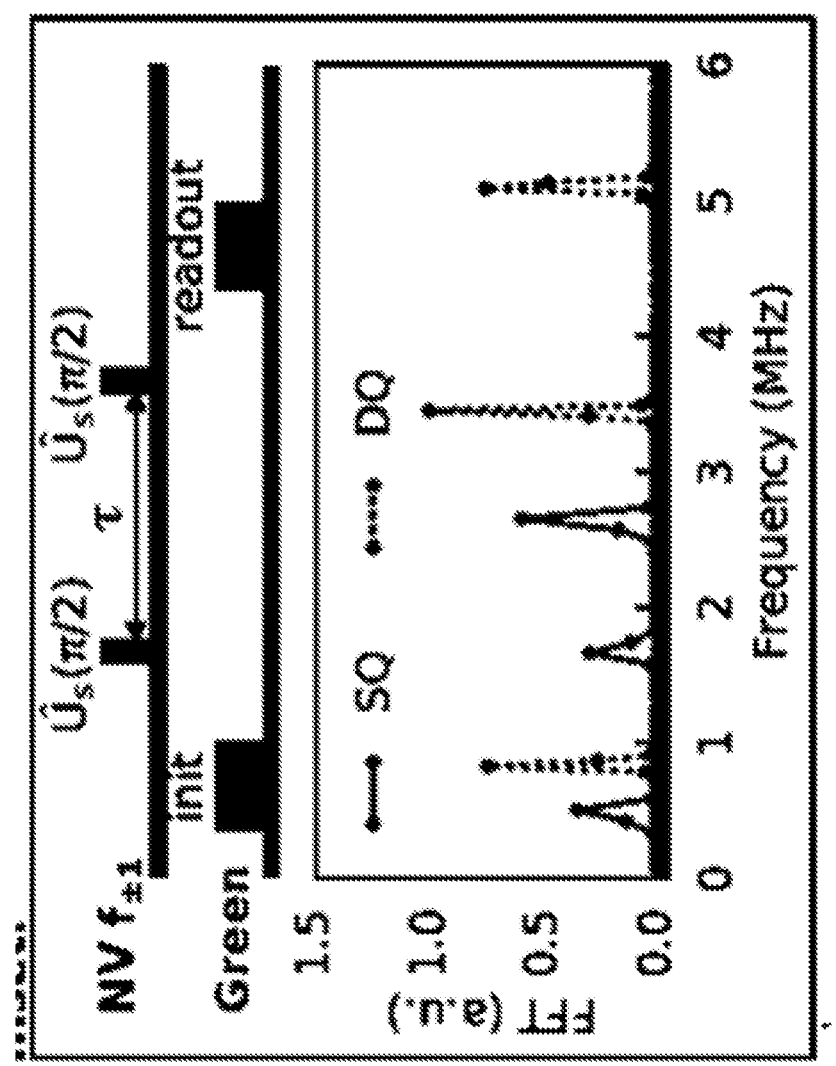

$T_2^*$ values were measured in the SQ and DQ bases, denoted $T_{2,SQ}^*$ and $T_{2,DQ}^*$ from here on, by performing a single- or two-tone π/2-τ-π/2 Ramsey sequence, respectively (FIG. 11C). In both instances, the observed Ramsey signal exhibits a characteristic stretched exponential decay envelope that is modulated by the frequency detunings of the applied NV drive(s) from the NV hyperfine transitions. The data may be fit to the expression $C_0 \exp[-(\tau/T_2)p]\Sigma_i \cos(2\pi f_i(\tau - \tau_{0,i}))$, where the free parameters in the fit are the maximal contrast $C_0$ at τ=0, dephasing time $T_2^*$, stretched exponential parameter p, time-offsets $\tau_{0,i}$, and (up to) three frequencies $f_i$ from the NV hyperfine splittings. The p value provides a phenomenological description of the decay envelope, which depends on the specific noise sources in the spin bath as well as the distribution of individual resonance lines within the NV ensemble. For a purely magnetic-noise-limited spin bath, the NV ensemble decay envelope exhibits simple exponential decay (p=1); whereas Gaussian-type decay (p≈2) suggests magnetic and/or strain gradient-limited NV spin ensemble dephasing.

Strain-Dominated Dephasing (Sample A: Low Nitrogen Density Regime)

Experiments on Sample A ([N]≲0.05 ppm, ¹⁴N) probed the low nitrogen density regime. In different regions of this diamond, the measured SQ Ramsey dephasing time varies between $T_{2,SQ}^* \approx 5$-12 μs, with 1<p<2. Even the longest measured $T_{2,SQ}^*$ is ~30× shorter than the calculated $T_{2,NV-N}^*$ given by the nitrogen concentration of the sample (≳350 μs, see FIG. 10) and 10× smaller than the expected SQ limit due to 0.01% ¹³C spins (≈100 μs). This discrepancy indicates that dipolar broadening due to paramagnetic spins is not the dominant NV dephasing mechanism. Indeed, the spatial variation in $T_{2,SQ}^*$ and low concentration of nitrogen and ¹³C spins indicates that crystal lattice strain inhomogeneity is the main source of NV spin ensemble dephasing in this sample. For the measured NV ensemble volume (~10⁴ μm³) and the reference strain gradient (FIG. 8), a strain gradient limited dephasing time may be estimated to be ~6 μs, in reasonable agreement with the observed $T_{2,SQ}^*$.

Measurements in the DQ basis at moderate bias magnetic fields are to first order strain-insensitive, and therefore provide a means to eliminate the contribution of strain to NV spin ensemble dephasing. FIGS. 11B and 11A show data for $T_2^*$ in both the SQ and DQ bases for an example region of Sample A with SQ dephasing time $T_{2,SQ}^*$=5.8(2) μs and p=1.7(2), respectively. For these measurements, a small 2.2 mT bias field was applied parallel to one NV axis (misalignment angle <3°) to lift the |±1⟩ degeneracy and optimized the magnet geometry to reduce magnetic field gradients over the sensing volume (see Magnetic field gradient contribution to $T_2^*$). In the DQ basis, $T_{2,DQ}^*$=34(2) μs with p=1.0(1), which is a 6× improvement over the measured $T_2^*$ in the SQ basis. Similar $T_2^*$ improvements in the DQ basis are identified in other regions of this diamond. These results indicate that in the low nitrogen density regime, dipolar interactions with the ¹³C nuclear spin bath are the primary decoherence mechanism when DQ basis measurements are employed to remove strain and temperature effects. Specifically, the measured $T_{2,DQ}^*$ and p values in Sample A are consistent with the combined effect of NV dipolar interactions with (i) the 0.01% concentration of ¹³C nuclear spins ($T_{2,N-13C}^*/$ 2≃50 μs) and (ii) residual nitrogen spins [N]~0.05 ppm; with an estimated net effect of $T_{2,DQ}^* \simeq 39$ μs. Diamond samples with greater isotopic purity ($^{12}$C>99.99%) will yield further enhancements in $T_{2,DQ}^*$.

Strain- and Dipolar-Dominated Dephasing (Sample B: Intermediate Nitrogen Density Regime)

1 Although Sample B ([N]=0.75 ppm, $^{14}$N) contains more than an order of magnitude higher nitrogen spin concentration than Sample A ([N]≲0.05 ppm), SQ Ramsey dephasing times were $T_{2,SQ}^* \simeq 1$-10 μs in different regions of Sample B, which are similar to the results from Sample A. Strain inhomogeneities are also a significant contributor to NV spin ensemble dephasing in Sample B. Comparative measurements of $T_2^*$ in both the SQ and DQ bases yield a more moderate increase in $T_{2,DQ}^*$ for Sample B than for Sample A. Example Ramsey measurements of Sample B are displayed in FIGS. 12B and 12A, respectively, showing $T_{2,SQ}^*$=1.80(6) μs in the SQ basis increasing to $T_{2,DQ}^*$=6.9(5) μs in the DQ basis, a ~4× extension. The observed $T_{2,DQ}^*$ in Sample B approaches the expected limit set by dipolar coupling of NV spins to residual nitrogen spins in the diamond ($T_{2,N-NV}^*/2 \simeq 12$ μs), but is still well below the expected DQ limit due to 0.01% $^{13}$C nuclear spins (≃50 μs).

According to some embodiments, measuring NV Ramsey decay in both the SQ and DQ bases while driving the nitrogen spins, either via application of CW or pulsed RF fields, is effective in revealing the electronic spin bath contribution to NV ensemble dephasing. With continuous drive fields of Rabi frequency $\Omega_N$=2 MHz applied to nitrogen spin resonances 1-6, i, and ii (see FIG. 4D), $T_{2,SQ+Drive}^*$=1.9(6) μs, which only marginally exceeds $T_{2,SQ}^*$=1.80(6) μs. This result is consistent with NV ensemble SQ dephasing being dominated by strain gradients in Sample B, rendering spin bath control ineffective in the SQ basis. In contrast, DQ Ramsey measurements exhibit a significant additional increase in $T_2^*$ when the bath drive is applied, improving from $T_{2,DQ}^*$=6.9(5) μs to $T_{2,DQ+Drive}^*$=29.2(7) μs. This ~16 improvement over $T_{2,SQ}^*$ confirms that, for Sample B without spin bath drive, dipolar interactions with the nitrogen spin bath are the dominant mechanism of NV spin ensemble dephasing in the DQ basis. Note that the NV dephasing time for Sample B with DQ+spin bath drive is only slightly below that for Sample A with DQ alone (≈34 μs). This $T_2^*$ limit in Sample B may be attributed primarily to NV dipolar interactions with 0.01% $^{13}$C nuclear spins. There is also an additional small contribution from magnetic field gradients over the detection volume (~10$^4$ μm$^3$) due to the four times larger applied bias field (B$_0$=8.5 mT), relative to Sample A, which was used in Sample B to resolve the nitrogen ESR spectral features. Similar extensions of $T_2^*$ may be obtained by using pulsed driving of the nitrogen bath spins (see Continuous versus pulsed spin bath driving).

Figure 13C:
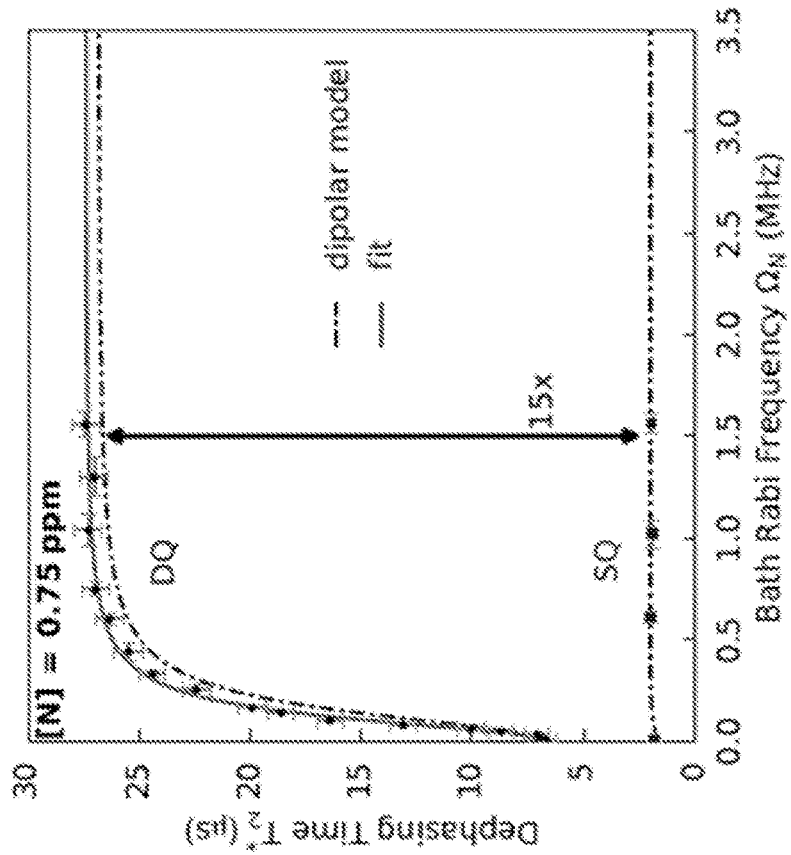
FIGS. 13A-13D show graphs characterizing the application of quantum control techniques to extend NV spin ensemble dephasing time ($T_2^*$) and increase DC magnetic field sensitivity, according to some embodiments.
Figure 13A:
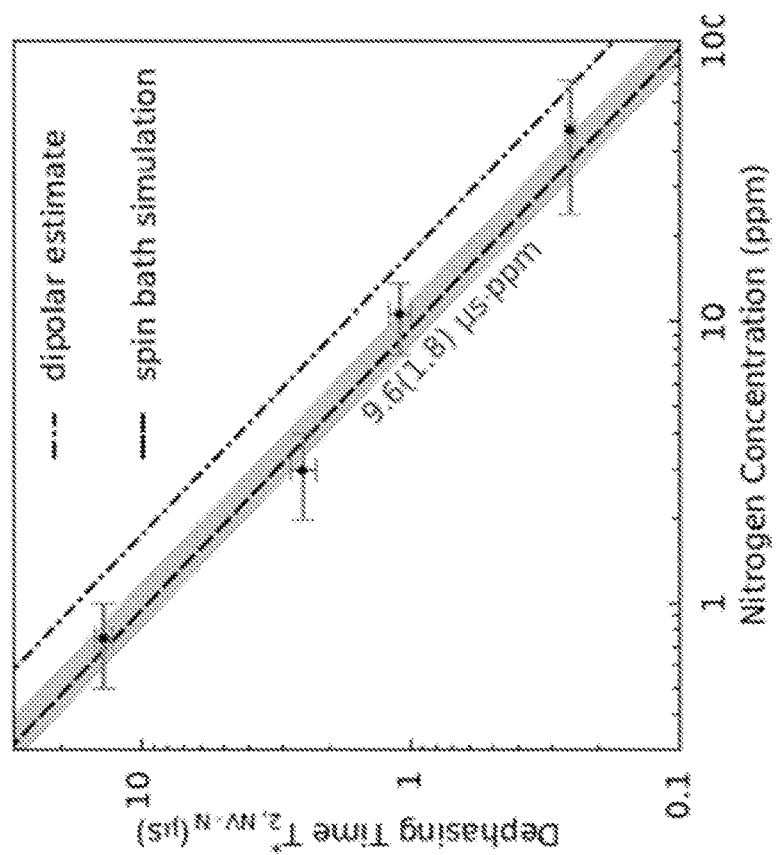

The efficacy of CW spin bath driving for increasing $T_2^*$ was characterized in both the SQ and DQ bases (see FIG. 13A). While $T_{2,SQ}^*$ remains approximately constant with varying Rabi drive frequency $\Omega_N$, $T_{2,DQ}^*$ exhibits an initial rapid increase and saturates at $T_{2,DQ}^* \approx 27$ μs for $\Omega_N \gtrsim 1$ MHz (only resonances 1-6 are driven here). To explain the observed trend, a model is introduced that distinguishes between (i) NV spin ensemble dephasing due to nitrogen bath spins, which depends upon bath drive strength $\Omega_N$, and (ii) dephasing from drive-independent sources (including strain and $^{13}$C spins):

$$1/T_2^* = 1/T_{2,NV-N}^*(\Omega N) + 1/T_{2,other}^*. \tag{3}$$

Taking the coherent dynamics of the bath drive into account, the data is well described by the functional form (see methods below):

$$1/T_{2,NV-N}^*(\Omega_N) = \Delta m \times \gamma_{NV-N} \frac{\delta_N^2}{\delta_\pi^2 + \Omega_N^2}, \tag{4}$$

where $\Delta m$=1(2) is the change in spin quantum number in the SQ (DQ) basis and $\delta_N = \gamma_N/2\pi$ is the Lorentzian linewidth (half width at half max) of the nitrogen spin resonances measured through DEER ESR (FIG. 4B). Although NV and nitrogen spins have comparable $T_2^*$ ($\gamma_{NV-N} \approx \gamma_N$, see NV and nitrogen spin resonance linewidth measurements), the effective linewidth $\delta_N$ relevant for bath driving is increased due to imperfect overlap of the nitrogen spin resonances caused by a small misalignment angle of the applied bias magnetic field. Using the NV-N dipolar estimate for Sample B, $\gamma_{NV-N} \approx 2\pi$ 7 kHz, $\delta_N \approx 80$ kHz extracted from DEER measurements (NV and nitrogen spin resonance linewidth measurements), and a saturation value of $T_{2,other}^* \approx 27$ μs, Eqns. 3 and 4 may be combined and the calculated $T_2^*$ plotted as a function of $\Omega N$ in FIG. 13A (dashed line). The good agreement between the model and the data in the DQ basis suggests that Eqns. 3 and 4 capture the dependence of $T_2^*$ on drive field magnitude (i.e., Rabi frequency). Alternatively, the model may be fit to the DQ data (solid line) and extract $\gamma Nv$-$N^{fit}$=2π×9.3(2) kHz and $\delta_N^{fit}$=60(3) kHz, in reasonable agreement with estimated parameters. In summary, the NV-N Sample B show that the N of spin bath driving and sensing in the DQ basis suppresses results from combination inhomogeneous NV ensemble dephasing due to both interactions with the nitrogen spin bath and strain-gradients. Similar to Sample A, further enhancement in $T_2^*$ can be achieved with improved isotopic purity, as well as reduced magnetic-gradients due to the applied magnetic bias field.

Dipolar-Dominated Dephasing (Sample C: High Nitrogen Density Regime)

Figure 12A:
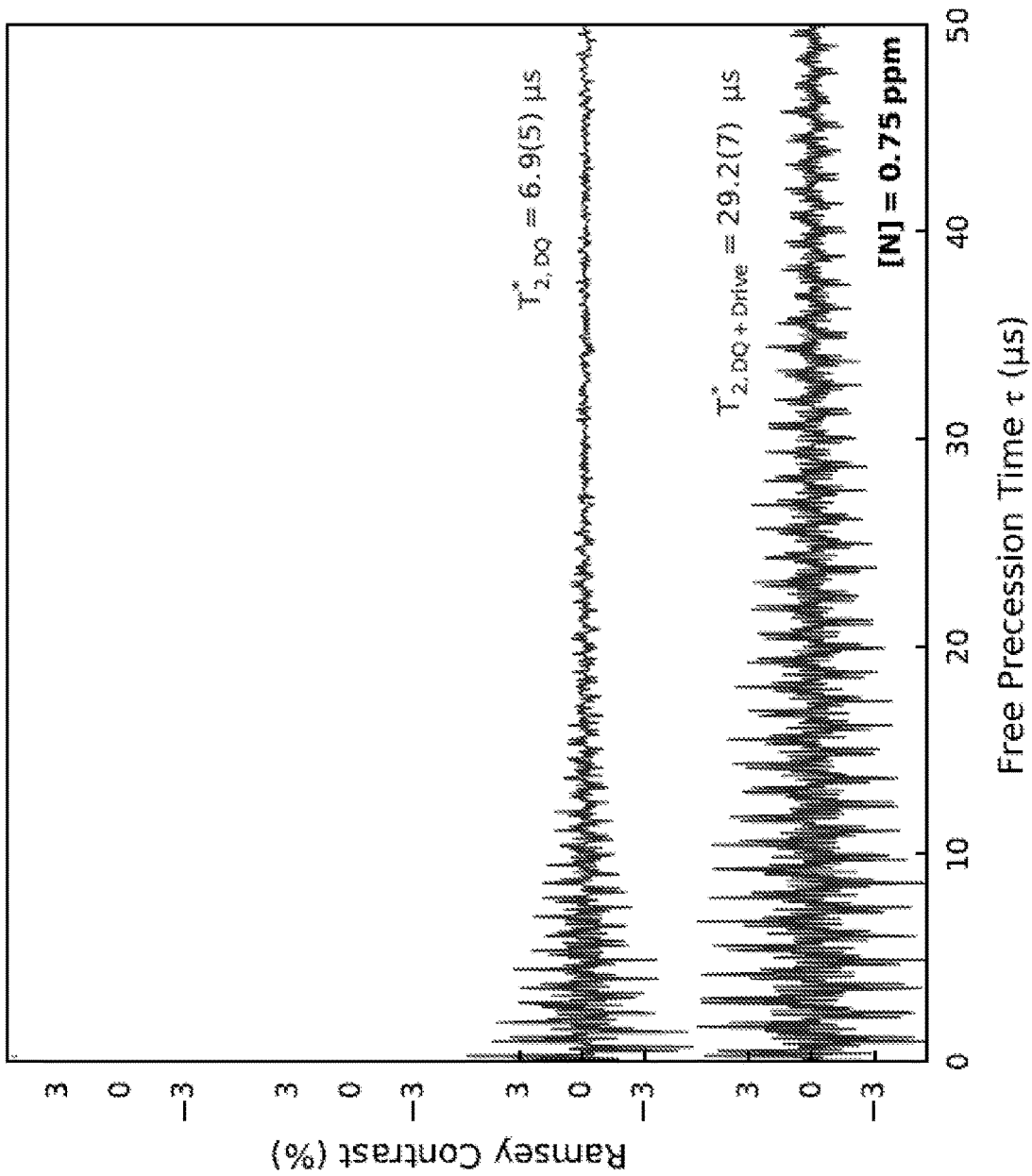
FIGS. 12A-12C show example Ramsey measurements of Sample B, according to some embodiments.
Figure 12B:
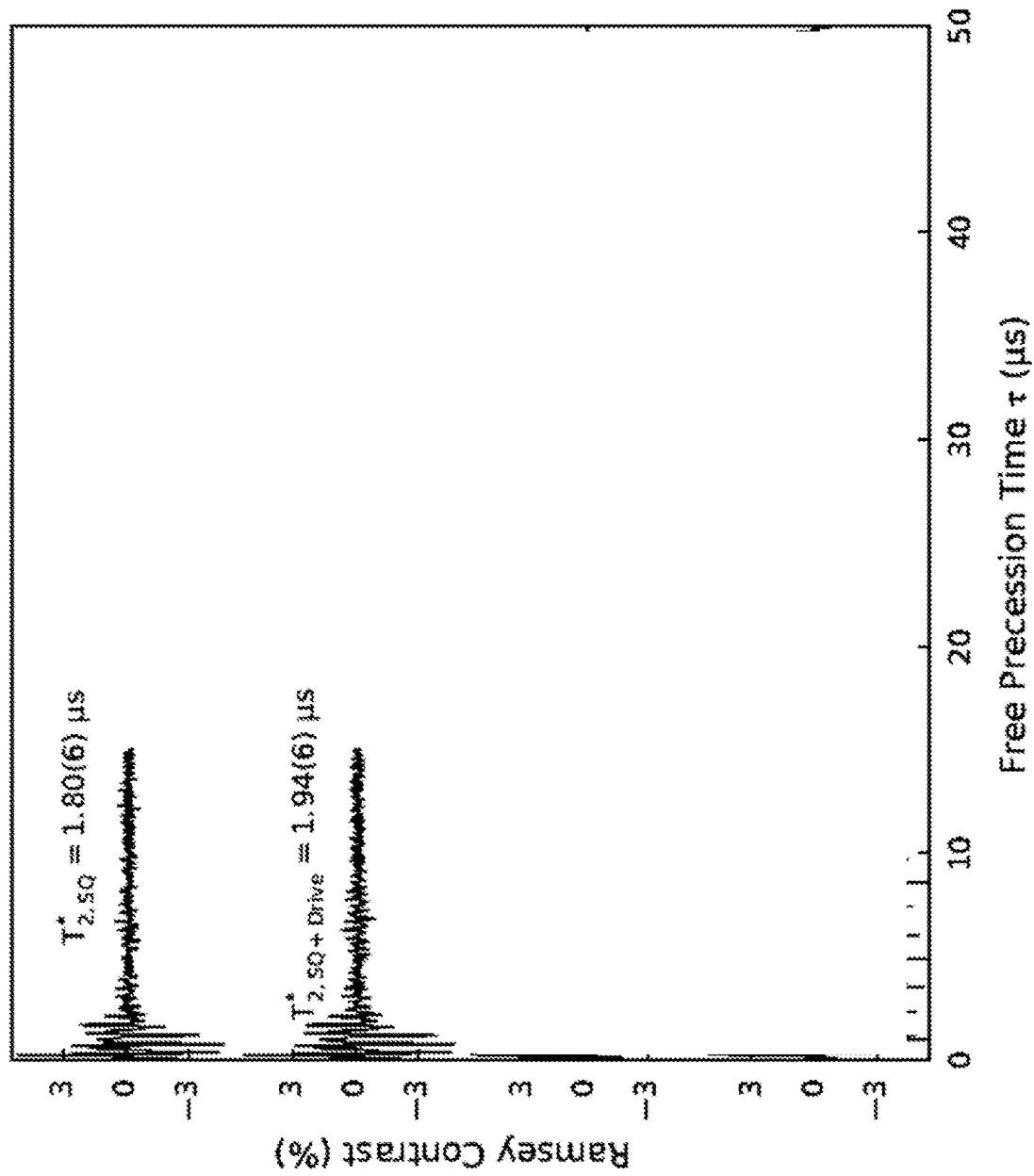
Figure 13D:
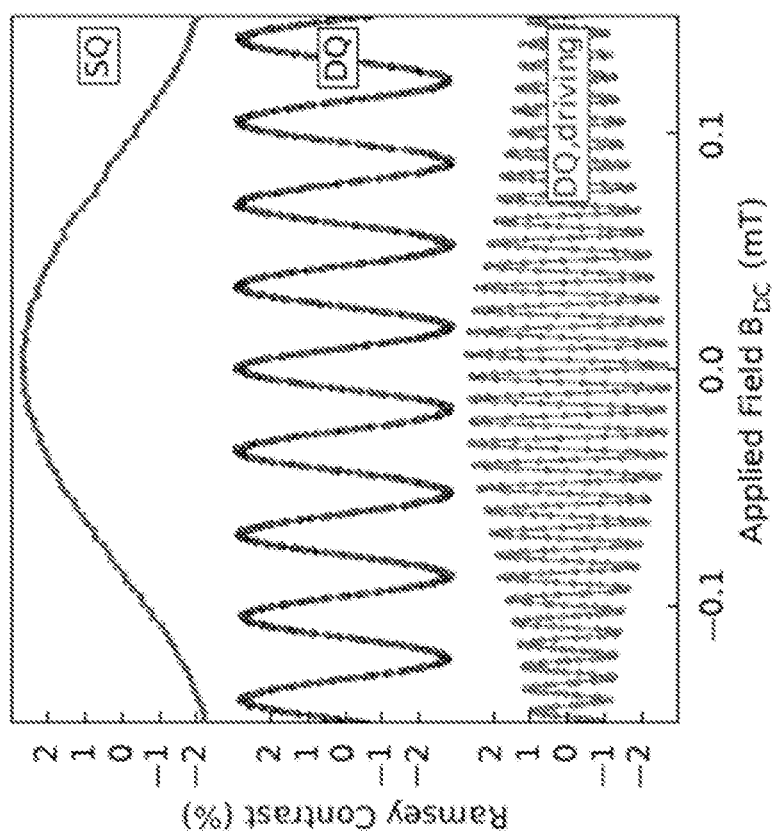
Figure 13B:
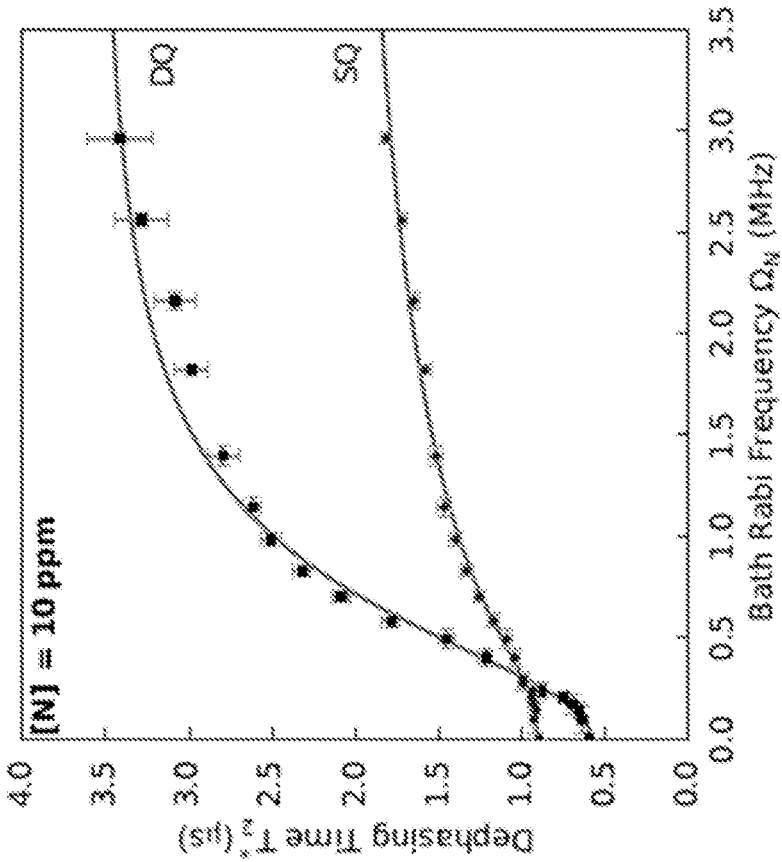
Figure 14:
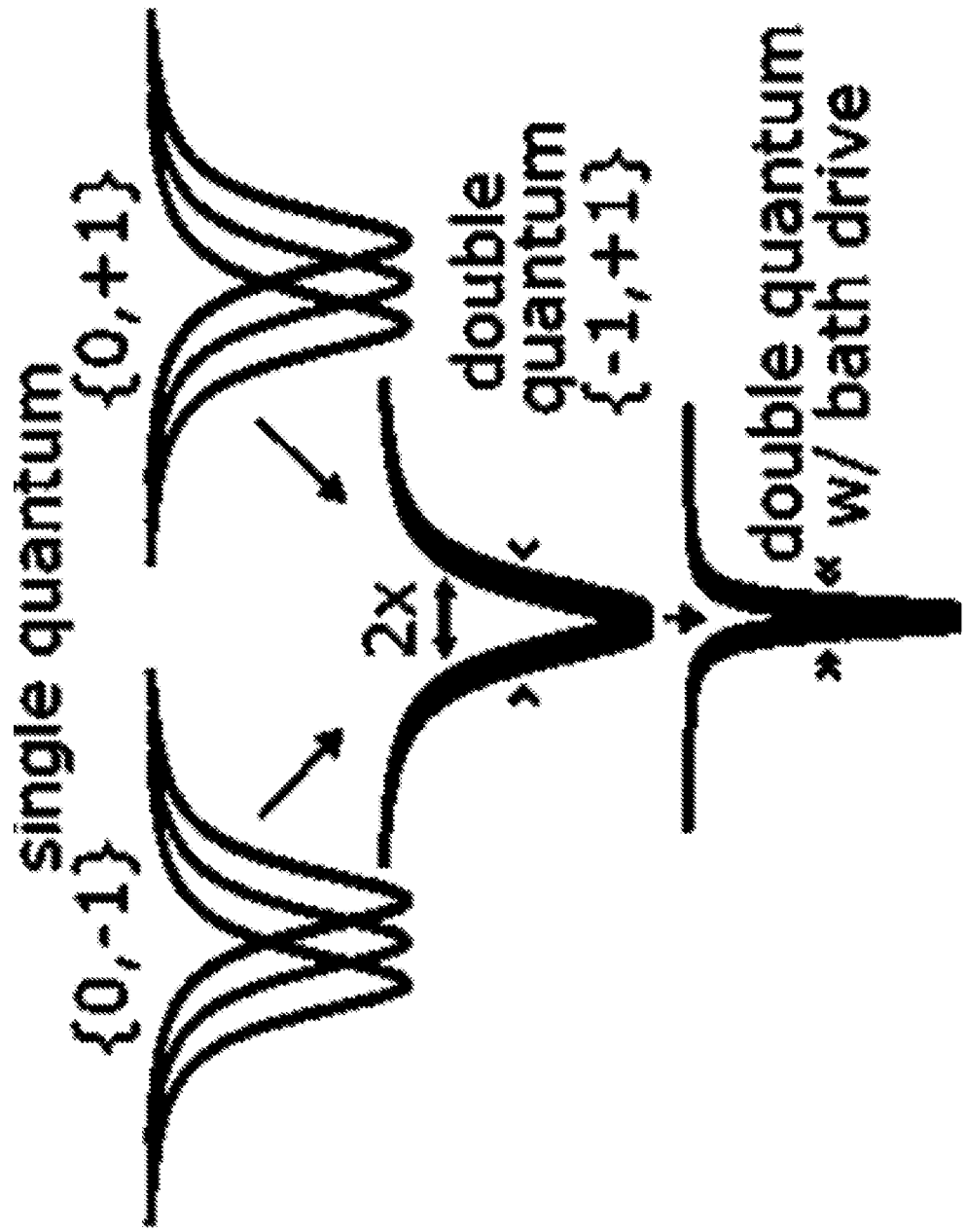
FIG. 14 shows schematics of NV ensemble ESR spectra in the single quantum and double quantum bases, and for double quantum with spin-bath drive, according to some embodiments.

Spin bath driving results for Sample C ([N]=10 ppm, 15N) are shown in FIG. 13B. At this high nitrogen density, interactions with the nitrogen bath dominate NV spin ensemble dephasing, and $T_{2,SQ}^*$ and $T_{2,DQ}^*$ both exhibit a clear dependence on spin bath drive strength $\Omega N$. With no drive ($\Omega_N$=0), $T_{2,DQ}^* \approx T_{2,SQ}^*/2$, in agreement with dephasing dominated by a paramagnetic spin environment and the twice higher dephasing rate in the DQ basis. Note that this result is in contrast to the observed DQ basis enhancement of $T_2^*$ at lower nitrogen density for Samples A and B (FIGS. 11A-11B and 12A-12B). Tin Sample C increases more rapidly as a function of spin bath drive amplitude in the DQ basis than in the SQ basis, such that $T_{2,DQ}^*$ surpasses $T_{2,SQ}^*$ with sufficient spin bath drive strength. The $T_2^*$-limit in the SQ basis (≃1.8 μs) to can be attributed to strain inhomogeneities in this sample, whereas the longest observed $T_2^*$ in the DQ basis (≃3.4 μs) is in agreement with dephasing due to the 0.05% $^{13}$C and 0.5 ppm residual $^{14}$N spin impurities. The latter were incorporated during growth of this $^{15}$N sample.

FIG. 13 shows $T_{2,NV-N}^* \equiv 2 T_{2,DQ}^*$ versus sample nitrogen concentration [N] to account for the twice faster dephasing of the DQ coherence. To improve the range of [N] coverage, DQ data is shown for additional diamonds, Samples D ([N]=3 ppm) and E ([N]=48 ppm). The dependence of the NV spin ensemble dephasing time on [N] has not previously been experimentally reported. Fitting the data to the function $1/T_{2,NV-N}^* = A_N$ [N] (not shown), the characteristic NV-N interaction strength for NV ensembles is $A_N = 2\pi$ 16.6(2.6) kHz/ppm [9.6(1.8) μs·ppm] in the SQ sub-basis. This value is about 1.8 larger than the dipolar-estimate γe-e=2π 9.1 kHz/ppm (dashed-dotted line), which is used above in estimates of NV dephasing due to the nitrogen spin bath. Numerical spin bath simulations for the NV-N spin system were performed and the second moment of the dipolar-broadened single NV ESR linewidth were determined. By simulating $10^4$ random spin bath configurations, the ensemble-averaged dephasing time can be extracted from the distribution of the single NV linewidths. The results of this simulation (dashed line) are in excellent agreement with the experiment and confirm the validity of the obtained scaling for $T_2^*$(N).

Ramsey DC Magnetic Field Sensing

Combining the two quantum control techniques can greatly improve the sensitivity of Ramsey DC magnetometry. FIG. 13d compares the accumulated phase for SQ, DQ, and DQ plus spin bath drive measurements of a tunable static magnetic field of amplitude $B_{DC}$, for Sample B. Sweeping $B_{DC}$ leads to a characteristic observed oscillation of the Ramsey signal S∝C sin(Φ), where $C=C_0 \exp[-(\tau/T_2^*)^p]$ is the measurement contrast and $\Phi = \Delta m \times \gamma_{NV} B_{DC} \tau$ is the accumulated phase during the free precession interval τ ≲ $T_2^*$. Choosing $\tau_{SQ}=1.308$ μs and $\tau_{DQ+Drive}=23.99$ μs (see DC magnetometry with DQ and spin-bath drive), a 36.3(1.9) faster oscillation period (at equal measurement contrast) can be seen when DQ and spin bath driving are both employed, compared to a SQ measurement. This enhancement in phase accumulation, and hence DC magnetic field sensitivity, agrees well with the expected improvement ($2\times T_{DQ+Drive}/\tau_{SQ}$=36.7).

Application of Quantum Control Techniques

FIGS. 13A-13D show application of quantum control techniques to extend NV spin ensemble dephasing time ($T_2^*$) and increase DC magnetic field sensitivity, according to some embodiments. FIG. 13A shows Ramsey measurements of $T_2^*$ in the single quantum (squares) and double quantum (circles) bases for different spin-bath drive strengths (Rabi frequencies) for Sample B (N=0:75 ppm) at $B_0$=8:5 mT. The dashed lines are calculated from a model of NV spins that dipolar-coupled to a multi-component spin bath (Eqn. 3). The solid line is a fit of the model to the $T_2^*$ data (see main text for details). FIG. 13B shows the same as FIG. 13A but for Sample C ([N]=10 ppm) and $B_0$=10:3 mT, according to an embodiment. FIG. 13C shows measured $T_{2,N-NV}^* \equiv 2 \times T_{2,DQ}^*$ as a function of nitrogen concentration for Samples B, C, D, E, according to some embodiments. Samples were selected to have a predominately electronic nitrogen (P1) spin bath using DEER ESR measurements. The data is fit using an orthogonal-distance-regression routine to account for the uncertainties in [N] and $T_2^*$. A fit to the form $1/T_2^*=A_{NV-N}$[N] yields $A_{N-NV}=2\pi \times 16:6(2:6)$ kHz/ppm [9:6(1:8) μs·ppm]. The dashed line is the expected scaling from a second-moment analysis of the NV ensemble ESR linewidth (see above for details). FIG. 13D shows measured Ramsey DC magnetometry signal S∝C sin(φ(τ)) for Sample B, in the SQ and DQ bases, as well as the DQ sub-basis with spin-bath drive according to some embodiments (see main above for details). There is a 36x faster oscillation in the DQ sub-basis with spin-bath drive compared to SQ with no drive. This greatly enhanced DC magnetic field sensitivity is a direct result of the extended $T_2^*$, with sensitivity enhancement given by $2\times \sqrt{\tau_{DQ+Drive}/\tau_{SQ}}$ at equal contrast. The slight decrease in observed contrast in the DQ+drive case for $|B_{DC}|>0:05$ mT is a result of changes in the Zeeman resonance frequencies of the nitrogen spins due to the applied test field $B_{DC}$, which was not corrected for in these measurements.

Discussion

The results (i) characterize the dominant spin dephasing mechanisms for NV ensembles in bulk diamond (strain and interactions with the paramagnetic spin bath); and (ii) demonstrate that the combination of DQ magnetometry and spin bath driving can greatly extend the NV spin ensemble $T_2^*$. For example, in Sample B these quantum control techniques, when combined, provide a 16.2 improvement in $T_2^*$. Operation in the DQ basis protects against common-mode inhomogeneities and enables an extension of $T_2^*$ for samples with [N]≲1 ppm. In such samples, strain inhomogeneities are the main causes of NV spin ensemble dephasing. In samples with higher N concentration ([N]≳1 ppm), spin bath driving in combination with DQ sensing provides an increase of the NV ensemble $T_2^*$ by decoupling paramagnetic nitrogen and other electronic dark spins from the NV spins. The results demonstrate quantum control techniques that allow the NV ensemble $T_2^*$ to approach the bare Hahn echo coherence time $T_2$. Note that spin bath driving may also be used to enhance the NV ensemble $T_2$ in Hahn echo, dynamical decoupling and spectral decomposition experimental protocols.

Furthermore, combination of DQ magnetometry and spin bath driving allows improved DC Ramsey magnetic field sensing. The relative enhancement in photon-shot-noise-limited sensitivity (neglecting experimental overhead time) is quantified by $2\times\sqrt{\zeta}$, where the factor of two accounts for the enhanced gyromagnetic ratio in the DQ basis and $\zeta \equiv T_{2,DQ}^*/T_{2,SQ}^*$ is the ratio of maximally achieved $T_2^*$ in the DQ basis (with spin bath drive when advantageous) and non-driven $T_2^*$ in the SQ basis. For Samples A, B, and C, $2\times\sqrt{\zeta}$, =5.2×, 8.1×, and 3.9× are demonstrated, respectively, using the experimental values. In some embodiments, increasing $T_2^*$ also decreases the fractional overhead time associated with NV optical initialization and readout, resulting in even greater DC magnetic field sensitivity improvements and an approximately linear sensitivity enhancement with ζ (see DC magnetometry with DQ and spin-bath drive). These quantum control techniques are effective when integrated with other approaches to optimize NV ensemble magnetic field sensitivity, such as high laser power and good N-NV conversion efficiency. In particular, conversion efficiencies of 1-30% can be seen for NV ensemble measurements, such that the nitrogen spin bath continues to be a relevant spin dephasing mechanism.

There are multiple further improvements in NV ensemble $T_2^*$ and DC magnetic field sensitivity. First, the $^{13}$C limitation to $T_2^*$, observed for all samples, can be mitigated via improved isotopic purity ([$^{12}$C]>99.99%) s; or through driving of the nuclear spin bath. Second, more efficient RF delivery enables faster spin bath driving (larger Rabi drive frequency $\Omega_N$), which helps decouple denser nitrogen baths and thereby extending $T_2^* \propto \Omega_N^2/\delta_N^2 \propto \Omega_N^2$ [N]$^2$ (see Eqn. 4). Third, short NV ensemble $T_2^*$ times have in the past prevented effective utilization of more exotic readout techniques, e.g., involving quantum logic or spin-to-charge conversion. Such methods offer greatly improved NV spin-state readout fidelity but introduce substantial overhead time, typically requiring tens to hundreds of microseconds per readout operation. The NV spin ensemble dephasing times extended with the techniques described herein ($T_2^* \gtrsim 20$ μs) provides for effective application of these readout schemes, which only offer sensitivity improvements when the sequence sensing time (set by $T_2^*$ for DC sensing) is comparable to the added overhead time. We note that the NV ensemble $T_2^*$ values obtained based on this technique are the longest for any electronic solid-state spin system at room temperature (see comparison FIG. 6) indicating that state-of-the-art DC magnetic field sensitivity may be increased to ~100 fT$\sqrt{Hz}$ for optimized NV ensembles in a diamond sensing volume (100 µm)$^3$. Therefore, DQ magnetometry in combination with spin bath driving allows for order-of-magnitude increase in the NV ensemble $T_2^*$ in diamond, providing a clear path to ultra-high sensitivity DC magnetometry with NV ensemble coherence times approaching $T_2$.

Materials & Methods
Experimental Methods

According to some embodiments and as discussed in more detail above, a custom-built, wide-field microscope may collect the spin-dependent fluorescence from an NV ensemble onto an avalanche photodiode. Optical initialization and readout of the NV ensemble may be accomplished via 532 nm continuous-wave (CW) laser light focused through the same objective used for fluorescence collection (FIG. 1a). The detection volume may be given by the 532 nm beam excitation at the surface (diameter 20 µm) and sample thickness (100 µm for Samples A and B, 40 µm for Sample C). A static magnetic bias field may be applied to split the |−1⟩ and |+1⟩ degeneracy in the NV ground state using two permanent samarium cobalt ring magnets in a Helmholtz-type configuration, with the generated field aligned along one [111] crystallographic axis of the diamond ($\equiv\hat{z}$). The magnet geometry may be optimized using software, such as the Radia software package to minimize field gradients over the detection volume (see Magnetic field contribution to $T_2^*$). A planar waveguide fabricated onto a glass substrate may deliver 2-3.5 GHz microwave radiation for coherent control of the NV ensemble spin states. To manipulate the nitrogen spin resonances (see FIG. 4B), a 1 mm-diameter copper loop may be positioned above the diamond sample to apply 100-600 MHz radiofrequency (RF) signals, synthesized from up to eight individual signal generators. Pulsed measurements on the NV and nitrogen spins may be performed using a computer-controlled pulse generator and microwave switches.

Strain Contribution to $T_2^*$

According to an exemplary embodiment, the on-axis strain component $M_z$ in Sample B was mapped across a 1×1 mm area using a separate wide-field imager of NV spin-state-dependent fluorescence. A bias field $B_0 \sim 1.5$ mT was applied to split the spin resonances from the four NV orientations. Measurements were performed following the vector magnetic microscopy (VMM) technique. Eqn. 1 above was used to analyze the measured NV resonance frequencies from each camera pixel (ignoring $M_x$ and $M_y$ terms as small perturbations, see NV Hamiltonian in single and double quantum bases). This procedure yielded the average $B_x$, $B_y$, and $B_z$ magnetic field components, as well as the $M_z$ on-axis strain components for all four NV orientations in each camera pixel, corresponding to 2.42 µm×2.42 µm transverse resolution on the diamond sample. FIG. 8 shows the resulting map of the on-axis strain inhomogeneity $M_z$ in Sample B for the NV orientation interrogated in this work. This map indicates an approximate strain gradient of 2.8 kHz/µm across the field of view. The estimated strain gradient was used for all samples as an example, though variation between samples and within different regions of a sample may exist. Across a 20-µm diameter spot, the measured strain inhomogeneity corresponds to a $T_2^*$ limit of $\approx 6$ µs, which compares well with the measured variation in $T_{2,SQ}^*$ for Samples A and B (see FIG. 10). Note that the contributions to $M_z$ can be microscopic (e.g., due to nearby charge defects) or macroscopic (e.g., due to crystal defects with size >10 µm). In addition, the VMM technique integrates over macroscopic gradients along the beam excitation path, which for the exemplary experiments were perpendicular to the diamond sample surface through the NV layer. Consequently, the strain gradient estimate shown in FIG. 8 is a measure of $M_z$ gradients in-plane within the NV layer, and strain gradients across the NV layer thickness are not resolvable in this measurement.

Spin Bath Driving Model

According to an experimental embodiment, the effective magnetic field produced by the ensemble of nitrogen spins is modeled as a Lorentzian line shape with spectral width $\delta_N$ (half width at half max) and a maximum $\gamma_{NV-N}$ at zero drive frequency ($\Omega_N=0$). This lineshape is derived in the context of dilute dipolar-coupled spin ensembles using the methods of moments and is consistent with NV DEER linewidth measurements (see NV and nitrogen spin resonance linewidth measurements). The limit to the NV ensemble $T_2^*$ taking the bath drive into account was given by (see Eqn. 4)

$$1/T_{2,NV-N}^*(\Omega_N) = \Delta m \times \gamma_{NV-N} \frac{\delta_N^2}{\delta_N^2 + \Omega_N^2} \quad (5)$$

At sufficiently high drive strengths ($\Omega_N \gg \delta_N$), the nitrogen spin ensemble is coherently driven, and the resulting magnetic field noise spectrum is detuned away from the zero-frequency component, to which NV Ramsey measurements are maximally sensitive. For this case, the NV spin ensemble $T_2^*$ increases $\propto \Omega_N^2/\delta_N^2$. At drive strength $\Omega_N \lesssim \delta_N$, however, the nitrogen spin ensemble is inhomogeneously driven and the dynamics of the spin bath cannot be described by coherent driving, according to some embodiments. Nonetheless, $1/T_2^*$ given by Eqn. 5 approaches $\gamma_{NV-N}$ in the limit $\Omega_N \rightarrow 0$, which is captured by the Lorentzian model.

This model (Eqn. 4) is in excellent agreement with the data for Sample B ([N]=0.75 ppm, $\delta_N \approx 11$ kHz), for which $\Omega_N > \delta_N$ for the range of drive strengths employed. When the slight mismatch of nitrogen spin resonances is taken into account, the effective nitrogen linewidth is increased to $\delta_N \approx 60$ kHz (see NV and nitrogen spin resonance linewidth measurements). For Sample C ([N]=10 ppm, $\delta_N \approx 150$ kHz), the effective linewidth $\delta_N$ extracted from fitting the data in FIG. 13B is about 4 larger ($\approx 600$ kHz) than what is expected from the dipolar-estimate for the small $B_0$ misalignment angle and resultant slight mismatch of nitrogen spin resonance frequencies. This discrepancy can be attributed to incoherent dynamics at drive strength $\Omega_N \sim \delta_N$. For Sample B at drive strengths $\Omega_N \lesssim 6 \delta_N$ the Ramsey signals exhibit multi-exponential decay with slow and fast decay rates, consistent with a larger effective $\delta_N$. To nonetheless enable a qualitative comparison with Sample B, in these instances the stretched exponential parameter may be restricted to p≥1 when extracting the NV spin ensemble $T_2^*$. At drive frequencies $\Omega_N > \delta_N$, the observed Ramsey signal returns to a simple exponential decay, confirming the validity of the driving model in this regime for Sample B. A more complete driving model may also take into account the changes of spin bath dynamics at drive strengths $\Omega_N \sim \delta_N$.

Inhomogeneous Dephasing Due to the Spin Bath

According to an embodiment, the NV spin ensemble $T_2^*$ as a function of nitrogen concentration can be estimated from the average dipolar coupling between electronic nitrogen spins, which is given by $$\gamma_{e-e} = a \times \frac{\mu_0}{4\pi} g^2 \mu_B^2/\hbar \frac{1}{\langle r \rangle^3} \approx 2\pi \times 9.1 \cdot [N] \text{ kHz/ppm},$$

where $\mu_0$ is the vacuum permeability, g is the electron g-factor, $\mu_B$ is the Bohr magneton, $\hbar$ is the reduced Planck constant, $\langle r \rangle = 0.55[N]^{-1/3}$ is the average spacing between electronic nitrogen spins as a function of density [N] (in parts-per-million) within diamond?, and α is a factor of order unity collecting additional parameters from the dipolar estimate such as the cosine dependence and spin resonance lineshape of the ensemble. A sample with [N]=1 ppm has an estimated $T_{2,NV-N}^* \approx 1/(2\pi \times 9.2 \text{ kHz}) = 17.5$ μs using this dipolar estimate. Similarly, FIG. 2 gives the estimates $T_{2,NV-N}^*$ for Samples A, B, and C.

Uncertainties in nitrogen concentration [N] used in FIG. 13C may be estimated by considering: the values reported by the manufacturer (for example, Element Six® Inc.); fluorescence measurements in a confocal microscope (Sample A); and Hahn echo $T_2$ measurements using the calibration value $T_2(N) \approx 157$ μs·ppm reported for the samples (Samples B and C). For example, for Sample B, Element Six® reports [N]=1 ppm, whereas the measured $T_2$=300 μs suggests [N]=0.5 ppm. The average value is thus used: [N]=0.75±0.25 ppm.

According to some embodiments, to estimate the $^{13}C$ nuclear spin bath contribution to NV spin ensemble dephasing, $T_2^*$ is measured for a low-nitrogen, natural isotopic abundance sample (98.93% 12C) (see $^{13}C$ contribution to $T_2^*$ for details). In the dilute regime, where $[^{13}C] \lesssim 1.1\%$, $1/T_2^*$ is expected to be linearly dependent on the $^{13}C$ concentration. Thus the $T_2^*$ measurement from a natural abundance sample provides a means to estimate the $^{13}C$ contribution in the isotopically enriched samples used in the present study. The $^{13}C$-dependent decoherence rate per unit percentage concentration is found to be $A_{13C} \lesssim 2\pi \times 160$ kHz/% ($\gtrsim 1$ μs %), indicating limits on NV ensemble dephasing of $T_{2,NV-13}^*c$, ≈100 μs, 100 μs, and 20 μs for Samples A, B, and C, respectively.

Measurement Contrast

According to an embodiment, the NV ESR measurement contrast (FIGS. 11A-12C and 13D) is determined by comparing the fluorescence from the NV ensemble in the |0⟩ state (maximal fluorescence) relative to the |+1⟩ or |−1⟩ state (minimal fluorescence) and is defined as visibility $$c = \frac{\max - \min}{\max + \min}.$$

The REEK (FIG. 4B) and DC magnetometry contrast (FIG. 13D) are calculated in the same fashion but are reduced by ≈1/e since the best phase sensitivity in those measurements is obtained at $\tau \approx T_2$ and $\tau \approx T_2^*$, respectively (see NV and nitrogen spin resonance linewidth measurements). According to some embodiments, for noise rejection, most pulse sequences may use a back-to-back double measurement scheme, where the accumulated NV spin ensemble phase signal is first projected onto the |0⟩ state and then onto the |+1⟩ or |−1⟩ state. The contrast for a single measurement is then defined as the visibility of both sequences.

NV Ramsey Measurements

FIGS. 11A-11C show NV Ramsey measurements for low nitrogen density sample (Sample A, [N]≲0:05 ppm) at an applied bias magnetic field of $B_0$=2:2 mT, according to an embodiment. Comparison of time-domain data and resulting fit values for the NV spin ensemble $T_2^*$ for the single quantum (SQ) coherence, {0, +1} (FIG. 11B); and the double quantum (DQ) coherence, {+1, −1} (FIG. 11A). The top of FIG. 11C is an illustration of DQ Ramsey protocol with two-tone MW pulses, where $\hat{U}_{S=1}(\pi/2)$ is the spin-1 unitary evolution operator, according to an embodiment. For SQ measurements, a single-tone MW pulse is applied instead to generate the pseudo-spin-½ unitary evolution operator $\hat{U}_{S=1/2}(\pi/2)$. The graph in FIG. 11C shows a discrete Fourier transform of the SQ (solid line) and DQ (dashed line) Ramsey measurements with a MW drive detuned 0.4 MHz from the {0, ±1} transitions. NV sensor spins accumulate phase twice as quickly in the DQ basis as in the SQ basis.

Figure 12C:
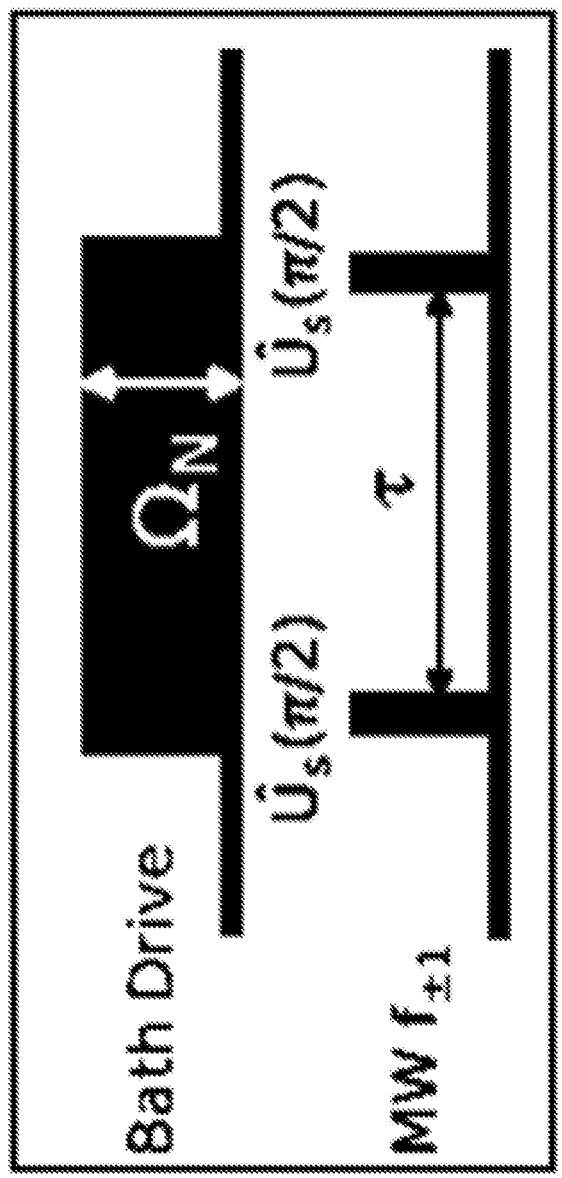

FIGS. 12A-12C show NV Ramsey measurements for intermediate nitrogen density sample (Sample B, ([N]=0:75 ppm) at an applied bias magnetic field of B0=8:5 mT, according to an embodiment. Comparison of time-domain data and resulting fit values for the NV spin ensemble $T_2^*$ for the single quantum (SQ) coherence {0, +1} (FIG. 12B top plot); the SQ coherence with spin-bath drive (FIG. 12B bottom plot); the DQ coherence with no drive (FIG. 12A top plot); and the DQ coherence with spin-bath drive (FIG. 12A bottom plot). There is a 16:2× improvement of $T_2^*$ with spin-bath drive when the DQ coherence is used for sensing compared to SQ with no drive. FIG. 12C shows two-tone NV Ramsey protocol with applied spin-bath bath drive resonant with nitrogen spins in a similar manner as is shown in FIG. 11C.

Spin Bath Contribution to $T_2^*$

According to an embodiment, the NV spin ensemble $T_2^*$ as a function of nitrogen concentration is estimated from the average dipolar coupling between electronic nitrogen spins, which is given by $$\gamma_{e-e} = a \times \frac{\mu 0}{4\pi} g^2 \mu_B^2 /\hbar \frac{1}{(r)3} \approx 2\pi \times 9.1 [N] \text{ kHz/ppm},$$

where $p_0$ is the vacuum permeability, g is the electron g-factor, $\mu_B$ is the Bohr magneton, $\hbar$ is the reduced Planck constant, $(r)=0.55[N]^{-1/3}$ is the average spacing between electronic nitrogen spins as a function of density [N] (in parts-per-million) within diamond, and α is a factor of order unity collecting additional parameters from the dipolar estimate such as the cosine dependence and spin resonance lineshape of the ensemble. A sample with [N]=1 ppm has an estimated $T_{2,NV-N}^* \approx 1/(2\pi \times 9.2 \text{ kHz})=17.5$ ps using this dipolar estimate. Similarly, FIG. 10 gives the estimates $T_{2,NV-N}^*$ for Samples A, B, and C.

NV Ramsey Measurement for Natural Isotope Abundance Diamond Sample

FIGS. 15A-15B show NV Ramsey measurement for natural isotope abundance diamond sample. FIG. 15A shows a DQ Ramsey measurement on a natural abundance sample ([N]≈0.4 ppm, [$^{13}C$]=1.07%) yields $T_2^{DQ*}$=0.445(30) μs. FIG. 15B shows a Fourier transform of Ramsey signal showing the enhanced precession in the DQ basis. A frequency detuning from the center hyperfine state of 3.65

MHz was chosen in this measurement; by sensing in the DQ basis, the detuning from each hyperfine state has acquired a factor of two.

Magnetic Field Gradient Contribution to $T_2^*$

According to an embodiment, a wide-field NV-diamond microscope employs a custom-built samarium-cobalt (SmCo) magnet geometry designed to apply a homogeneous external field $B_0$ parallel to NVs oriented along the [111] diamond crystallographic axis. The field strength can be varied from 2 to 20 mT (FIG. 5A). SmCo may be chosen for its low reversible temperature coefficient (−0.03%/K). Calculations performed using the Radia software package enabled the optimization of the geometry to minimize $B_0$ gradients across the NV fluorescence collection volume. This collection volume is approximately cylindrical, with a measured diameter of ≈20 μm and a length determined by the NV layer thickness along the z-axis (40-100 μm, depending on the diamond sample).

FIG. 5A shows magnet geometry used to apply an external $B_0$ field along one NV orientation within the diamond crystal (typically [111]) as modeled using Radia, according to an embodiment. The arrow depicts the NV orientation class interrogated in these experiments and the rectangle represents diamond sample approximately to scale. According to an embodiment, FIG. 5B shows magnets that are translated along three axes to measure the $B_0$ field strength (shift in ESR transition frequency) as a function of detuning from the origin (x,y,z=0) where the origin is defined as the center of the collection volume. Solid lines depict Radia simulation results while plotted points correspond to measured values. The inset shows a zoomed-in view for length scale relevant for NV fluorescence collection volumes used in example experiments.

According to an embodiment, to calculate the expected $B_0$ field strength along the target NV orientation, the dimensions and properties of the magnets were used as Radia input, as well as an estimated 3° misalignment angle of the magnetic field with the NV axis. Good agreement exists between the calculated field strength and values extracted from NV ESR measurements in Sample B, over a few millimeter length scale. The simulation results and measured values are plotted together in FIG. 5B. The z-direction gradient is reduced compared to the gradient in the xy-plane due to a high degree of symmetry along the z-axis for the magnet geometry.

According to an embodiment, using data and simulation, the $B_0$ gradient may be calculated at 8.5 mT induces an NV ensemble ESR linewidth broadening of less than 0.1 kHz across the collection volume of Sample B. This corresponds to a $T_2^*$-limit on the order of 1 ms. However, due to interaction of the bias magnetic field with nearby materials and the displacement of the collection volume from the magnetic field saddle point, the experimentally realized gradient for Sample B was found to contribute an NV ESR linewidth broadening ≈1 kHz (implying a $T_2^*$-limit ≈320 μs), which constitutes a small but non-negligible contribution to the $T_2^*$ values measured in this work. Ramsey measurements for Sample A were taken at a four times smaller bias field; estimates are therefore ≈4× better magnetic field homogeneity. For Sample C, with a layer thickness of 40 μm, the contribution of the magnetic field gradient at 10 mT to $T_2^*$ was similar to that of Sample B.

Nv Hamiltonian in Single and Double Quantum Bases

The influence of strain and magnetic fields in the single quantum (SQ) and double quantum (DQ) bases can be explained by considering several limiting cases. First, common-mode noise sources, i.e., sources that shift the NV $|-1\rangle$ and $|+1\rangle$ energy levels in-phase and with equal magnitude, can be suppressed in the DQ basis. Next, off-NV-axis strain fields can be suppressed even by moderate bias magnetic fields. Lastly, the effect of off-axis magnetic fields on the NV spin-state energy levels and $T_2^*$ is explained. The negatively-charged NV ground electronic state electronic spin (S=1) Hamiltonian, is given by (neglecting hyperfine and quadrupolar effects):

$$H/h = DS_z^2 + \frac{\gamma NV}{2\pi}(B_x S_x + B_y S_y + B_z S_z) + \qquad (S1)$$

$$M_z S_z^2 + M_x(S_y^2 - S_x^2) + \Big) + M_y(S_x S_y + S_y S_x),$$

where D≈2.87 GHz is the NV zero-field splitting due to spin-spin interactions, $\{B_x, B_y, B_z\}$ are the magnetic field components, $\{M_x, M_y, M_z\}$ collect strain and electric field components, $\{S_x, S_y, S_z\}$ are the dimensionless spin-1 operators, and $$\frac{g\mu B}{h} = \frac{\gamma NV}{2\pi}\text{GHz}/T$$

is the NV gyromagnetic ratio. Using $$M\perp \equiv -(M_x + iM_y), B\perp \equiv \frac{1}{\sqrt{2}}(B_x + iB_y),$$

and the standard definitions for the spin operators $\{S_x, S_y, S_z\}$, Eqn. S1 reads in matrix form:

$$H/h = \begin{pmatrix} D + M_z + \frac{\gamma NV}{2\pi}B_z & \frac{\gamma NV}{2\pi}B_\perp^* & M_\perp \\ \frac{\gamma NV}{2\pi}B_\perp & 0 & \frac{\gamma NV}{2\pi}B_\perp^* \\ M_\perp^* & \frac{\gamma NV}{2\pi}B_\perp & D + M_z - \frac{\gamma NV}{2\pi}B_z \end{pmatrix}. \qquad (S2)$$

Case 1: Zero Strain, Zero Off-Axis Magnetic Field

For zero strain/electric field ($\{M_x, M_y, M_z\}$=0) and zero off-axis magnetic field (B⊥=0), the Hamiltonian in Eqn. S2 is diagonal:

$$\frac{H_0}{h} = \begin{pmatrix} D + \frac{\gamma NV}{2\pi}B_z & 0 & 0 \\ 0 & 0 & 0 \\ 0 & 0 & D - \frac{\gamma NV}{2\pi}B_z \end{pmatrix}, \qquad (S3)$$

and the energy levels are given by the zero-field splitting D and Zeeman energies $$\pm \frac{\gamma NV}{2\pi}B_z, \frac{E_{|\pm 1,0\rangle}}{h} = \Big\{D \pm \frac{\gamma NV}{2\pi}B_z, 0\Big\}, \qquad (S4)$$

where $|\pm 1, 0\rangle$ are the Zeeman eigenstates $$|+1\rangle = \begin{pmatrix} 1 \\ 0 \\ 0 \end{pmatrix}, |-1\rangle = \begin{pmatrix} 0 \\ 0 \\ 1 \end{pmatrix}, \text{and } |0\rangle = \begin{pmatrix} 0 \\ 1 \\ 0 \end{pmatrix}. \quad (S5)$$

NV spin ensemble measurements in the DQ basis, for which the difference between the $f_{-1} = E_{|0\rangle \to |-1\rangle}$ and $f_{+1} = E_{|0\rangle \to |-1\rangle}$ transitions is probed (see FIG. 1b), are to first-order insensitive to inhomogeneities and fluctuations in D (e.g., due to drift in temperature), and other common-mode noise sources. However, DQ measurements are twice as sensitive to magnetic fields along $B_z$. The DQ basis therefore provides both enhanced magnetic field sensitivity and protection against common-mode noise sources.

Case 2: Non-Zero Strain, Zero Off-Axis Magnetic Field

For non-zero strain/electric field components, but negligible off-axis magnetic fields ($B\perp \approx 0$), the energy eigenvalues of the NV Hamiltonian (Eqn. S2) for the $|\pm 1\rangle$ states become $$\frac{E_{|\pm 1\rangle}}{h} = D + M_z \pm \sqrt{\left(\frac{\gamma NV}{2\pi} B_z\right)^2 + \|M_\perp\|^2} \quad (S6)$$

$$\approx D + M_z \pm \left[\frac{\gamma NV}{2\pi} B_z + \frac{\|M_\perp\|^2}{2\frac{\gamma NV}{2\pi} B_z} + \mathcal{O}\left(\frac{\|M_\perp\|^4}{B_z^2}\right)\right]. \quad (S7)$$

From Eqn. S7 it follows that off-axis strain ($\propto \|M_\perp\|$) is suppressed by moderate on-axis bias fields by a factor $$\frac{\|M_\perp\|}{\frac{\gamma NVBx}{\pi}},$$

as noted in the main text. Reported values for $\|M_\perp\|$ are ~10 kHz [S17] and ~100 kHz [S18] for single NV centers in bulk diamond, and ~7 MHz in nano-diamonds [S18]. FIG. 1c in the main text shows that the measured on-axis strain $M_z$ in Sample B varies between 2-3 MHz (see $^{14}$N and $^{15}$N double electron-electron resonance spectra for details).

Case 3: Non-Zero Off-Axis Magnetic Field

For non-zero off-axis magnetic field ($B\perp \neq 0$) the energy values for the NV Hamiltonian (Eqn. S1) by treating $B\perp$ as a small perturbation, with perturbation Hamiltonian $V \equiv H - H_0$. To simplify the analysis, one can set $M_\parallel = M_\perp = 0$. Using time-independent perturbation theory (TIPT, see for example Ref [S19]), the corrected energy levels are then given by $E_{|\pm 1, 0\rangle} \approx E^{(0)}_{|\pm 1, 0\rangle} + E^{(1)}_{|\pm 1, 0\rangle} + E^{(2)}_{|\pm 1, 0\rangle} \ldots$, where $E^{(0)}_{|\pm 1, 0\rangle}$ are the bare Zeeman energies as given in Eqn. S4 and $E^{(k)}_{|\pm 1, 0\rangle}$ for k>0 are the k-th order corrections. The energy corrections at first and second order are:

$$E^{(1)}_{|\pm 1, 0\rangle} \langle \pm 1, 0|V|\pm 1, 0\rangle = 0, \quad (S8)$$

and $$E^{(2)}_{|\pm 1\rangle} = \quad (S9)$$

$$\frac{\|\langle \mp 1|V|\pm 1\rangle\|^2}{E_{|\pm 1\rangle} - E_{|\mp 1\rangle}} + \frac{\|\langle 0|V|\pm 1\rangle\|^2}{E_{|\pm 1\rangle}} = \frac{\left\|\frac{\gamma NV}{2\pi} B_\perp\right\|^2}{D \pm \frac{\gamma NV}{2\pi} B_z} \approx \frac{\left\|\frac{\gamma NV}{2\pi} B_\perp\right\|^2}{D},$$

$$E^{(2)}_{|0\rangle} = \frac{\|\langle +1|V|0\rangle\|^2}{-E_{|\pm 1\rangle}} + \frac{\|\langle -1|V|0\rangle\|^2}{-E_{|-1\rangle}} = \quad (S10)$$

$$-\left(\frac{\left\|\frac{\gamma NV}{2\pi} B_\perp\right\|^2}{D + \frac{\gamma NV}{2\pi} B_z} + \frac{\left\|\frac{\gamma NV}{2\pi} B_\perp\right\|^2}{D - \frac{\gamma NV}{2\pi} B_z}\right) \approx -\frac{2\left\|\frac{\gamma NV}{2\pi} B_\perp\right\|^2}{D},$$

where it has been taken advantage that in the last two lines the fact that $$\frac{\gamma NV}{2\pi} B_z \ll D$$

in an exemplary experiment. The new transition frequencies for $E_{|0\rangle \to |-1\rangle}$ are then found to be $$f_{\pm 1} \approx D + \frac{3\left\|\frac{\gamma NV}{2\pi} B_\perp\right\|^2}{D} \pm \frac{\gamma NV}{2\pi} B_z. \quad (S11)$$

From Eqn. S11 it follows that energy level shifts due to perpendicular magnetic fields are mitigated by the large zero-field splitting D; and are further suppressed in the DQ basis, as they add (approximately) in common-mode. At moderate bias fields, $B_z = 2\text{-}20$ mT, and typical misalignment angles of $\Theta \sim 3°$ (or better), we estimate a frequency shift of 0.1-1 kHz in the SQ basis.

$^{14}$N and $^{15}$N Double Electron-Electron Resonance Spectra

The $^{14}$N and $^{15}$N spin resonances, observed in NV double electron-electron resonance (DEER) spectra (see FIGS. 4B and 16A-16B), can be accounted for in terms of Jahn-Teller, hyperfine, and quadrupolar splittings. The relevant spin Hamiltonian for the substitutional nitrogen defect is given by $$H_{P1}/h = \mu_B/h B \cdot g \cdot S + \mu_N/h B \cdot I + S \cdot A \cdot I + I \cdot Q \cdot I \quad (S13)$$

where is the Bohr magneton, h is Planck's constant, $B = (B_x, B_y, B_z)$ is the magnetic field vector, g is the electronic g-factor tensor, $p_N$ is the nuclear magneton, $S = (S_x, S_y, S_z)$ is the electronic spin vector, A is the hyperfine tensor, $I = (I_x, I_y, I_z)$ is the nuclear spin vector, and Q is the nuclear electric quadrupole tensor. This Hamiltonian can be simplified in the following way: First, one can neglect the nuclear Zeeman energy (second term above) since its contribution is negligible at magnetic fields used in this work ($\simeq 10$ mT). Second, the Jahn-Teller distortion defines a symmetry axis for the nitrogen defect along any of the [111]-crystal axis directions. Under this trigonal symmetry (as with NV centers), and by going into an appropriate coordinate system, tensors g, A, and Q are diagonal and defined by at most two parameters:

$$g = \begin{pmatrix} g_\perp & 0 & 0 \\ 0 & g_\perp & 0 \\ 0 & 0 & g_\| \end{pmatrix}, A = \begin{pmatrix} A_\perp & 0 & 0 \\ 0 & A_\perp & 0 \\ 0 & 0 & A_\| \end{pmatrix}, \text{ and } Q = \begin{pmatrix} P_\perp & 0 & 0 \\ 0 & P_\perp & 0 \\ 0 & 0 & P_\| \end{pmatrix}. \quad (S14)$$

Here, $g_\perp$, $g_\|$, $A_\perp$, $A_\|$, $P_\perp$, and $P_\|$ are the gyromagnetic, hyperfine, and quadrupolar on- and off-axis tensor components, respectively, in the principal coordinate system. Further simplifications can be made by noting that the g-factor is approximately isotropic, i.e., $g_\perp \approx g_\| \equiv g$, and that for exact axial symmetry the off-axis components of the quadrupole tensor, $P_\perp$, vanish. Equation S13 may now be written as $$H_{P1}/h = g\mu_B/h B_z \cdot S_z + A_\| S_z \cdot I_z + A_\perp (S_x \cdot I_x + S_y \cdot I_y) + P_\| (I_z^2 - I^2/3). \quad (S15)$$

Figure 16A:
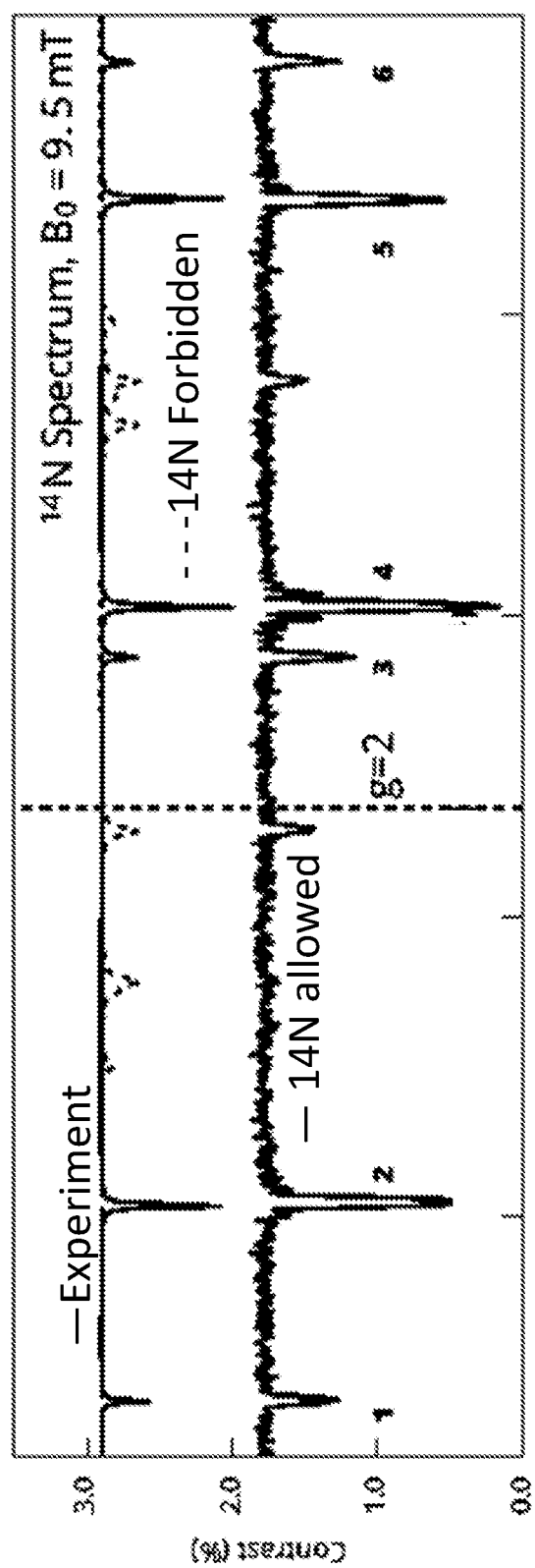
FIGS. 16A-16B show shows simulated and measured $^{14}$N DEER spectra, according to some embodiments.
Figure 16B:
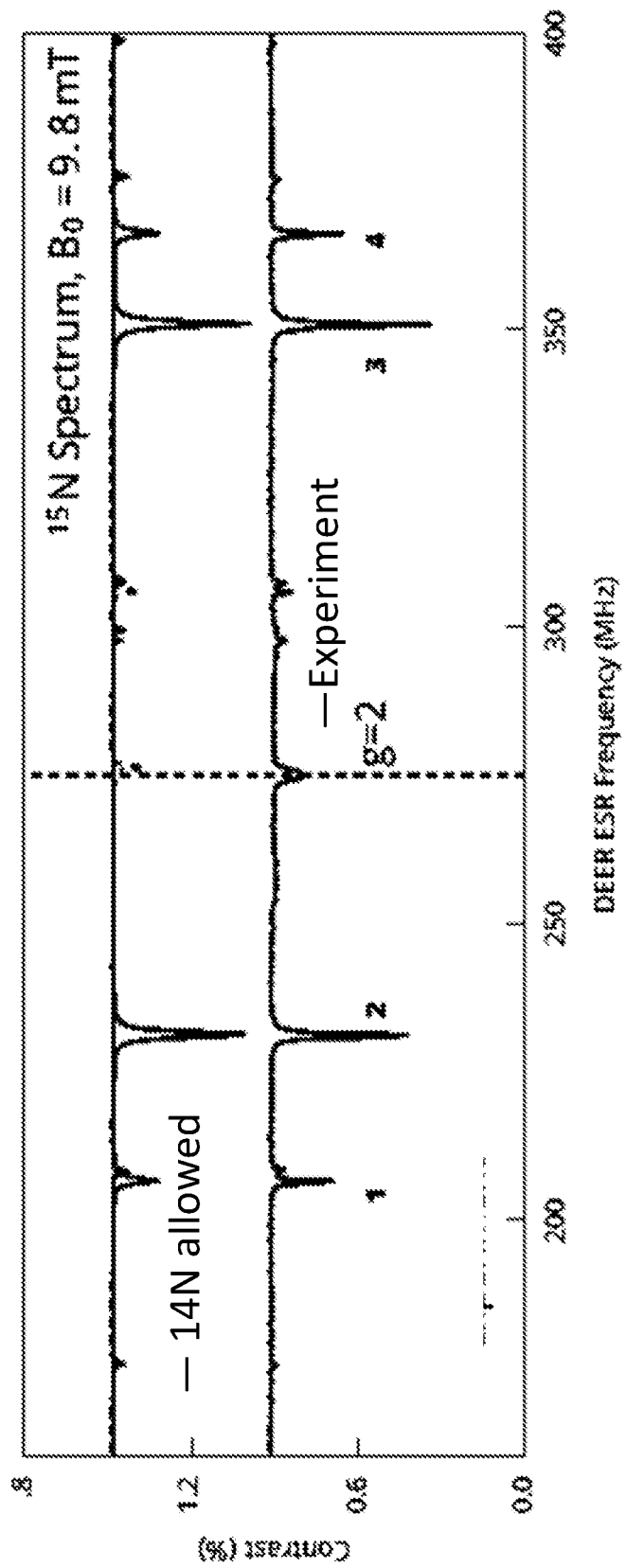

FIGS. 16A and 16B show $^{14}$N and $^{15}$N DEER spectra. FIG. 16A shows simulated (top) and measured (bottom) $^{14}$N DEER spectra for Sample B ([N]=0.75 ppm, $^{14}$N). Dipole-allowed nitrogen hyperfine transitions are labeled 1-6. Smaller peaks are attributed to degenerate forbidden hyperfine transitions ($\Delta m_I \neq 0$) of the off-axis nitrogen orientations. Frequencies are simulated using Eqn. S15 and plotted as Lorentzians with widths and amplitudes chosen to reflect the experimental data. Allowed hyperfine transitions have an approximate amplitude ratio of 1:3:1:3:3:1. The Larmor frequency of an electronic spin without hyperfine shift (g=2) is indicated as dashed black line. FIG. 16B shows simulated (top) and measured (bottom) $^{15}$N DEER spectrum for Sample C ([N]=10 ppm, $^{15}$N). Dipole-allowed hyperfine transitions are labeled 1-4. Smaller peaks are attributed to forbidden $^{15}$N hyperfine transitions and g=2 dark spins. The spectrum of a small abundance of $^{14}$N spins ($\approx$5% of $^{15}$N density) is visible as well.

$^{14}$N Spectrum $^{14}$N has S=½ and I=1, leading to six eigenstates $\pm 1 | m_S = \pm \frac{1}{2}, m_I = 0, \pm 1 \rangle$. The corresponding three dipole-allowed transitions ($\Delta m_S = \pm 1$, $\Delta m_I = 0$, solid arrows) are shown in FIGS. 17A and 17B, along with the four first-order forbidden transitions ($\Delta m_S = \pm 1$, $\Delta m_I = \pm 1$, dashed arrows). A nitrogen defect in diamond undergoes a Jahn-Teller (JT) distortion, which defines a hyperfine quantization axis along any of the four [111] crystallographic directions, irrespective of the applied magnetic field. Taking all JT orientations into account, the full $^{14}$N spin resonance spectrum displays a total of 12 dipole-allowed resonances. By aligning the magnetic field along any of the [111]-directions of the diamond crystal, the 12 transitions are partially degenerate and reduce to six visible transitions in an NV DEER measurement, with an amplitude ratio 1:3:1:3:3:1, as shown in FIG. 4B and FIG. 16A. The spectrum for the off-axis and degenerate JT orientations can be obtained from Eqn. S15 by rotating the bias field by $\theta$=109.471 around either the x or y axis, where $\theta$ is the angle between any two crystallographic axes, i.e., taking $B \rightarrow R_{x \text{ or } y}(\theta=109.471°) \cdot B$.

In FIG. 16B, the simulated (degenerate) spectrum for $^{14}$N spins is shown together with experimental data from Sample B ([N]=0.75 ppm). A magnetic field $B_z$=95.5 mT is applied along one of the [111]-orientations. For the simulation the following parameters have been used: $g\mu_B/h \approx 2.8024 \times 10^4$ MHz/T, where g=2.0024 is the P1 electronic g-factor, $\mu_B$=9.274×10$^{-24}$ J/T is the Bohr magneton, h=6.626×10$^{-34}$ J·s is Planck's constant, $A_\|$=114 MHz, $A_\perp$=81.3 MHz, and $P_\|$=−3.97 MHz. FIG. 18 shows nitrogen defect parameters, according to an embodiment. These defect parameters may be used to simulate the nitrogen resonance spectrum using Eqn. S15.

$^{15}$N Spectrum $^{15}$N has S=½ and I=½, leading to the four eigenstates $|m_S = \pm \frac{1}{2}, m_I = \pm \frac{1}{2}\rangle$. The corresponding two dipole-allowed transitions ($\Delta m_S = \pm 1$, $\Delta m_I = 0$, solid arrows) are shown in FIG. S5b, along with the two first-order forbidden transitions ($\Delta m_S = \pm 1$, $\Delta m_I = \pm 1$, dashed arrows). The experimental NV DEER spectrum for Sample C ([$^{15}$N]=10 ppm) is shown in FIG. 17B, along with a simulated $^{15}$N spectrum. The $^{15}$N simulation used $B_0$=9.8 mT, $A_\|$=−159.7 MHz, $A_\perp$=−113.83 MHz, and $P_\|$=0 (since I<1).

Continuous Versus Pulsed Spin Bath Driving

As discussed, both continuous (CW) and pulsed driving can decouple the electronic spin bath from the NV sensor spins, according to some embodiments (see FIGS. 19A-19D). In CW driving, the bath spins are driven continuously such that they undergo many Rabi oscillations during the characteristic interaction time $1/\gamma_{NV-N}$, and thus the time-averaged NV-N dipolar interaction approaches zero. For pulsed driving, $\pi$-pulses resonant with spin transitions in the bath are applied midway through the NV Ramsey free precession interval, to refocus bath-induced dephasing. FIG. S7a illustrates both methods for a given applied RF field with a Rabi frequency of $\Omega_N$.

Although CW driving is discussed above in detail, pulsed driving yielded similar $T_2^*$ improvements over the measured range of Rabi drives. For example, FIG. 19B compares $T_2^*$ for Sample B for both schemes at maximum bath drive strength $\Omega_N$=1.5 MHz (for pulsed driving $\tau_\pi \equiv \frac{1}{2}\Omega_N$). Both decoupling schemes result in comparable $T_2^*$ improvements (13-15×) over the non-driven SQ measurement, which is shown for reference. We attribute the slightly lower max $T_2^*$ achieved in pulsed driving to detunings of the RF drive from the spin resonances of the main nitrogen groups, leading to less efficient driving of the spin population (see next section). To study the efficacy of both driving schemes, $T_2^*$ is plotted as a function of Rabi drive $\Omega_N$ in FIG. 19C. In the limit of $\tau_\pi \equiv T_2^*$, pulsed driving resembles the CW case and both schemes converge to the same maximal $T_2^*$.

Despite the similar improvements in $T_2^*$ achieved using both methods, pulsed driving can reduce heating of the MW delivery loop and diamond sample—an important consideration for temperature sensitive applications. For this reason, pulsed driving may be preferable in such experiments despite the need for $\pi$-pulse calibration across multiple resonances. However, either technique may be implemented based on these tradeoffs or available equipment.

Figures 19C, 19D:
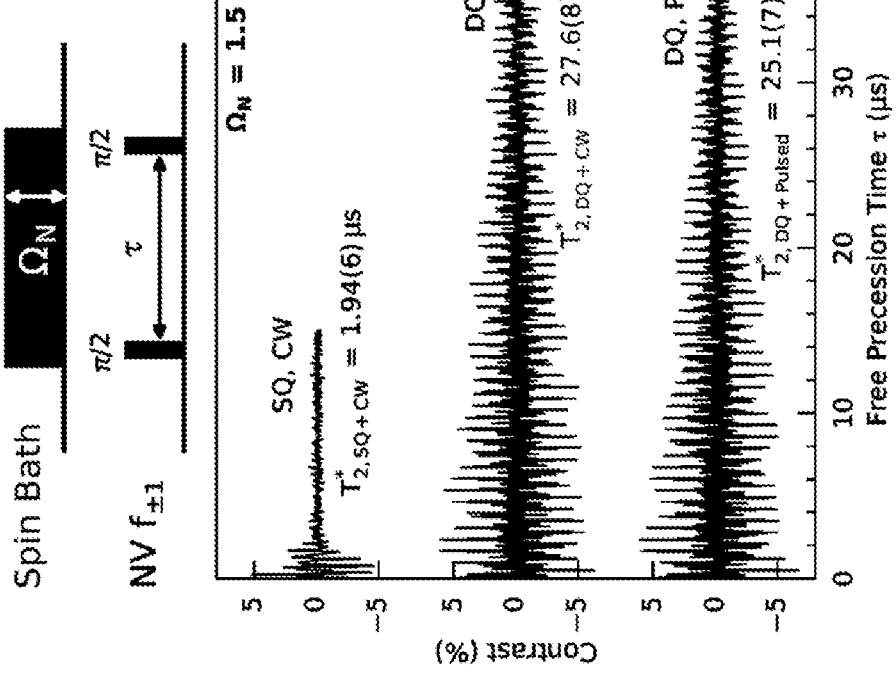
FIGS. 19A-19D show graphs and diagrams comparing CW to pulsed spin bath driving experiments using Sample B, according to some embodiments.
Figures 19A, 19B:
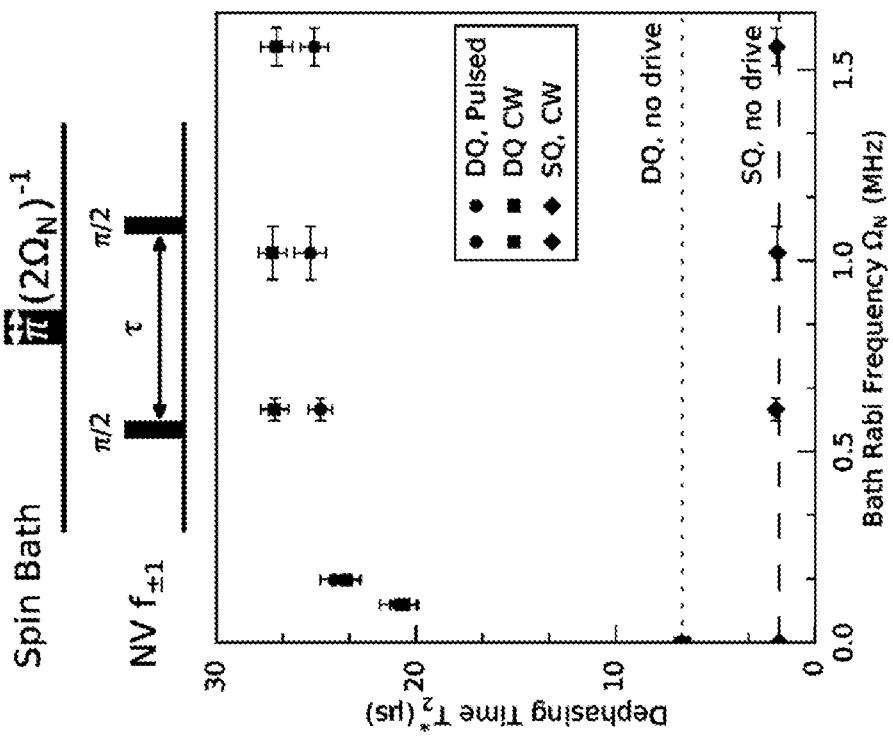

FIGS. 19A-19D show a comparison of CW to pulsed spin bath driving experiments using Sample B. FIGS. 19A and 19D show sequences used for CW and pulsed decoupling of the electronic nitrogen spin bath, respectively, according to an embodiment. For both methods, six distinct frequencies can be used to resonantly address the nitrogen spin bath via an applied RF field with equal Rabi frequency $\Omega_N$ on each spin transition. In FIG. 19B the Ramsey decay in the DQ basis for CW and pulsed driving are compared ($\Omega_N$=1.5 MHz). The decay for CW driving in the SQ basis is included for reference. FIG. 19C depicts $T_2^*$ as a function of bath Rabi frequency for DQ CW (squares) and DQ pulsed (circles) spin bath driving, with the SQ CW results (diamonds) again included for reference. The finely (coarsely) dashed line indicates the $T_2^*$ value in the DQ (SQ) basis without any drive field applied to the bath spins.

NV and Nitrogen Spin Resonance Linewidth Measurements

Figures 20A, 20B, 20C, 20D:
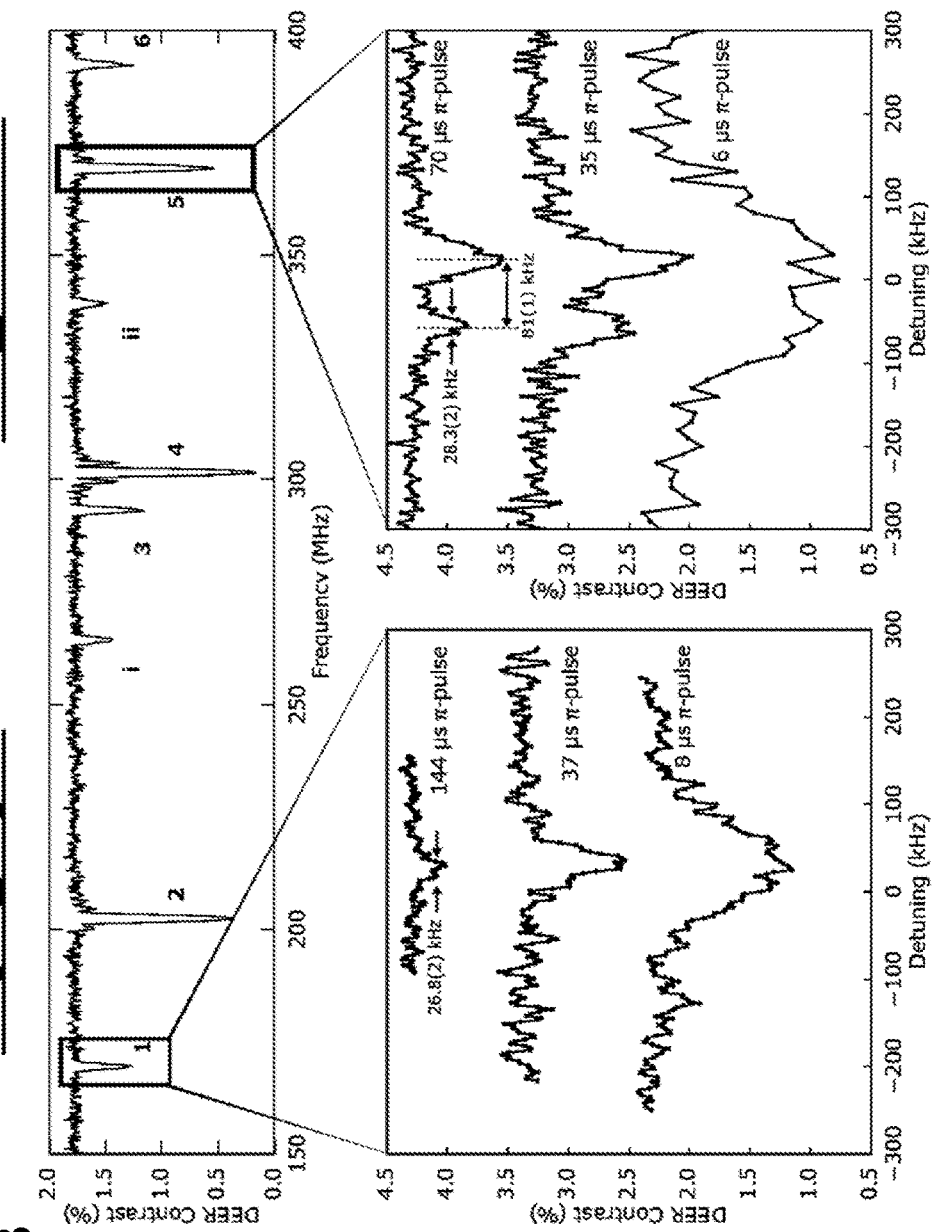
FIGS. 20A-20F show graphs and diagrams comparing nitrogen and NV spin resonance linewidths, according to some embodiments.
Figures 20E, 20F:
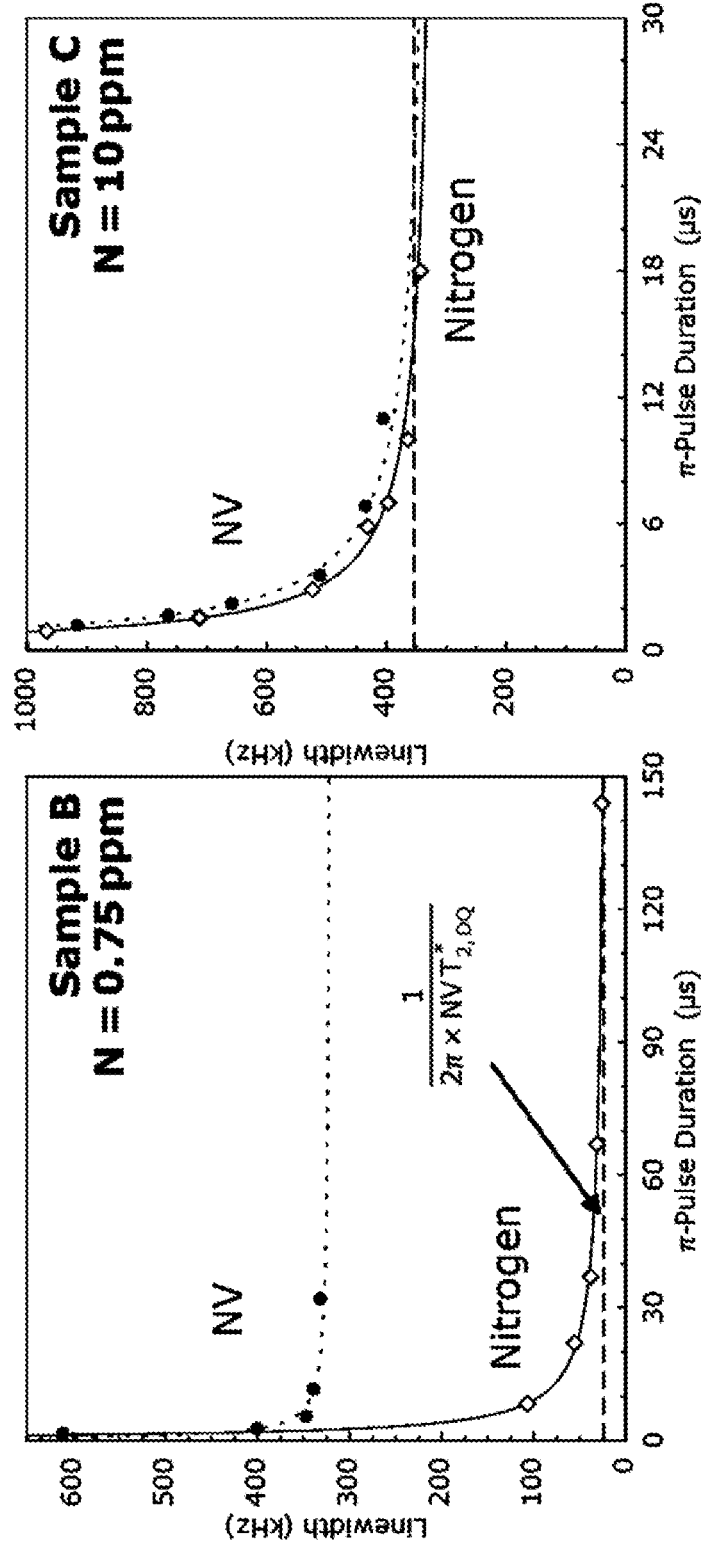

FIGS. 20A-20F show a comparison of nitrogen and NV spin resonance linewidths. FIG. 20A shows the pulsed DEER (left) sequence used for spin resonance measurements of the nitrogen spins and the pulsed ESR (right)

sequence is used for NV SQ spin resonance measurements. FIG. 20B shows DEER spectrum from 150 to 400 MHz including all six nitrogen transitions and two forbidden transitions in Sample B, according to an embodiment. FIG. 20C shows DEER spectra of a single nitrogen transition are shown for three different bath π-pulse durations, according to some embodiments. A minimum measured linewidth of 26.8(2) kHz was recorded using a 144 ps π-pulse. FIG. 20D shows DEER spectra for a group containing three nearly degenerate off-axis nitrogen transitions, according to an embodiment. When bath π-pulses of 70 μs and 35 μs are used, two features are resolved corresponding to a single nitrogen transition detuned by 81 kHz from two nearly overlapped transitions. FIG. 20E shows a comparison of the NV ESR linewidth (dots) and the DEER linewidth for a single nitrogen transition (diamonds) as a function of π-pulse duration for Sample B ([N]=0.75 ppm), according to an embodiment. The fine, dashed line and solid lines correspond to fits of the NV and nitrogen spin resonance linewidths to the functional form $\alpha/x+b$, where b is the saturation linewidth. The coarse, dashed line indicates the expected linewidth from the measured NV $T_2^*$ in the DQ basis (assuming a Lorentzian linewidth). FIG. 20F shows the same as FIG. 20E but for Sample C ([N]=10 ppm).

The NV and nitrogen (P1) ensemble spin resonance linewidths can be determined using pulsed ESR and pulsed DEER NV spectral measurements, respectively, as shown in FIG. 20A-F, according to some embodiments. Low Rabi drive strength and consequently long π-pulse durations can be used to avoid Fourier power broadening. Nitrogen spin resonance spectra are typically narrower than for NV ensembles in the SQ basis, due to the effects of strain gradients in diamond on NV zero-field splitting.

For the spin bath driving model described above (Eqn. 4), the natural (i.e., non-power-broadened) linewidth $\Delta_N$ of spin resonances corresponding to, for example, $^{14}$N groups 1-6 (see FIG. 9 and FIG. 20A) is of interest. The different $^{14}$N groups have approximately equal linewidth, i.e., that $\Delta_{N,i} \approx \Delta_N$. However, the bias field $B_z$ is only slightly misaligned (~1 degree) from one of the [111] crystal axes, which causes the three degenerate spin resonances to be imperfectly overlapped, leading to a larger effective linewidth.

In FIGS. 20B and 20C the NV pulsed DEER linewidths of $^{14}$N group 1 (a single resonance) is compared with that of group 5 (three overlapped resonances) for different $\pi_{bath}$-pulse durations. At short $\pi_{bath}$-pulse durations (high MW powers), the linewidths are power broadened due to the applied microwave field, such that the measured linewidth is a convolution of the natural linewidth and the inverse duration of the $\pi_{bath}$-pulse. At long $\pi_{bath}$-pulse durations, however, the measured linewidth approaches its natural (Lorentzian) linewidth $\Gamma=1/\pi T_{2,N}^*$. At the longest $\pi_{bath}$-pulse durations used in this work, group 1 consists of a narrow, approximately 25 kHz-wide peak. In contrast, group 5 reveals two peaks, consisting of two overlapped $^{14}$N transitions and one detuned transition, which is attributed to imperfect magnetic field alignment. The splitting between the two peaks in group 5≈100 kHz, which can be use as the effective $^{14}$N linewidth $\Delta_N$ in Eqn. 4 of the, and which is consistent with the value extracted from fitting the spin-bath driving model to the data (see FIG. 4a, $\Delta_N, f_{it} \approx 140$ kHz).

FIG. 20D compares the measured NV and $^{14}$N group 1 ensemble linewidths for Sample B as a function of π-pulse duration, according to an embodiment. For both species the linewidth narrows at long π-pulse durations, as discussed above, reaching non-power-broadened (natural) values. The natural NV linewidth is found to be significantly larger (13×) than the natural $^{14}$N linewidth of 20.6(1.2) kHz. This order-of-magnitude difference is a manifestation of the strong strain field gradients in this sample: pulsed ESR measurements of the NV ensemble linewidth (see FIG. 20A) can be performed in the SQ {0, +1} or {0, −1} sub-basis, and can therefore be strain gradient limited. In contrast, nitrogen defects in diamond have S=½, and thus do not couple to electric fields or strain gradients. As a consistency check, note that NV ensemble Ramsey measurements in Sample B, made in the DQ basis (with no spin-bath driving), yield a strain-independent dephasing time $T_{2,DQ}^*=6.9(5)$ μs. This dephasing time, limited by the nitrogen spin bath, implies a $^{14}$N spin resonance linewidth given by $\frac{1}{2} \times 1/\pi T_{2,DQ}^* = 23(2)$ kHz, which is in reasonable agreement with the pulsed DEER measurements of the natural $^{14}$N linewidth. Similar consistency is found for measurements of the NV and $^{15}$N ensemble spin resonance linewidths in Sample C, as shown in FIG. 20E. Such agreement across multiple samples is further evidence that the DQ $T_2^*$ value for NV ensembles is limited by the surrounding nitrogen spin bath, as discussed above. Note that for the samples [NV]<<[N] and therefore the back action of NVs onto nitrogen spins in the DEER readout can be ignored. For denser NV samples, however, it is beneficial to take into account this back action.

DC Magnetometry with DQ and Spin-Bath Drive

Figures 21A, 21B:
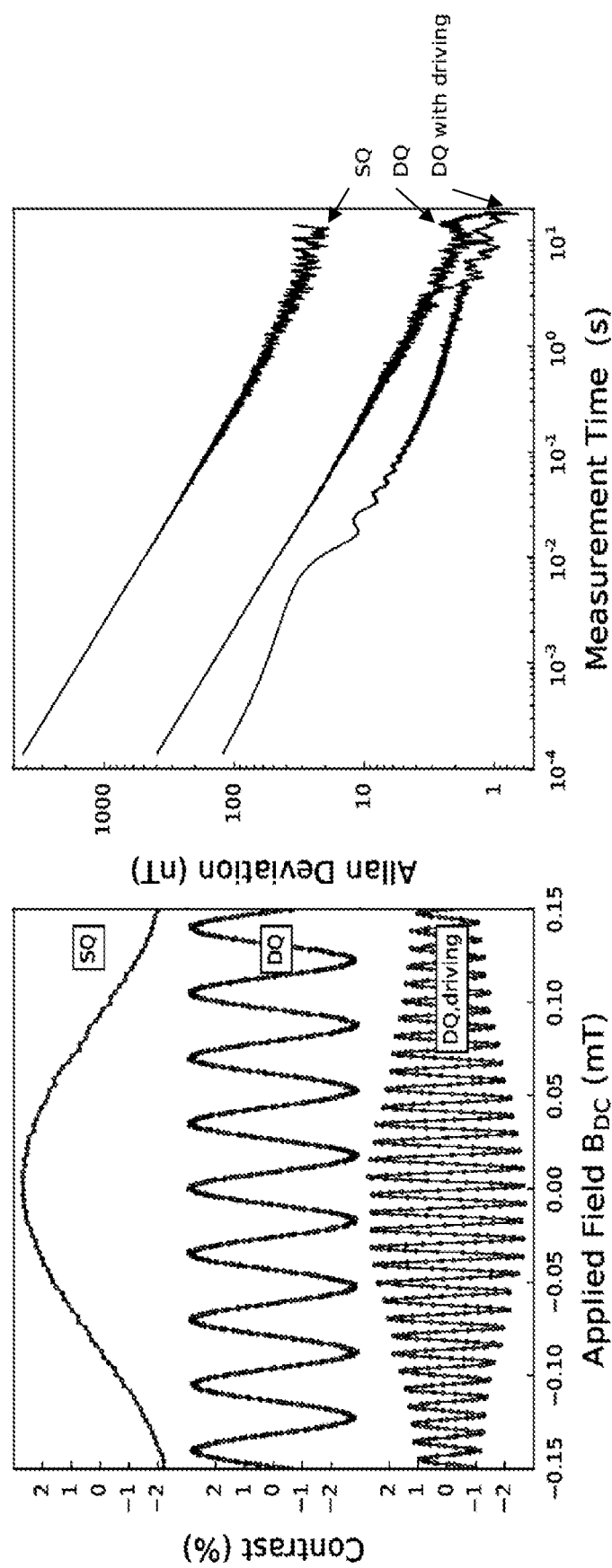
FIGS. 21A-21B show graphs exemplifying DC magnetic field sensing and Allan deviation, according to some embodiments.

FIGS. 21A-21B show DC magnetic field sensing and Allan deviation, according to some embodiments. FIG. 21A shows DC magnetometry curves for SQ, DQ, and DQ with spin-bath driving in Sample B, produced by sweeping the magnitude of a coil-generated applied magnetic field (in addition to the fixed bias field) while the free precession interval is set to $\tau_{SQ}=1.308$ μs (top), $\tau_{DQ}=6.436$ μs (middle), and $\tau_{DQ,Drive}=23.990$ μs (bottom). FIG. 21B shows the Allan deviation using the same fixed τ values from (a) for measurements using SQ (blue), DQ (black), and DQ with driving (red). The external field strength was tuned to sit on a zero crossing of the respective DC magnetometry curves in (a) for sine magnetometry.

Assuming a signal-to-noise ratio of unity, the minimum detectable magnetic field $\delta B_{min}$ in a Ramsey measurement is given by [S17]

$$\delta B_{min} \approx \frac{\delta S}{\max \left| \frac{\partial S}{\partial B} \right|}, \quad (S16)$$

where the Ramsey signal S is $$S = C(\tau)\sin(\gamma_{NV} B_{DC} \tau). \quad (S17)$$

Here, $C(\tau)=C_0 \exp((\tau/T_2^*)^p)$ is the time-dependent measurement contrast defined via the NV spin-state-dependent fluorescence visibility (see methods), $\gamma_{NV}$ is the NV gyromagnetic ratio, $B_{DC}$ is the magnetic field to be sensed, and τ is the sensing time during which the NV sensor spins accumulate phase. The term max $$\left| \frac{\partial S}{\partial B} \right|$$

is the maximum slope of the Ramsey signal, $$\max \left| \frac{\partial S}{\partial B} \right| = C(\tau) \gamma_{NV} \tau.$$

Assuming uncorrelated, Gaussian noise, $\delta S = \sigma(\tau)/\sqrt{n_{meas}}$ is the standard error of the contrast signal, which improves with number of measurements $n_{meas}$. Including a dead time $T_D$ that accounts for time spent during initialization of the NV ensemble and readout of the spin-state-dependent fluorescence during a single measurement, $n_{meas} = T/(\tau + \tau_D)$ measurements are made over the total measurement time T. $\delta B_{min}$ is then found to be $$\delta B_{min} = \frac{\sigma \sqrt{\tau + \tau_D}}{C(\tau)\gamma_{NV}\tau\sqrt{T}},$$

and the sensitivity is given by multiplying $SB_{min}$ by the bandwidth $\sqrt{T}$ and including a factor $\Delta m = 1(2)$ for the SQ (DQ) basis:

$$\eta = \frac{\delta B_{min}\sqrt{T}}{\Delta m} = \frac{\sigma\sqrt{\tau + \tau_D}}{\Delta m \times C(\tau)\gamma_{NV}\tau}. \tag{S20}$$

Note that in the ideal case, $\tau_D \ll \tau$, we have $$\frac{\sqrt{\tau + \tau_D}}{\tau} \approx \frac{1}{\sqrt{\tau}}$$

and the sensitivity $\eta$ scales $\propto \tau^{-1/2} \exp(\tau/T_2^*)^p$. According to some embodiments, the optimal sensing time in a Ramsey experiment is then $\tau_{opt} \approx T_2^*/2$ for $p=1\text{-}2$. However, in the more realistic case, $t_D \sim \tau$, the improvement of $\eta$ with increasing T approaches a linear scaling and $\eta \propto \tau^{-1} \exp(\tau/T_2^*)^p$ for $\tau_D \gg \tau$. The optimal sensing time then becomes $t_{opt} \approx T_2^*$. Consequently, the measured increase in sensitivity may exceed the enhancement estimated from the idealized case without overhead time.

With Eqn. S20 it is possible to calculate and compare the sensitivities for the three measurement modalities (SQ, DQ, and DQ+spin-bath drive) applied to Sample B. Using $C \approx 0.026$, which remains constant for the three schemes (see FIG. 21A), sensing times $\tau_{SQ} = 1.308$ µs, $\tau_{DQ} = 6.436$ µs, and $\tau_{DQ+Drive} = 23.99$ µs, standard deviations $\sigma_{SQ} = 0.0321$, $\sigma_{DQ} = 0.0324$, and $\sigma_{DQ+Drive} = 0.0325$ calculated from 1 s of data, fixed sequence duration of $\tau + \tau_D = 70$ µs, and $\gamma_{NV} = 2\pi \times 28$ GHz/T, the estimated sensitivities for the SQ, DQ and DQ+Drive measurement schemes are $\eta = 70.7$, 6.65, and 1.97 nT/$\sqrt{Hz}$, respectively. In summary, according to some embodiments, a 10× improvement in DC magnetic field sensitivity is obtained in the DQ basis, relative to the conventional SQ basis, and a 35× improvement is obtained using the DQ basis with spin bath drive. Note that this enhancement greatly exceeds the expected improvement when no dead time is present ($\tau_D \ll \tau$) and is attributed to the approximately linear increase in sensitivity with sensing times $\tau \lesssim \tau_D$.

FIG. 21B shows a plot of the Allan deviation for the three schemes showing a $\tau^{-1/2}$ scaling for a measurement time of $\approx 1$ s and the indicated enhancements in sensitivity.

According to some embodiments, a suitable diamond sample parameter regime may be provided when DQ coherence magnetometry and spin bath driving are employed. To simplify the discussion, the following figure of merit (FOM) can be defined for the photon-shot-noise limited sensitivity (compare [S3]), $$\eta_{FOM} = 1/(\Delta m \times \sqrt{n_{NV}T_2^*}), \tag{S21}$$

where $\Delta m = 1(2)$ in SQ (DQ) basis, $n_{NV} = [NV]/[N]$ is the NV center density as a function of [N], and $T_2^*$ is the NV ensemble dephasing time in either basis. Since both $n_{NV}$ and $T_2^*$ depend on the substitutional nitrogen concentration, investigation of $\eta_{FOM}$ may be conducted for a range [N].

In the case of fixed conversion efficiency, $n_{NV} \propto [N]$, and $T_2^* \propto 1/[N]$, $\eta_{FOM}$ remains constant over the range of [N]. In this simplistic picture, shorter $T_2^*$-values may thus be exchanged for higher densities $n_{NV}$, and vice versa. Such a discussion, however, neglects the typical significant experimental overhead due to initialization and readout in NV experiments (characterized by the dead time Td, see above). Since $T_2^* \ll \tau_D$ in an NV ensemble experiment according to some embodiments, increasing $T_2^*$ through optimized sample fabrication, DQ coherence magnetometry and/or spin bath driving is preferred and larger sensitivity gains are obtained when compared to an equivalent increase of $n_{NV}$.

Figure 22:
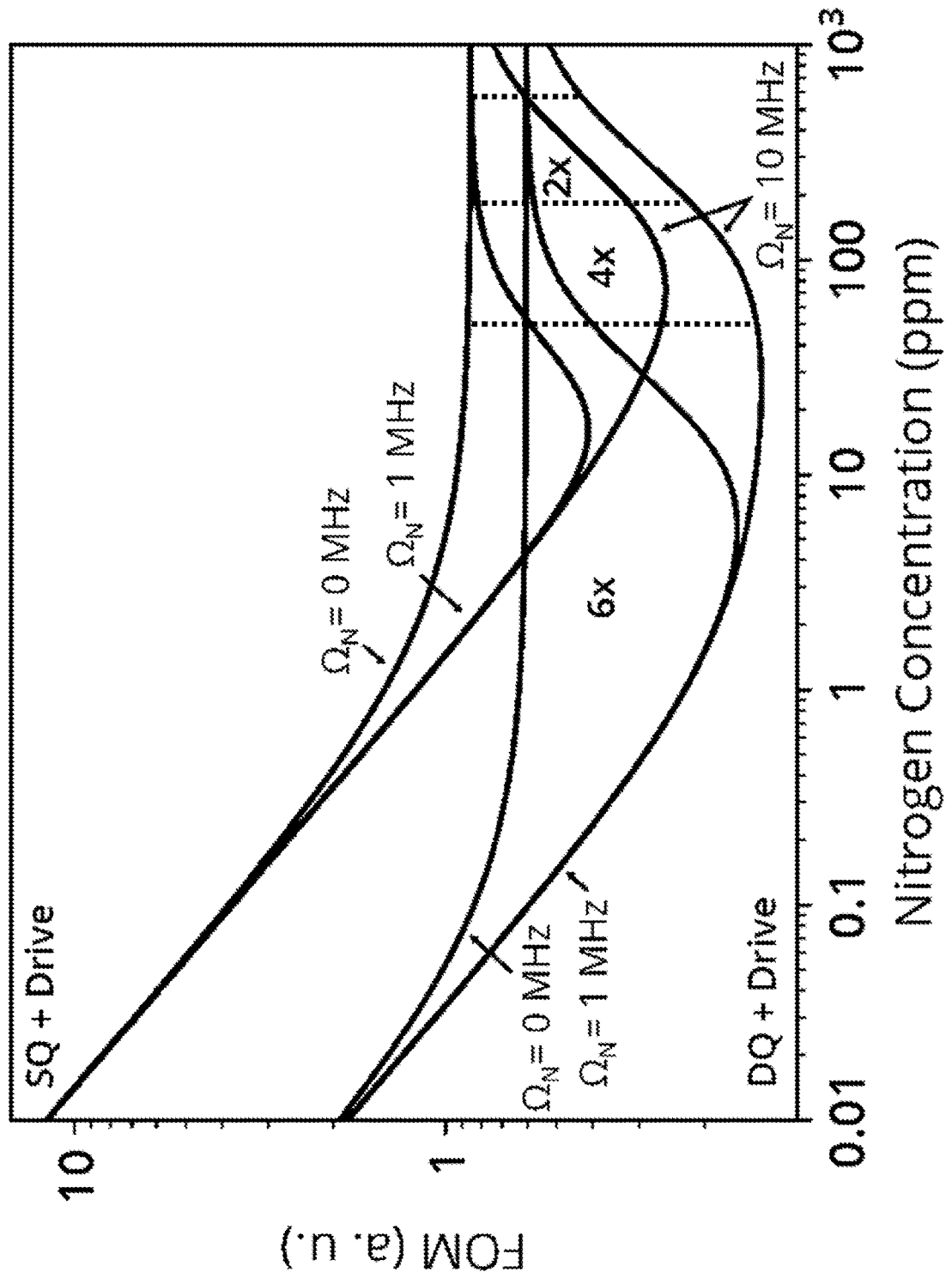
FIG. 22 is a graph summarizing $\eta_{FOM}$ simulation results, according to some embodiments.

More generally, the ensemble $T_2^*$ may depend on numerous diamond-related parameters (e.g., concentration of various impurities, strain fields) and external conditions (e.g., temperature fluctuations of the diamond sample, magnetic field gradients due to the applied bias field). Focusing on the parameters intrinsic to diamond, the relevant contributions to $T_2^*$ are (compare Eq. 1 above)

$$1/T_2^* \approx 1/T_2^*\{^{13}C\} + 1/T_2^*\{N(\Omega_N)\} + 1/T_2^*\{NV(N)\} + 1/T_2^*\{\text{strain}\} + \ldots, \tag{S22}$$

where the term $1/T_2^*\{NV(N)\}$ may be added to account for dephasing due to NV-NV dipolar interactions. This dephasing mechanism was neglected in some embodiments due to the low NV-N conversion efficiency given for Samples A, B, and C, but becomes relevant at elevated conversion efficiencies in optimized diamond samples. To model $\eta_{FOM}$ for a range of nitrogen concentrations, Eqn. S21 and S22 can be combined with the dependence of $T_2^*\{N\}$ on bath drive strength $\Omega_N$ (Eqn. 5). According to some embodiments, optimized diamond samples may be isotopically engineered with $T_2^*\{^{13}C=0.01\%\} \simeq 100$ µs (or better), to posses strain field gradients comparable to the exemplary samples discussed herein ($T_2^*\{\text{strain}\} \simeq 5$ µs), and a constant NV density, $n_{NV} = 0.15$. The $\eta_{FOM}$ simulation results for this parameter regime are summarized in FIG. 22 for SQ (curves starting above FOM of 10 AU) or DQ coherence magnetometry (curves starting below FOM of 10 AU) and plotted for the bath drive strengths $\Omega_N = 0$, 1, and 10 MHz.

Without bath drive applied ($\Omega_N = 0$) and at low nitrogen concentrations ([N]$\lesssim$1 ppm), the FOM for SQ coherence magnetometry is reduced due to the $T_2^*$-limit imposed by strain gradients. In this nitrogen regime, working in the DQ basis leads to significant gains in the relative FOM. At higher nitrogen concentrations ([N]>1 ppm), dipolar interactions with the spin bath dominate NV dephasing, strain contributions become negligible, and DQ coherence approaches an $\sqrt{2}$ enhancement over SQ coherence.

With bath drive applied, however, significant additional gains in sensitivity are obtained for both, SQ and DQ coherence measurements. The best $\eta_{FOM}$ is obtained when DQ coherence measurements are employed at high bath drive strength (1-10 MHz), restricting the optimal nitrogen regime to the 1-100 ppm range. According to some embodiments, the 1-10 ppm nitrogen regime may be optimal when all parameters relevant for magnetic sensing are considered. For example, i) it becomes linearly harder to drive all nitrogen spin resonances with sufficiently high Rabi strength at increasing nitrogen densities. ii) The incorporation of high nitrogen concentrations can lead to a larger variety of spin species in the bath and increases the complexity and efficacy of the bath drive. Finally, iii) there are indications that diamond samples with a high nitrogen content exhibit a larger fraction of $NV^0$ centers. In those samples, the $NV^-$ measurement contrast and thus magnetic sensitivity reduces. Thus, the 1-10 ppm nitrogen regime works well with these techniques, but other regimes are contemplated, and this range is not considered to be limiting.

Dephasing Channels Per Sample

FIG. 23A is a table showing NV spin ensemble dephasing mechanisms for Sample A, according to an embodiment. Individual contributions to dephasing may be determined using the estimated/calibrated values described above. The data show good agreement between calculated and measured total dephasing times $T_2^{SQ*}$ and $T_2^{DQ*}$ (last two rows).

FIG. 23B is a table showing NV spin ensemble dephasing mechanisms for Sample B, according to an embodiment. The values are similar to Sample A. Additionally, spin echo double-electron resonance (SEDOR) measurements were performed to estimate dephasing contributions from individual nitrogen resonance lines). FIG. 23C is a table showing NV spin ensemble dephasing mechanisms for Sample C, similar to Samples A and B, according to an embodiment.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of nonvolatile memory, including by way of example semiconductor memory devices, (e.g., EPROM, EEPROM, and flash memory devices); magnetic disks, (e.g., internal hard disks or removable disks); magneto optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The subject matter described herein can be implemented in a computing system that includes a back end component (e.g., a data server), a middleware component (e.g., an application server), or a front end component (e.g., a client computer having a graphical user interface or a web browser through which a user can interact with an implementation of the subject matter described herein), or any combination of such back end, middleware, and front end components. The components of the system can be interconnected by any form or medium of digital data communication, e.g., a communication network. Examples of communication networks include a local area network ("LAN") and a wide area network ("WAN"), e.g., the Internet.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

The invention claimed is:

1. A method of measuring a direct current (DC) magnetic field using a plurality of spins centers in an ensemble of spin centers, the method comprising:
   driving, with a first source of electromagnetic radiation, a spin bath associated with the ensemble of spin centers to decouple the spin bath from the ensemble of spin centers, wherein the first source of electromagnetic radiation is at a resonance frequency of the spin bath;
   performing, with a second source of electromagnetic radiation, double quantum (DQ) coherence magnetometry on the ensemble of spin centers;
   observing, using at least one electromagnetic radiation collection device, an electromagnetic response of at least one of the plurality of spin centers in the ensemble of spin centers, wherein the electromagnetic response of the at least one of the plurality of spin centers is responsive to the DC magnetic field; and
   determining, using the observed electromagnetic response, a characteristic of the DC magnetic field.

2. The method of claim 1, wherein the ensemble of spin centers comprises a plurality of nitrogen-vacancy (NV) spin centers in diamond.

3. The method of claim 2, wherein a density of the NV spin centers in the diamond is between 0.01-0.1 parts per million (PPM).

4. The method of claim 2, wherein a density of the NV spin centers in the diamond is between 0.1-3 parts per million (PPM).

5. The method of claim 2, wherein a density of the NV spin centers in the diamond is between 3 -200 parts per million (PPM).

6. The method of claim 2, wherein the spin bath comprises a plurality of P1 nitrogen spins in the diamond.

7. The method of claim 1, wherein the first source of electromagnetic radiation comprises at least one radio frequency (RF) signal source having at least one frequency between 100-600 MHz.

8. The method of claim 1, wherein the first source of electromagnetic radiation comprises a plurality of tones at different frequencies.

9. The method of claim 1, further comprising calibrating the first source of electromagnetic radiation to at least one resonant frequency of the spin bath.

10. The method of claim 9, wherein said calibrating comprises:
    performing a double electron-electron resonance (DEER) measurement on the spin bath to produce a resonance spectrum of the spin bath;
    identifying, from the resonance spectrum of the spin bath, at least one resonance peak corresponding to the at least one resonance frequency of the spin bath;
    setting the first source of electromagnetic radiation to the at least one resonance frequency of the spin bath.

11. The method of claim 1, wherein the second source of electromagnetic radiation is at least one microwave source having at least one frequency between 2-3.5 GHz.

12. The method of claim 1, wherein the driving, with a first source of electromagnetic radiation, the spin bath comprises driving with a continuous wave.

13. The method of claim 1, wherein the driving, with a first source of electromagnetic radiation, the spin bath comprises driving with a pulsed wave sequence.

14. The method of claim 1, wherein the observing the electromagnetic response of at least one of the plurality of spin centers in the ensemble of spin centers comprises recording, with a spatially resolved imaging device, a resulting electromagnetic response.

15. The method of claim 1, wherein the observing the electromagnetic response of at least one of the plurality of spin centers in the ensemble of spin centers comprises collecting photons with at least one photodiode.

16. The method of claim 1, further comprising providing a bias field across the ensemble of spin centers.

17. The method of claim 16, wherein the providing the bias field across the ensemble of spin centers comprises providing a first Helmholtz coil on one side of the ensemble of spin centers and providing a second Helmholtz coil on another side of the ensemble of spin centers opposite the first Helmholtz coil.

18. The method of claim 1, wherein the performing, with a second source of electromagnetic radiation, double quantum (DQ) coherence magnetometry on the ensemble of spin centers comprises:
    pumping at least some of the spin centers in the ensemble of spin centers into the m=0 state with a first pulse of light form a light source;
    applying a first two-tone pulse with the second source of electromagnetic radiation to the ensemble of spin centers to transfer at least some of the spin centers in the ensemble of the spin centers into a superposition of the +1 and −1 states;
    applying, after a free precession interval, a second two-tone pulse with the second source of electromagnetic radiation to the ensemble of spin centers to project phase accumulated by at least some of the spin centers during the free precession interval into a population difference; and
    applying a second pulse of light from the light source to the ensemble of spin centers to produce fluorescence from at least some spin centers in the ensemble of spin centers.

19. The method of claim 18, wherein the light source is a laser emitting light at approximately 532 nanometers.

20. An apparatus for measuring a direct current (DC) magnetic field, comprising
    an ensemble of spin centers;
    a spin bath associated with the ensemble of spin centers;
    a first source of electromagnetic radiation configured to drive the spin bath associated with the ensemble of spin centers to decouple the spin bath from the ensemble of spin centers, wherein the first source of electromagnetic radiation is at a resonance frequency of the spin bath;
    a second source of electromagnetic radiation for performing double quantum (DQ) coherence magnetometry on the ensemble of spin centers; and
    at least one electromagnetic radiation collection device for observing an electromagnetic response of at least one of the plurality of spin centers in the ensemble of spin centers, wherein the electromagnetic response of the at least one of the plurality of spin centers is responsive to the DC magnetic field.

* * * * *

UNITED STATES PATENT AND TRADEMARK OFFICE
CERTIFICATE OF CORRECTION

| | | |
|---|---|---|
| PATENT NO. | : 11,156,674 B2 | Page 1 of 1 |
| APPLICATION NO. | : 16/620391 | |
| DATED | : October 26, 2021 | |
| INVENTOR(S) | : Ronald Walsworth et al. | |

It is certified that error appears in the above-identified patent and that said Letters Patent is hereby corrected as shown below:

In the Specification

At Column 1, Line numbers 21-27, please amend the paragraph entitled "Statement of Government Interest" as follows:
This invention was made with government support under 1408075 and 1504610 awarded by National Science Foundation (NSF) and under W911NF1510548 awarded by U.S. Army Research Office (ARO). The government has certain rights in this invention.

Signed and Sealed this
Sixth Day of February, 2024

Katherine Kelly Vidal
*Director of the United States Patent and Trademark Office*